United States Patent
Hwang et al.

(10) Patent No.: US 6,323,132 B1
(45) Date of Patent: Nov. 27, 2001

(54) ETCHING METHODS FOR ANISOTROPIC PLATINUM PROFILE

(75) Inventors: Jeng H. Hwang; Chentsau Ying, both of Cupertino; Kang-Lie Chiang, San Jose; Steve S. Y. Mak, Pleasanton, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/251,826

(22) Filed: Feb. 17, 1999

Related U.S. Application Data

(63) Continuation-in-part of application No. 09/006,092, filed on Jan. 13, 1998, now abandoned.

(51) Int. Cl.$^7$ ................................. H01L 21/302
(52) U.S. Cl. ..................... 438/706; 438/710; 438/720
(58) Field of Search ................... 438/706, 710, 438/713, 714, 715, 717, 720, 733, 652, 653, 689

(56) References Cited

U.S. PATENT DOCUMENTS

| | | | |
|---|---|---|---|
| 4,785,763 | 11/1988 | Saitoh | 118/723 |
| 4,889,588 | 12/1989 | Fior | 156/643 |
| 4,902,377 | 2/1990 | Berglund et al. | 156/643 |

(List continued on next page.)

FOREIGN PATENT DOCUMENTS

| | | | |
|---|---|---|---|
| 3935189 | 5/1991 | (DE) | C23C/14/34 |
| 19728473 | 1/1999 | (DE) | H01L/21/28 |
| 0838838 | 4/1998 | (EP) | H01J/37/32 |
| 0795896 | 9/1997 | (EP) | H01L/21/311 |
| 1001459 | 5/2000 | (EP) | H01L/21/311 |
| 0725430 | 8/1996 | (EP) | H01L/21/321 |
| 0786805 | 7/1997 | (EP) | H01L/21/321 |
| 0823726 | 2/1998 | (EP) | H01L/21/321 |
| 0858103 | 8/1998 | (EP) | H01L/21/3213 |
| 0865079 | 9/1998 | (EP) | H01L/21/3213 |
| 10294528 | 11/1998 | (EP) | H01S/3/18 |
| 08078397 | * 3/1996 | (JP) | . |
| 11111695 | * 4/1999 | (JP) | . |
| 59016334 | 1/1984 | (JP) | H01L/21/302 |
| 5-274220 | 5/1995 | (JP) | H01L/21/3065 |
| WO 9800859 | 1/1998 | (WO) | H01L/21/302 |

OTHER PUBLICATIONS

Chou et al., "Platinum Metal Etching in a Microwave Oxygen Plasma", *J. Appl. Phys.* 68(5), pp. 2415–2423 (Sep. 1990).

Chung et al., "Study on Fence–Free Platinum Etching Using Chlorine–Based Gases in Inductively Coupled Plasma", *J. Electrochem. Soc.*, vol. 144, No. 11, pp. L294–L296 (Nov. 1997).

(List continued on next page.)

*Primary Examiner*—Benjamin L. Utech
*Assistant Examiner*—Kin-Chan Chen
(74) *Attorney, Agent, or Firm*—Shirley Church; Joseph Bach

(57) ABSTRACT

A method of etching a platinum electrode layer disposed on a substrate to produce a semiconductor device including a plurality of platinum electrodes. The method comprises heating the substrate to a temperature greater than about 150° C., and etching the platinum electrode layer by employing a plasma of an etchant gas comprising nitrogen and a halogen (e.g. chlorine), and a gas selected from the group consisting of a noble gas (e.g. argon), $BCl_3$, HBr, $SiCl_4$ and mixtures thereof. The substrate may be heated in a reactor chamber having a dielectric window including a deposit-receiving surface having a surface finish comprising a peak-to-valley roughness height with an average height value of greater than about 1000 Å.

27 Claims, 24 Drawing Sheets

U.S. PATENT DOCUMENTS

| | | | |
|---|---|---|---|
| 5,188,704 | | 2/1993 | Babie et al. ............... 156/643 |
| 5,232,747 | | 8/1993 | Evans, Jr. ............... 427/539 |
| 5,258,093 | | 11/1993 | Maniar ............... 156/626 |
| 5,492,855 | | 2/1996 | Matsumoto et al. ............... 437/60 |
| 5,498,768 | | 3/1996 | Nishitani et al. ............... 437/192 |
| 5,515,984 | | 5/1996 | Yokoyama et al. ............... 216/41 |
| 5,527,729 | | 6/1996 | Matsumoto et al. ............... 437/60 |
| 5,554,866 | | 9/1996 | Nishioka et al. ............... 257/295 |
| 5,565,036 | | 10/1996 | Westendorp et al. ............... 118/723 |
| 5,658,820 | * | 8/1997 | Chung ............... 438/3 |
| 5,679,213 | | 10/1997 | Noshiro ............... 156/643.1 |
| 5,686,339 | * | 11/1997 | Lee et al. ............... 437/52 |
| 5,696,018 | | 12/1997 | Summerfelt et al. ............... 437/60 |
| 5,707,487 | | 1/1998 | Hori et al. ............... 156/659.11 |
| 5,753,044 | | 5/1998 | Hanawa et al. ............... 118/723 |
| 5,792,593 | | 8/1998 | McClure et al. ............... 430/314 |
| 5,854,104 | | 12/1998 | Onishi et al. ............... 438/240 |
| 5,907,791 | * | 5/1999 | Cappuzzo et al. ............... 438/669 |
| 6,090,717 | * | 7/2000 | Powell et al. ............... 438/710 |
| 6,165,816 | * | 12/2000 | Mizushima et al. ............... 438/118 |
| 6,171,977 | * | 1/2001 | Kasai et al. ............... 438/775 |

OTHER PUBLICATIONS

DeOrnellas et al., "Plasma Etch of Ferroelectric Capacitors in FeRAMs and DRAMs", *Semiconductor International*, pp. 103–108 (Sep. 1997).

Farrell et al., "Reactive ion etch study for producing patterned platinum structures", Proceedings of the 1996 $8^{th}$ International Symposium on Integrated Ferroelectrics, vol. 16, No. 1–4, Part 3, pp. 109–138 (1997).

Kazuya et al., "Process Integration of the Stacked Ferroelectric Capacitor Cell", Proceedings of the Symposium on Semiconductors and Integrated Circuits Technology, vol. 52, pp. 159–164 (Jan. 1992).

Keil et al., "The Etching of Platinum Electrodes for PZT Based Ferroelectric Devices", Electrochemical Society Proceedings, vol. 96–12, pp. 515–521 (1996).

Kotecki, "High–K Dielectric Materials for DRAM Capacitors", *Semiconductor International*, pp. 109–116 (Nov. 1996).

Kwon et al., "The study on the ethcing mechanism of Pt thin film by inductive coupled plasma", *J. Kor. Inst. Telematics & Elect.*, pp. 27–32 (Jun. 1997).

Lee et al., "Patterning of Pt thin films using $SiO_2$ mask in a high density plasma", *J. Kor. Inst. Telematics & Elect.*, pp. 87–92 (Mar. 1997).

Milkove et al., "New Insight into the Reactive Ion Etching of Fence–Free Patterned Platinum Structures", $43^{rd}$ *Symposium of AVS*, Philadelphia, PA (Oct. 1996).

Nishikawa et al., "Platinum Etching and Plasma Characteristics in RF Magnetron and Electron Cyclotron Resonance Plasmas", *Jpn. J. Appl. Phys.*, vol. 32, pp. 6102–6108 (1993).

Shibano Teruo et al., "Etching of platinum and high dielectric constant films", *Oyo Butsuri*, vol. 63, No. 11, pp. 1139–1142 (1994).

Xing et al., "A Novel Method of Dry Etching Fence–Free Pt Electrodes for Gbit DRAMS", p. 7C (1997).

Yokoyama et al., "High–Temperature Etching of PZT/Pt/TiN Structure by High–Density ECR Plasma", *Jpn. J. Appl. Phys.*, vol. 34, Part 1, No. 2B, pp. 767–770 (Feb. 1995).

Yoo et al., "Control of Etch Slope During Etching of Pt in $Ar/Cl_2/O_2$ Plasmas", *Jpn. J. Appl. Phys.*, vol. 35, Part 1, No. 4B, pp. 2501–2504 (1996).

Tegal News Release, Jul. 10, 1996.

Tegal News Release, Oct. 8, 1996.

* cited by examiner

ETCHING METHODS FOR ANISOTROPIC PLATINUM PROFILE

This application is a continuation-in-part patent application of patent application entitled "ETCHING METHODS FOR ANISOTROPIC PLATINUM PROFILE", Ser. No. 09/006,092, filed Jan. 13, 1998 abandoned.

BACKGROUND OF THE INVENTION

1. Field of the Invention

This invention relates to plasma etching of platinum. More specifically, this invention provides an improved method for plasma etching of platinum for producing semiconductor integrated circuits containing platinum electrodes.

2. Description of the Prior Art

The implementation of digital information storage and retrieval is a common application of modern digital electronics. Memory size and access time serve as a measure of progress in computer technology. Quite often storage capacitors are employed as memory array elements. As the state of the art has advanced, small-feature-size high density dynamic random access memory (DRAM) devices require storage capacitors of larger capacitance having high dielectric constant materials. The high dielectric constant materials or ferroelectric materials are made primarily of sintered metal oxide and contain a substantial amount of very reactive oxygen. In the formation of capacitors with such ferroelectric materials or films, the electrodes must be composed of materials with least reactivity to prevent oxidation of the electrodes which would decrease the capacitance of storage capacitors. Therefore, precious metals, such as platinum (Pt), palladium (Pd), etc., are preferred metals used in the manufacture of capacitors for high density DRAM.

Among the possible precious metals for capacitor electrodes, platinum has emerged as an attractive candidate because it is inert to oxidation and is known to have a leakage current ($<10^{-9}$ amps/cm$^2$) lower than other electrodes such as $RuO_2$ and Pd. Platinum also is a good conductor.

In the prior art, platinum etching has been conducted by means of isotropic etching, such as wet etching with aqua regia, or by anisotropic etching, such as ion milling with Ar gas or by other means. Because of the nature of isotropic etching, using wet etching with aqua regia causes deteriorated processing accuracy. The grade of precision in isotropic etching is not high enough for fine pattern processing. Therefore, it is difficult to perform submicron patterning of platinum electrodes due to its isotropic property. Furthermore, a problem with ion milling (i.e. anisotropic etching) occurs because the etching speed on platinum, which is to form the electrode, is too slow for mass production.

In order to increase processing accuracy in etching platinum, research and development has been quite active, particularly in the area of etching platinum by means of a dry etching process where etchant gases (e.g., $Cl_2$, HBr, $O_2$, etc.) are used. The following prior art is representative of the state of art with respect to etching platinum with a plasma of etching gases.

U.S. Pat. No. 5,492,855 to Matsumoto et al. discloses a semiconductor device manufacturing method, wherein an insulation layer, a bottom electrode Pt layer, a dielectric film and a top electrode Pt layer are provided on top of a substrate having already-completed circuit elements and wiring, and then, a capacitor is formed by selectively dry etching the bottom electrode Pt layer after selectively dry etching the top electrode Pt layer and the dielectric film. The manufacturing method uses a gas containing an S component as etching gas for Pt etching, or an etching gas containing S component as an additive gas; and also it implants S into the Pt layer before the Pt dry etching process by means of ion implantation to compose a S and Pt compound, and then dry etches the Pt compound thus composed.

U.S. Pat. No. 5,527,729 to Matsumoto et al. discloses process steps to form on a substrate in which circuit elements and wirings, etc., are already shaped, an insulation layer, a first metal layer, a dielectric film and a second metal layer. A top electrode and a capacitance film are formed by dry etching the second metal layer and the dielectric film. A bottom electrode is formed by dry etching the first metal layer. The etching gas for dry etching the second metal layer is a mixed gas containing hydrogen halide (e.g. HBr) and oxygen, having a ratio of oxygen against the total of hydrogen halide and oxygen set at about 10%–35%. The etching gas is also taught as a gas containing hydrocarbon, such as chloroform. Matsumoto et al. employs a silicon oxide layer as the insulation layer on the substrate, and a platinum layer or palladium layer as the first and second metal layers. Dry etching of the second metal layer and dielectric film is conducted in a low pressure region not higher than about 5 Pa, where the etching speed is high. Matsumoto et al. further teaches that where a mixed gas of hydrogen halide and oxygen is used as the etching gas, the etching speed on the silicon oxide layer can be made sufficiently low relative to that on the second metal layer made of a platinum layer or a palladium layer; in this way, the excessive etching of the silicon oxide layer underlying the first metal layer is avoided, and damage to the circuit elements and wiring, etc. underneath the silicon oxide layer can be prevented. Furthermore according to Matsumoto et al, the ratio of etching speed of the platinum and dielectric material to the resist can be increased by lowering the etching speed on the resist. Therefore, etching of the platinum and dielectric material may be conducted by using a mask of normal lay-thickness resist (generally speaking, about 1.2 μm to about 2.0 μm thick), instead of using a conventional thick-layer resist (about 3 μm and thicker).

Chou et al. in an article entitled "Platinum Metal Etching in a Microwave Oxygen Plasma", J. Appl. Phys. 68 (5), Sep. 1, 1990, pages 2415–2423, discloses a study to understand the etching of metals in both plasma and chemical systems. The study found that the etching of platinum foils in an oxygen plasma generated in a flow-type microwave system and that very rapid etching (~6Å/s) took place even at low power inputs (200 W). The principal plasma parameters, including oxygen atom concentration, ion concentration, and electron temperature, were measured by Chou et al. as a function of distance below the microwave coupler. These were correlated to the rate of foil etching, which decreased with increasing distance from the coupler. On the basis of these correlations Chou et al. formulated a simple mechanistic model. The study by Chou et al. further found that the etching of platinum in an oxygen plasma jet results from the concomitant action of oxygen atoms and high energy electrons.

Nishikawa et al. in an article entitled "Platinum Etching and Plasma Characteristics in RF Magnetron and Electron Cyclotron Resonance Plasmas", Jpn. J. Appl. Phys., Vol. 34 (1995), pages 767–770, discloses a study wherein the properties of platinum etching were investigated using both rf magnetron and electron cyclotron resonance (ECR) plasmas, together with measurement of the plasma parameters (neutral concentration, plasma density, etc.). Nishikawa et al. performed experiments in $Cl_2$ plasmas over a pressure ranging from 0.4 to 50 mTorr. In rf magnetron plasmas, the etch rate of Pt was constant at the substrate temperature of from 20 to 160° C. The etch rate and the plasma electron density increased with gas pressure decreasing from 50 to 5 mTorr. In ECR plasmas for rf power of 300 W, Nishikawa et al. found that the etch rate of Pt was almost constant (~100 nm/min) with gas pressure decreasing from 5 to 0.4 mTorr, while the plasma electron density gradually increased with decreasing gas pressure. The study by Nishikawa et al. discusses these experimental results with respect to the relationship between the etch yield and the ratio of neutral $Cl_2$ flux and ion flux incident on the substrate.

Yokoyama et al. in an article entitled "High-Temperature Etching of PZT/Pt/TiN Structure by High-Density ECR Plasma", Jpn. J. Appl. Phys., Vol. 34 (1995), pages 767–770, discloses a study wherein micron patterning technologies for the PZT/Pt/TiN/Ti structure with a spin on glass (SOG) mask are demonstrated using a high-density electron cyclotron resonance (ECR) plasma and a high substrate temperature above 300° C. A 30%-$Cl_2$/Ar gas was used to etch a lead zirconate titanate (PZT) film. No deposits remained, which resulted in an etched profile of more than 80°. A 40%-$O_2$/$Cl_2$ gas was used to etch a Pt film. The etching was completely stopped at the Ti layer. 30-nm-thick deposits remained on the sidewall. They were removed by Yokoyama et al. after dipping in hydrochloric acid. The etched profile of a Pt film was more than 80°. The Ti/TiN/Ti layer was etched with pure $Cl_2$ gas. The size shift from the SOG mask was less than 0.1 µm. Yokoyama et al. did not detect any interdiffusion between SOG and PZT by transmission electron microscopy and energy dispersive x-ray spectroscopy (TEM-EDX) analysis.

Yoo et al. in an article entitled "Control of Etch Slope During Etching of Pt in Ar/$Cl_2$/$O_2$ Plasmas", Jpn. J. Appl. Phys., Vol. 35 (1996), pages 2501–2504, teaches etching of Pt patterns of the 0.25 µm design rule at 20° C. using a magnetically enhanced reactive ion etcher (MERIE). Yoo et al. found that a major problem of etching with a MERIE was the redeposition of the etch products onto the pattern sidewall, making it difficult to reduce the pattern size. In both cases separately using a photoresist mask and an oxide mask, the redeposits of the etch products onto the sidewall were reduced by the addition of $Cl_2$ to Ar, although the etched slope was lowered to 45°. The redeposits were removed by an HCl cleaning process.

Kotecki in an article entitled "High-K Dielectric Materials for DRAM Capacitors", Semiconductor International, November 1996, pages 109–116, the potential advantages of incorporating high-dielectric materials into a storage capacitor of a dynamic random access memory (DRAM) are described and the requirements of the high dielectric layer are reviewed as they relate to use in a simple stack capacitor structure suitable for the gigabit generation. Kotecki teaches that when considering the use of high-dielectric materials in a stack capacitor structure, the following issues need to be addressed: electrode patterning, high-dielectric material/barrier interaction, electrode/high-dielectric material interaction, surface roughness (e.g. hilocking, etc.), step coverage, high-dielectric material uniformity (e.g. thickness, composition, grain size/orientation, etc.), and barrier (e.g. $O_2$ and Si diffusion, conductivity, contact resistance and interactions, etc.). Various materials and combinations of materials were studied by Kotecki for use with perovskite dielectrics including the noble metals (i.e. Pt, Ir, Pd) and conductive metal oxides (i.e. $IrO_2$ and $RuO_2$). The work function of these materials, their ability to be patterned by dry etching, the stability of the surface with regards to surface roughening and their suitability in a semiconductor fabricator are listed by Kotecki in the following Table I:

TABLE I

Comparison of the Properties of Various Electrode Materials Suitable for Use with Perovskite Dielectrics

| Material Selection | Work Function | Dry Etch | Surface Stability | Deposition Method |
|---|---|---|---|---|
| Pt | 5.6–5.7 | difficult | potential problem | sputtering |
| Ru | 4.7 | easy/dangerous | potential problem | sputtering |
| $RuO_2$/Ru | | easy/dangerous | good | reactive sputtering |
| Ir | 5.0–5.8 | difficult | good | sputtering |
| $IrO_2$/Ir | | difficult | good | reactive sputtering |
| Pd | 5.1–5.6 | difficult | ? | sputtering |

Kotecki further teaches in the article entitled "High-K Dielectric Materials for DRAM Capacitors" that one of the major problems which needs to be overcome with respect to the manufacturing of DRAM chips using capacitors is the problem of electrode patterning. There are minimal volatile species produced during the dry etching of the noble metal electrodes such as Pt, Ru, Pd and Ir. Since the etch mechanism is primarily by physical sputtering, even during a RIE process, fences are typically formed on the sides of the photoresist. To eliminate the problem of fencing, it is possible to etch the fence layer and erode the sides of the photoresist during the etch process which leads to "clean" metal structures but with sloping sidewall angles and a loss of control over critical feature sizes. As the dimension of the feature shrinks to 0.18 µm or below, only limited tapering of the sidewall angle can be tolerated. Kotecki presents in the following Table II some of the high-dielectric materials which have been considered for use in a DRAM capacitor, the various methods which can be used to form the films, and the range of reported permittivites:

TABLE II

A Comparison of Various High-Dielectric Materials and Method for Formation and Dielectric Constants

| Material | Deposition Methods | $\epsilon_T$(thin films) |
|---|---|---|
| $SrTiO_3$ | MOCVD, ECR-CVD, sol-gel, sputtering, PLD | 90–240 |
| (Ba, Sr)$TiO_3$ | MOCVD, ECR-CVD, sol-gel, sputtering, PLD | 160–600 |
| PLT | MOCVD, sol-gel, sputtering, PLD | 400–900 |
| PZT and PLZT | MOCVD, sol-gel, sputtering, PLD | >1000 |

Milkove et al. reported in a paper entitled "New Insight into the Reactive Ion Etching of Fence-Free Patterned Platinum Structures" at the 43rd Symposium of AVS, October 1996, Philadelphia, Pa., that an investigation was undertaken to characterize the time progression of the Pt etch process during the reactive ion etching (RIE) of fence-free patterned structures. The experiment by Milkove et al. consisted of coprocessing two oxidized Si wafers possessing identical 2500 Å thick Pt film layers, but different photoresist (PR) mask thicknesses. Etching was suspended at 20, 40, 60 and 80% of the full etch process in order to cleave off small pieces of wafer for analysis by a scanning electron microscopy (SEM). Using $Cl_2$-based RIE conditions known to produce fence-free etching for 2500 Å thick film layers, Milkove et al. discovered that a severe fence actually coats the PR mask during the first 20% of the etch process. As the etch continues the fence structure evolves, achieving a maximum height and width followed by progressive recession until disappearing completely prior to process endpoint. The data from Milkove et al. shows that the final profile of an etched Pt structure possess a functional dependence on the initial thickness and slope of the PR mask, as well as on the initial thickness of the Pt layer. Milkove et al. further reported in the paper entitled "New Insight Into The Reactive Ion Etching of Fence-free Patterned Platinum Structures" that the observed behavior of the transient fence provides the strongest evidence to date supporting the existence of a chemically assisted physical sputtering component associated with the RIE of Pt films in halogen-based plasmas.

Keil et al. teaches in an article entitled "The Etching of Platinum Electrodes for PZT Based Ferroelectric Devices", Electrochemical Society Proceedings, Vol. 96–12 (1996), pages 515–520, that the technical difficulties of fabricating capacitors employing platinum Pt etching is most often dominated by sputtering processes. While oxygen and/or various gaseous chlorides or fluorides are used to chemically enhance the etch process, the products of both etch mechanisms are usually of low volatility and tend to redeposit on the wafer. After etching, large wall-like structures extend up from the edges of the Pt region. These wall-like structures are frequently referred to as "veils" or "fences" or "rabbit ears" and can reach lengths which are more than double the thickness of the Pt film to which they are attached. The existence of such structures makes useful deposition of the PZT layer impossible. Keil et al. further teaches that even when one is able to attenuate redeposition to the point where only small "nub" like features are present, the high electric fields which will form at such "nubs" enhances the likelihood for dielectric breakdown. Although process conditions can be found which result in either low redeposition or even no redeposition, they most often also give an unacceptably tapered platinum profile angle. Keil et al. observed that redeposition becomes more severe as process conditions are pushed toward those which give increasingly vertical sidewalls. While a post etch wet clean in a solvent bath is frequently used, the heavy redeposition which attends the pursuit of vertical sidewalls regularly renders this approach minimally effective.

The foregoing prior art illustrates that generally a clean vertical dense area profile and CD (critical dimension) control of the etch profiles are critical factors for successful plasma etching of 1-Gbit (and beyond) DRAM ferroelectric devices possessing platinum electrodes. Redeposition and profile control are found to be strongly interlinked. Optimization of both profile angle and redeposition requires a tradeoff between the two. Where as vigorous post etch cleaning (e.g. wet cleaning with acid, mechanical polishing, etc.) can relieve some of the need to achieve a deposition free plasma etch, such post etch cleaning does not possess the accuracy that is desired as the platinum electrode itself is typically eroded and/or deteriorated by currently known post etch cleaning methods.

Therefore, what is needed and what has been invented is a method for etching a platinum electrode layer to produce a high density integrated circuit semiconductor device having platinum electrodes with a high degree (i.e., $\geq 85°$) of platinum profile anisotropy. What is further needed and what has been invented is a semiconductor device including a plurality of platinum electrodes having a platinum profile equal to or greater than about 85° and separated by a distance equal to or less than about 0.3 $\mu$m with each electrode having a critical dimension (e.g., a width) equal to or less than about 0.3 $\mu$m.

SUMMARY OF THE INVENTION

The present invention broadly provides a method of etching a platinum electrode layer disposed on a substrate comprising the steps of:

a) providing a substrate supporting a platinum electrode layer;

b) heating the substrate of step (a) to a temperature greater than about 150° C.; and c) etching the platinum electrode layer including employing a high density plasma of an etchant gas comprising a halogen (e.g., chlorine) and a noble gas (e.g., argon) to produce the substrate supporting at least one etched platinum electrode layer.

The high density plasma of an etchant gas is a plasma of an etchant gas having an ion density greater than about $10^9/cm^3$, preferably greater than about $10^{11}/cm^3$. The etchant gas may also include a gas selected from the group consisting of $BCl_3$, HBr, $SiCl_4$ and mixtures thereof. The platinum electrode layer of step (a) above may additionally comprise a mask layer disposed on a selected part of the platinum electrode layer to selectively protect the platinum electrode layer during the etching step (c) above. The platinum electrode layer of step (a) may also additionally comprise a protective layer disposed on the selected part of the platinum electrode layer between the mask layer and the platinum electrode layer. The mask layer may be removed during or after the etching step (c). Similarly, the protective layer may be removed during or after the etching step (c). The platinum electrode layer is part of or is contained in a platinum electrode wafer, and the method of etching a platinum electrode layer additionally comprises disposing the platinum electrode wafer including the platinum electrode layer of step (a) in a high density plasma chamber having a coil inductor and a wafer pedestal; and performing the etching step (c) in the high density plasma chamber under the following process conditions:

| Process | Parameters |
| --- | --- |
| Etchant Gas Flow | 50 to 500 sccm |
| Halogen Gas (e.g., $Cl_2$) | 20% to 95% by vol. |
| Noble Gas (e.g., Ar) | 5% to 80% by vol. |
| Pressure, mTorr | 0.1 to 300 milliTorr |
| RF Power (watts) of Coil Inductor | 100 to 5000 watts |
| RF Power (watts) of Wafer Pedestal | 50 to 3000 watts |
| Temperature (° C.) of Platinum Electrode Wafer | 150° to 500° C. |
| Platinum Etch Rate (Å/min) | 200 to 6000 Å/min |
| RF Frequency of Coil Inductor | 100K to 300 MHz |
| RF Frequency of Wafer Pedestal | 100K to 300 MHz |

In another embodiment of the present invention, there is broadly provided a method of etching a platinum electrode layer disposed on a substrate comprising the steps of:

(a) providing a substrate supporting a platinum electrode layer;

(b) heating said substrate of step (a) to a temperature greater than about 150° C.; and (c) etching said platinum electrode layer in a plasma of an etchant gas comprising nitrogen and a halogen (e.g., chlorine) to produce said substrate supporting at least one etched platinum electrode layer. The plasma may be a low density plasma or a high density plasma and the etchant gas may additionally comprise a gas selected from the group consisting of a noble gas (e.g., argon), HBr, $BCl_3$, $SiCl_4$, and mixtures thereof.

In another embodiment of the present invention, the etching step (c) may be performed in a low density (or high density) plasma chamber under the following process conditions:

| Process | Parameters |
| --- | --- |
| Etchant Gas Flow | 50 to 500 sccm |
| Halogen Gas (e.g., Cl) | 40% to 90% by vol. |
| Noble Gas (e.g., Ar) | 0.1% to 40% by vol. |
| Nitrogen gas | 0.1% to 60% by vol. |
| Pressure, mTorr | 0.1 to 500 milliTorr |
| RF Power (watts) of Coil Inductor* | 0 to 5000 watts |
| RF Power (watts) of Wafer Pedestal | 100 to 5000 watts |
| Platinum Etch Rate (Å/min) | 200 to 6000 Å/min |
| RF Frequency of Coil Inductor | 100K to 300 MHz |
| RF Frequency of Wafer Pedestal | 100K to 300 MHz |

*If 0 watts is employed or indicated for the coil inductor, 0 watts indicates that an RIE chamber is being used.

The etched platinum electrode layer includes a platinum profile equal to or greater than about 85°, more preferably equal to or greater than about 87°, most preferably equal to or greater than about 88.5°. In one embodiment of the invention, the etchant gas for the process conditions above may alternatively comprise from about 10% to about 90% by vol. of a halogen (e.g., $Cl_2$), from about 5% to about 80% by vol. of a noble gas (e.g., argon), and from about 4% to about 25% by vol. HBr and/or $BCl_3$. In another embodiment of the invention, the etchant gas may alternatively comprise from about 0.1% to about 60% by volume nitrogen, from about 40% to about 90% by volume of a halogen (e.g., $Cl_2$), from about 0.1% to about 40% by volume of a noble gas (e.g. argon), and from about 1% to about 30% by volume of a gas selected from the group of combining HBr, $BCl_3$, $SiCl_4$, and mixtures thereof.

The present invention also provides a method for producing a capacitance structure including a platinum electrode comprising the steps of:

a) providing a substrate supporting a platinum electrode layer and at least one mask layer disposed on a selected part of said platinum electrode layer;

b) heating the substrate of step (a) to a temperature greater than about 150° C.; and c) etching the platinum electrode layer including employing a plasma of an etchant gas comprising a halogen (e.g., chlorine) and a noble gas (e.g., argon) to produce a capacitance structure having at least one platinum electrode. The etchant gas may also comprise nitrogen.

The at least one mask layer is removed during or after the etching step (c) immediately above. The platinum electrode layer of step (a) immediately above may additionally comprise a protective layer disposed on the selected part of platinum electrode layer between the mask layer and the platinum electrode layer. The etched platinum electrode layer produced by the etching step (c) immediately above includes a platinum profile equal to or greater than about 80°, more preferably equal to or greater than about 87°, most preferably equal to or greater than about 88.5°. In one embodiment of the invention, the etchant gas of the plasma of step (c) more specifically includes a halogen (e.g., chlorine), a noble gas (e.g., argon), and a gas selected from the group consisting of HBr, $BCl_3$ and mixtures thereof. Alternatively, the etchant gas of the plasma of step (c) includes nitrogen ($N_2$) and a halogen (e.g., chlorine). In another embodiment of the invention, the etchant gas of the plasma of step (c) more specifically includes nitrogen ($N_2$), a halogen (e.g. chlorine), a noble gas (e.g. argon), and a gas selected from the group consisting of HBr, $BCl_3$, $SiCl_4$, and mixtures thereof. The platinum electrode layer is part of or is contained in a platinum electrode wafer, and the method for producing a capacitance structure including a platinum electrode layer additionally comprises disposing, prior to the etching step (c), the platinum electrode wafer in a high density plasma chamber having a coil inductor and a wafer pedestal; and performing the etching step (c) in the high density plasma chamber under the following previously indicated process conditions:

| Process | Parameters |
| --- | --- |
| Etchant Gas Flow | 50 to 500 sccm |
| Halogen Gas (e.g., $Cl_2$) | about 10% to about 90% by vol. |
| Noble Gas (e.g., Ar) | about 5% to about 80% by vol. |
| HBr and/or $BCl_3$ | about 4% to about 25% by vol. |
| Pressure, mTorr | 0.5 to 300 milliTorr |
| RF Power (watts) of Coil Inductor | 100 to 5000 watts |
| RF Power (watts) of Wafer Pedestal | 50 to 3000 watts |
| Temperature (° C.) of Platinum Electrode Wafer | about 150° to about 500° C. |
| Platinum Etch Rate (Å/min) | 200 to 6000 Å/min |
| RF Frequency of Coil Inductor | 100K to 300 MHz |
| RF Frequency of Wafer Pedestal | 100K to 300 MHz |

The produced platinum electrodes are separated by a distance or space having a dimension equal to or less than about 0.35 μm, preferably equal to or less than about 0.3 μm. Each of the platinum electrodes includes a dimension having a value equal to or less than about 1.0 μm, preferably equal to or less than about 0.6 μm, preferably equal to or less than about 0.35 μm, preferably equal to or less than about 0.3 μm. More preferably, each of the platinum electrodes has a width equal to or less than about 0.35 μm, preferably equal to or less than about 0.3 μm, a length equal to or less than about 1.0 μm, preferably equal to or less than about 0.6 μm, and a height equal to or less than about 0.6 μm. The plasma of the etchant gas comprises a high density inductively coupled plasma. The etchant gas preferably comprises a noble gas selected from the group consisting of helium, neon, argon, krypton, xenon, radon, and mixtures thereof. More preferably, the noble gas is selected from the group consisting of helium, neon, argon, and mixtures thereof. Most preferably, the noble gas is argon. As was previously indicated, the etchant gas of the high density inductively coupled plasma most preferably comprises, or preferably consists of or consists essentially of, chlorine, argon, and $BCl_3$ and/or HBr.

The present invention further broadly provides a method of manufacturing a semiconductor device comprising the steps of:

a) forming a patterned resist layer, a mask layer and a platinum electrode layer on a substrate having circuit elements formed thereon;

b) etching a portion of the mask layer including employing a plasma of an etchant gas to break through and to remove the portion of the mask layer from the platinum electrode layer to produce the substrate supporting the patterned resist layer, a residual mask layer, and the platinum electrode layer;

c) removing the resist layer of step (b) to produce the substrate supporting the residual mask layer and the platinum electrode layer;

d) heating the substrate of step (c) to a temperature greater than about 150° C.; and e) etching the platinum electrode layer of step (d) including employing a high density plasma of an etchant gas comprising a halogen gas (e.g., chlorine) and a noble gas (e.g., argon) to produce a semiconductor device having at least one platinum electrode.

The present invention also further broadly provides a method of etching a platinum electrode layer disposed on a substrate comprising the steps of:

a) providing a substrate supporting a platinum electrode layer, a protective layer on the platinum electrode layer, and a mask layer on the protective layer, and a patterned resist layer on the mask layer;

b) etching a portion of the mask layer including employing a plasma of an etchant gas to break through and to remove the portion of the mask layer from the protective layer to expose part of the protective layer and to produce the substrate supporting the platinum electrode layer, the protective layer on the platinum electrode layer, a residual mask layer on the protective layer, and the patterned resist layer on the residual mask layer;

c) removing the patterned resist layer from the residual mask layer of step (b) to produce the substrate supporting the platinum electrode layer, the protective layer on the platinum electrode layer, and the residual mask layer on the protective layer;

d) heating the substrate of step (c) to a temperature greater than about 150° C.;

e) etching the exposed part of the protective layer to expose part of the platinum electrode layer and to produce the substrate supporting the platinum electrode layer, a residual protective layer on the platinum electrode layer, and the residual mask layer on the residual protective layer; and f) etching the exposed part of the platinum electrode layer of step (e) including employing a high density plasma of an etchant gas comprising a halogen gas (e.g., chlorine) and a noble gas (e.g., argon) to produce the substrate supporting an etched platinum electrode layer having the residual protective layer on the etched platinum electrode layer, and the residual mask layer on the residual protective layer.

The patterned resist layer is removed from the residual insulation layer before heating the substrate to a temperature greater than about 150° C. because such high temperatures would destroy the resist layer. The residual mask layer may be removed from the platinum electrode layer either before or after heating of the substrate to a temperature greater than about 150° C., and during or after the platinum etching step. The platinum electrode layer is part of or is contained in a platinum electrode wafer. The purpose of the protective layer is to ensure the adhesion between the mask layer and the platinum layer and also to maintain the platinum profile of the platinum electrode layer, especially during the platinum etching process of the present invention. Preferably, the residual protective layers are removed from the etched platinum electrodes after the platinum etching step.

As previously indicated, etching of the platinum electrode layer to produce the platinum electrodes of the present invention is performed in a high density plasma chamber. The platinum etching step employs a high density plasma of an etchant gas preferably consisting of, or consisting essentially of, a halogen gas (e.g., chlorine), a noble gas (i.e., argon) and HBr and/or $BCl_3$. The high density plasma chamber possesses a separate control for ion flux and a separate control for ion energy. As previously indicated, the ion density of the high density plasma in the high density plasma chamber is greater than about $10^9/cm^3$.

The high density plasma chamber for the method of manufacturing a semiconductor device and for the method of etching a platinum electrode layer disposed on a substrate includes a coil inductor and a wafer pedestal; and the platinum etching step in both of the methods is performed in the high density plasma chamber under the following previously mentioned process conditions:

| Process | Parameters |
| --- | --- |
| Etchant Gas Flow | 50 to 500 sccm |
| Halogen Gas (e.g., $Cl_2$) | about 10% to about 90% by vol. |
| Noble Gas (e.g., argon) | about 5% to about 80% by vol. |
| HBr and/or $BCl_3$ | about 4% to about 25% by vol. |
| Pressure, mTorr | 0.1 to 300 milliTorr |
| RF Power (watts) of Coil Inductor | 100 to 5000 watts |
| RF Power (watts) of Wafer Pedestal | 50 to 3000 watts |
| Temperature (° C.) of Platinum Electrode Wafer | about 150° to about 500° C. |
| Platinum Etch Rate (Å/min) | 200 to 6000 Å/min |
| RF Frequency of Coil Inductor | 100K to 300 MHz |
| RF Frequency of Wafer Pedestal | 100K to 300 MHz |

In another embodiment of the present invention, the etching step may be performed in a low density (or high density) plasma chamber under the following process conditions:

| Process | Parameters |
| --- | --- |
| Etchant Gas Flow | 35 to 900 sccm |
| Halogen Gas (e.g., $Cl_2$) | 10% to 90% by vol. |
| Noble Gas (e.g., argon) | 0% to 20% by vol. |
| Nitrogen gas | 10% to 80% by vol. |
| HBr and/or $BCl_3$ and/or $SiCl_4$ | 0% to 25% by vol. |
| Pressure, mTorr | 0.1 to 2000 milliTorr |
| RF Power (watts)* of Coil Inductor | 0 to 5000 watts |
| RF Power (watts) of Wafer Pedestal | 100 to 5000 watts |
| Platinum Etch Rate (Å/min) | 200 to 6000 Å/min |
| RF Frequency of Coil Inductor | 100K to 300 MHz |
| RF Frequency of Wafer Pedestal | 100K to 300 MHz |

*If 0 watts is used for coil inductor, it implies an RIE chamber.

The present invention also provides a method of processing a layer on a substrate comprising the steps of:

a) providing a substrate;

b) disposing the substrate in a reactor chamber comprising a dielectric window including a deposit-receiving surface having a peak-to-valley roughness height with an average height value of greater than about 1000 Å;

c) introducing a processing gas into the reactor chamber of step (b); and d) introducing processing power into the reactor chamber of step (b) to process a layer on the substrate in a plasma of the processing gas.

The present invention further provides a dielectric member comprising a dielectric structure including a surface finish having a peak-to-valley roughness height with an average height value of greater than about 1000 Å. A pedestal assembly is disposed in the processing zone. The chamber assembly also comprises a processing power source; a processing gas-introducing assembly, engaged to the chamber wall, for introducing a processing gas into the processing zone of the chamber wall; and a processing power-transmitting member connected to the processing power source for transmitting power into the processing zone to aid in sustaining a plasma from a processing gas within the processing zone of the processing chamber wall.

The present invention yet also further broadly provide a semiconductor device, more specifically a capacitance structure, comprising a substrate, and at least two platinum electrodes supported by the substrate. The platinum electrodes have a platinum profile equal to or greater than about 80°, such as equal to or greater than about 85°, preferably equal to or greater than about 87°, more preferably equal to or greater than about 88.5°. The platinum electrodes are separated by a distance or space having a dimension equal to or less than about 0.35 µm, preferably equal to or less than about 0.3 µm. Each of the platinum electrodes includes a dimension having a value equal to or less than about 1.0 µm, preferably equal to or less than about 0.6 µm, preferably equal to or less than about 0.35 µm, preferably equal to or less than about 0.3 µm. More preferably, each of the platinum electrodes has a width equal to or less than about 0.35 µm, preferably equal to or less than about 0.3 µm, a length equal to or less than about 1.0 µm, preferably equal to or less than about 0.6 µm, and a height equal to or less than about 0.6 µm.

In another preferred embodiment of the present invention, there is provided a method of etching an iridium (i.e. a noble metal layer) layer disposed on a substrate comprising the steps of:

a) providing a substrate supporting an iridium layer;

b) heating the substrate of step (a) of a temperature greater than about 150° C.; and c) etching the iridium layer including employing a plasma of an etchant gas (i.e. a low density or high density plasma of an etchant gas) comprising a halogen containing gas (e.g. chlorine) and a noble gas (e.g. argon) to produce the substrate supporting at least one etched iridium layer. In one embodiment of the invention, the etchant gas additionally comprises a gas selected from the group consisting of $O_2$ and $BCl_3$. In another embodiment of the invention, the etchant gas additionally comprises a gas selected from the group consisting of $O_2$, HCl, HBr, and mixtures thereof. The halogen containing gas comprises or consists essentially of chlorine and the noble gas comprises or consists essentially of argon. Optionally, the etchant gas comprises or consists essentially of chlorine, argon and $O_2$. The iridium layer of step (a) additionally comprises a mask layer (e.g. a TiN or Ti mask layer) disposed on a selected part of the iridium layer to selectively protect the iridium layer during the etching step (c).

The present invention also provides a method of etching an iridium electrode layer disposed on a substrate comprising the steps of:

a) providing a substrate supporting an iridium electrode layer, a protective layer on the iridium electrode layer, a Ti mask layer on the protective layer, and a patterned resist layer on the mask layer;

b) etching a portion of the Ti mask layer including employing a plasma of an etchant gas to break through and to remove the portion of the Ti mask layer from the iridium electrode layer to expose part of the protective layer and to produce the substrate supporting the iridium electrode layer, the protective layer on the iridium electrode layer, a residual Ti mask layer on the protective layer, and the patterned resist layer on the residual Ti mask layer;

c) removing the patterned resist layer from the residual Ti mask layer of step (b) to produce the substrate supporting the iridium electrode layer, the protective layer on the iridium electrode layer, and the residual mask layer on the protective layer;

d) heating the substrate of step (c) to a temperature greater than about 150° C.;

e) etching the exposed part of the protective layer to expose part of the iridium electrode layer and to produce the substrate supporting the iridium electrode layer, a residual protective layer on the iridium electrode layer, and the residual mask layer on the residual protective layer; and f) etching the exposed part of the iridium electrode layer of step (e) including employing a plasma (e.g. a high density or low density plasma) of an etchant gas comprising oxygen, chlorine and argon to produce the substrate supporting an etched iridium electrode layer having the residual protective layer on the etched iridium electrode layer, and the residual Ti mask layer on the residual protective layer.

The present invention further also provides a method of etching an iridium electrode layer disposed on a substrate comprising the steps of:

a) providing a substrate supporting an iridium electrode layer, a protective layer on the iridium electrode layer, a mask layer on the protective layer, and a patterned resist layer on the mask layer;

b) etching a portion of the mask layer including employing a plasma of an etchant gas to break through and to remove the portion of the mask layer from the iridium electrode layer to expose part of the protective layer and to produce the substrate supporting the iridium electrode layer, the protective layer on the iridium electrode layer, a residual mask layer on the protective layer, and the patterned resist layer on the residual mask layer;

c) etching the exposed part of the protective layer to expose part of the iridium electrode layer and to produce the substrate supporting the iridium electrode layer, a residual protective layer on the iridium electrode layer, the residual mask layer on the residual protective layer, and the patterned resist layer on the residual mask layer;

d) removing the patterned resist layer from the residual mask layer of step (c) to produce the substrate supporting the iridium electrode layer, the residual protective layer on the iridium electrode layer, and the residual mask layer on the residual protective layer;

e) heating the substrate of step (d) to a temperature greater than about 150° C.; and f) etching the exposed part of the iridium electrode layer of step (d) including employing a high density plasma (e.g. a low density or high density plasma) of an etchant gas comprising chlorine and a noble gas to produce the substrate supporting an etched iridium electrode layer having the residual protective layer on the etched iridium electrode layer, and the residual mask layer on the residual protective layer. The etchant gas of step (f) additionally comprises a gas selected from the group consisting of oxygen, HCl, HBr and mixtures thereof. More specifically the etchant gas comprises, preferably consists of or consists essentially of, oxygen, the halogen (i.e., chlorine), the noble gas (i.e., argon), and a gas selected from the group consisting of HBr, HCl and mixtures thereof. The etchant gas more specifically comprises, or consists of or consists essentially of, from about 5% by volume to about 20% by volume oxygen, from about 10% by volume to about 60% by volume of the halogen gas (i.e., chlorine) and from about 30% by volume to about 80% by volume of the noble gas (i.e., argon) and from about 5% by volume to about 20% by volume of HBr and/or HCl; preferably from about 5% by volume to about 15% by volume oxygen, from about 20% by volume to about 50% by volume of the halogen gas (i.e., chlorine) and from about 40% by volume to about 70% by volume of the noble gas (i.e., argon) and from about 5% by volume to about 15% by volume of HBr and/or HCl; and more preferably from about 5% by volume to about 10% by volume oxygen, from about 20% by volume to about 35% by volume of the halogen gas (i.e., chlorine) and from about 40% by volume to about 60% by volume of the noble gas (i.e., argon) and from about 5% by volume to about 10% by volume of HBr and/or HCl. The etchant gas flow rate ranges from about 50 sccm to about 500 sccm.

When the etchant gases are a mixture of oxygen, the halogen gas(es) (i.e., chlorine), the noble gas(es) (i.e., argon), and HBr and/or $BCl_3$, the process parameters for etching an electrode layer in a suitable inductively coupled plasma reactor fall into the ranges as listed below on the basis of rates of the gases, including oxygen, the halogen gas(es) (i.e., $Cl_2$), the noble gas(ses) (i.e., Ar), and HBr and/or HCl.

| Process | Broad | Preferred | Optimum |
|---|---|---|---|
| Gas Flow, sccm | | | |
| $O_2$ | 10 to 60 | 10 to 40 | 15 to 30 |
| $Cl_2$ | 30 to 100 | 30 to 70 | 50 to 70 |
| Ar | 50 to 250 | 100 to 200 | 100 to 150 |
| HBr and/or HCl | 10 to 60 | 10 to 40 | 15 to 30 |
| Pressure, mT | 0.1 to 300 | 10 to 100 | 10 to 40 |
| RF Power of Coil Inductor (Watts) | 100 to 5000 | 650 to 2000 | 750 to 1000 |
| RF Power of Wafer Pedestal (Watts) | 50 to 3000 | 100 to 1000 | 150 to 600 |
| Temperature of Wafer (° C.) | about 150 to about 500 | 200 to 400 | 250 to 350 |
| Etch Rate (Å/min) | 200 to 6000 | 500 to 3000 | 500 to 2000 |
| RF Frequency of Coil Inductor | 100K to 300 MHz | 400K to 20 MHz | 2 to 13.5 MHz |
| RF Frequency of Wafer Pedestal | 100K to 300 MHz | 400K to 20 MHz | 400K to 13.5 MHz |

The foregoing provisions along with various ancillary provisions and features which will become apparent to those skilled in the art as the following description proceeds, are attained by the practice of the present invention, a preferred embodiment thereof shown with reference to the accompanying drawings, by way of example only, wherein:

DESCRIPTION OF THE PREFERRED EMBODIMENTS OF THE INVENTION

Figure 1:
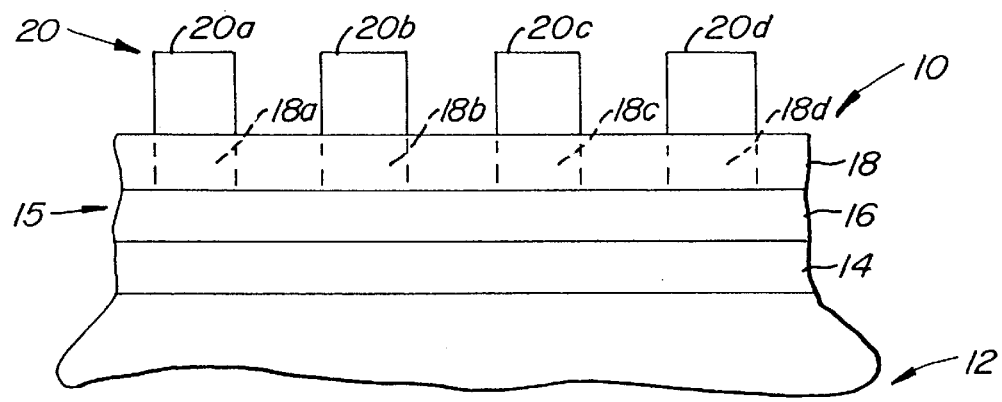
FIG. 1 is a side elevational view of a semiconductor wafer having a semiconductor substrate, a barrier layer disposed on the semiconductor substrate, a platinum electrode layer disposed on the barrier layer, a mask layer disposed on the platinum electrode layer, and a patterned resist disposed on the mask layer.

Referring in detail now to the drawings wherein similar parts of the present invention are identified by like reference numerals, there is seen in FIG. 1 a wafer, generally illustrated as 10, having a semiconductor substrate, generally illustrated as 12. The semiconductor substrate 12 includes regions of circuit elements which do not appear in the drawings, but are well known to those skilled in the art. A barrier layer 14 is disposed over the semiconductor substrate 12 and a platinum layer, generally illustrated as 15, is disposed over the barrier layer 14. The platinum layer 15 is preferably a platinum electrode layer 16 as shown in FIG. 1. Because the platinum electrode layer 16 is a preferred platinum layer 15, the remaining description of the present invention will use only the term "platinum electrode layer 16" in describing the present invention. However, it is to be understood that wherever "platinum electrode layer 16" is stated hereinafter, it is to also have the equivalence of "platinum layer 15" for purposes of the present invention.

Figure 2:
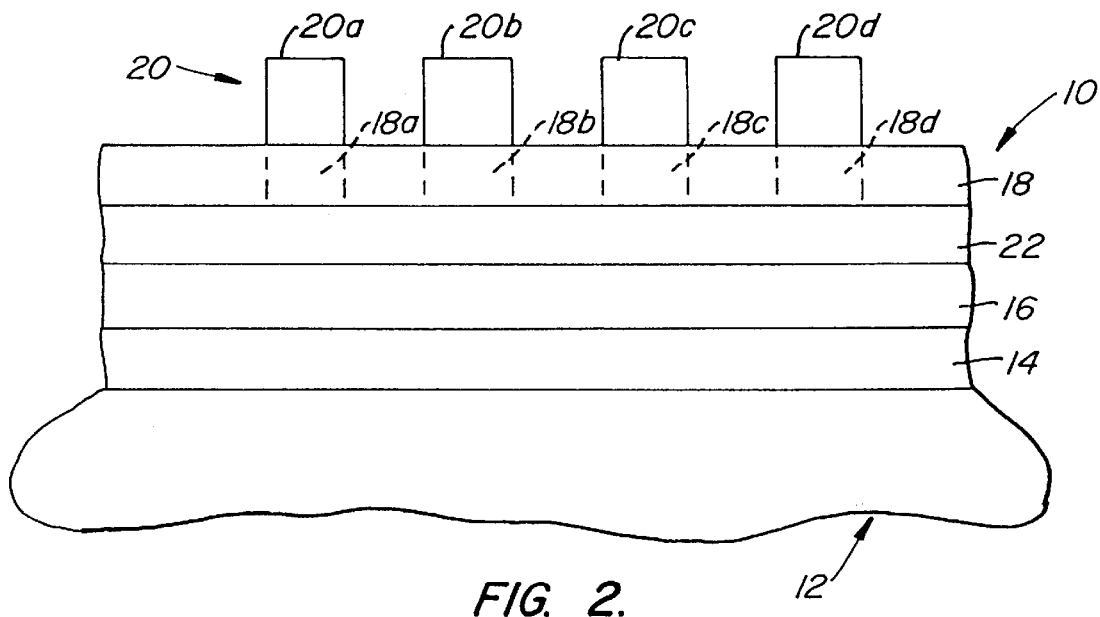
FIG. 2 is a side elevational view of the semiconductor wafer of FIG. 1 additionally including a protective layer disposed on the platinum electrode layer between the mask layer and the platinum electrode layer.

Because the platinum electrode layer 16 easily diffuses or reacts with certain elements (e.g. a poly-Si plug) within the semiconductor substrate 12, the barrier layer 14 is required between the platinum electrode layer 16 and the semiconductor substrate 12. The barrier layer 14 also functions as an adhesive for coupling the semiconductor substrate 12 to the platinum electrode layer 16. A mask 18 is disposed over the platinum electrode layer 16 and a patterned resist (i.e. a photoresist), generally illustrated as 20, is selectively positioned on the mask layer 18 as best shown in FIG. 1. As best shown in FIG. 1, the patterned resist 20 includes a plurality of resist members 20a, 20b, 20c, and 20d. In another preferred embodiment of the invention as shown in FIG. 2, a protective layer 22 is disposed between the platinum electrode layer 16 and the mask layer 18.

The barrier layer 14 may be any suitable barrier layer which is capable of dually functioning as an adhesive and a diffusion barrier to the platinum electrode layer 16. The barrier layer 14 may be of any suitable thickness. Preferably, the barrier layer 14 comprises titanium and/or a titanium alloy, such as TiN, and possesses a thickness ranging from about 50 Angstroms to about 600 Angstroms, more preferably from about 200 Angstroms to about 400 Angstroms, most preferably about 300 Angstroms. The barrier layer 14 is preferably disposed on the semiconductor substrate 12 by the RF magnetron sputtering method.

The platinum electrode layer 16 is used as the electrode material because it is inert to oxidation which tends to occur in the subsequent high temperature processes of depositing the high dielectric constant ferroelectric materials. The platinum electrode layer 16 is also used as the electrode material because platinum is a good electric conductor. The thickness of the platinum electrode layer 16 would depend upon the end use of the semiconductor or capacitance device which is to contain the platinum electrode layer 16. Typically, the thickness of the platinum electrode layer 16 ranges from about 500 Angstroms to about 4000 Angstroms, more preferably from about 1000 Angstroms to about 3000 Angstroms, most preferably about 2000 Angstroms. The platinum electrode is preferably disposed on the barrier layer 14 by the RF magnetron sputtering method.

The mask layer 18 may be any suitable insulation or metallic material that is capable of being etched in accordance with the procedure described hereinafter such that all traces of the mask layer 18 are essentially removed from the surface platinum electrode layer 16 except that portion (identified as "18a," "18b," "18c," and "18d" below) of the mask layer 18 remaining under the patterned resist 20. The mask layer 18 may also be of any suitable thickness. Preferably, the mask layer 18 comprises silicon dioxide ($SiO_2$) and/or silicon nitride ($Si_3N_4$) or any other suitable dielectric material. A preferred thickness for the mask layer 18 ranges from about 1000 Angstroms to about 9000 Angstroms, more preferably from about 3000 Angstroms to about 7000 Angstroms, most preferably about 5000 Angstroms. The mask layer 18 is preferably disposed on the platinum electrode layer 16 by chemical vapor deposition.

The patterned resist 20 (i.e. the photoresist 20, including resist members 20a, 20b, 20c and 20d) may be any suitable layer of material(s) that is capable of protecting any underlying material (e.g. the mask layer 18) from being etched during the etching process of the present invention. Suitable materials for the patterned resist 20 include resist systems consisting of novolac resin and a photoactive dissolution inhibitor (all based on Süss's discovery). Other suitable materials for the resist 20 are listed in an article from the July 1996 edition of Solid State Technology entitled "Deep-UV Resists: Evolution and Status" by Hiroshi Ito. The patterned resist 20 may have any suitable thickness; preferably, the thickness of the patterned resist 20 ranges from about 0.3 $\mu$m to about 1.40 $\mu$m, more preferably from about 0.5 $\mu$m to about 1.2 $\mu$m, most preferably about 0.8 $\mu$m. The patterned resist 20 is preferably disposed on the mask layer 18 by the spin coating method.

The protective layer 22 in the embodiment of the invention depicted in FIG. 2 is for protecting the corners (identified as "16g" below) of an etched platinum electrode layer (generally identified as "16e" below) during the overetching process of the present invention. Another purpose of the protective layer 22 is for providing good adhesion to the mask layer 18 and the platinum electrode layer 16. The protective layer 22 may comprise any suitable materials or chemicals, such as titanium and/or titanium nitride etc., and may be conveniently disposed on the surface of the platinum electrode layer 16, such as by the RF magnetron sputtering method. The thickness of the protective layer 22 may be any suitable thickness, preferably ranging from about 50 Angstroms to about 1000 Angstroms, more preferably ranging from about 100 Angstroms to about 600 Angstroms, most preferably about 300 Angstroms.

Figure 5:
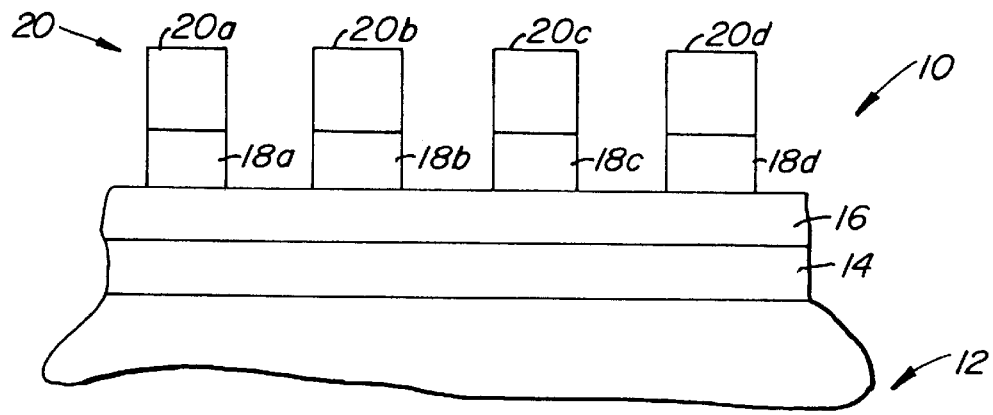
FIG. 5 is a side elevational view of the semiconductor wafer of FIG. 1 after etching and removing a portion of the mask layer from the surface of the platinum electrode layer to expose the platinum electrode layer.
Figure 6:
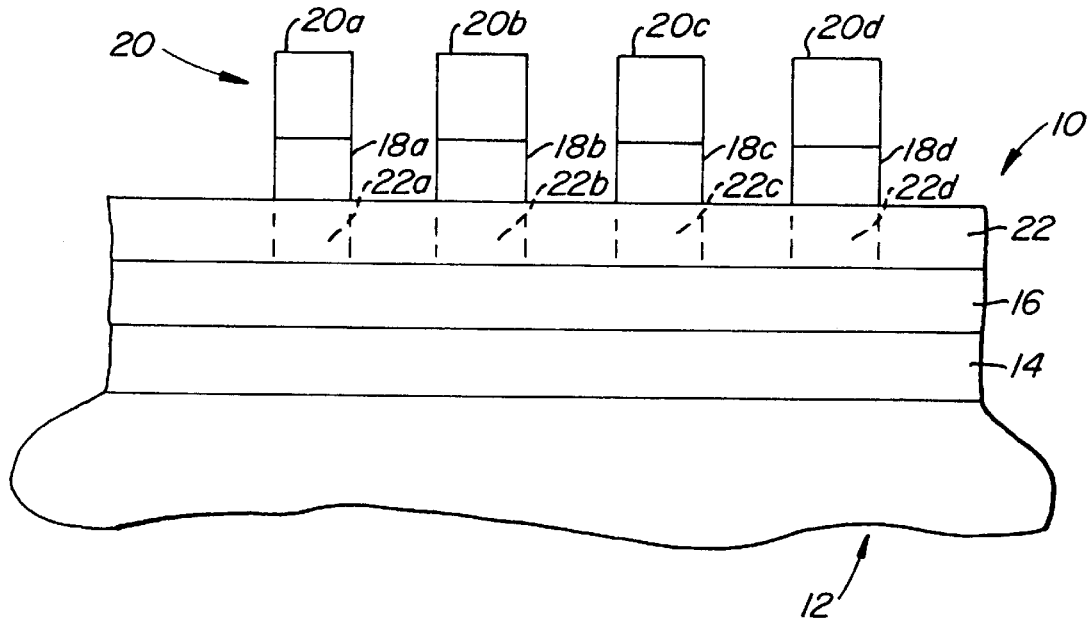
FIG. 6 is a side elevational view of the semiconductor wafer of FIG. 2 after etching and removing a portion of the mask layer from the surface of the protective layer to expose the protective layer.

In order to form or produce a semiconductor or capacitance device from the multilayered structure of FIG. 1 or FIG. 2, the multilayered structure is initially placed in a suitable plasma processing apparatus to break through and remove or etch away from the surface of platinum electrode layer 16 the mask layer 18, except those mask layers 18a, 18b, 18c and 18d that are respectively below the resist members 20a, 20b, 20c and 20d, as best shown in FIG. 5, or as best shown in FIG. 6 if the embodiment of the invention depicted in FIG. 2 is being employed.

Figure 3:
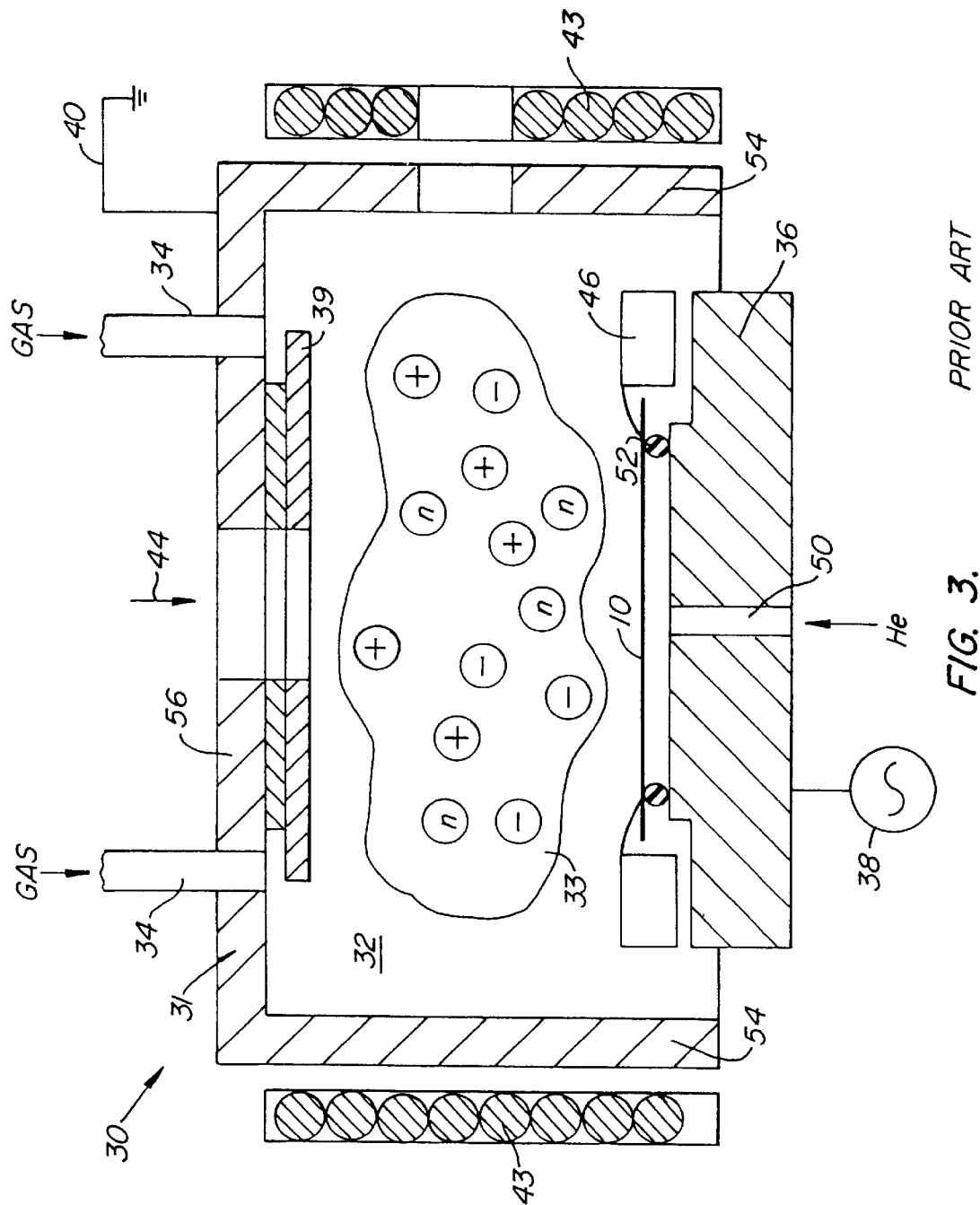
FIG. 3 is a vertical sectional view of a prior art plasma processing apparatus including a plasma etching reactor with an electromagnetic unit for enhancing a plasma.

A suitable prior art plasma processing apparatus is shown in FIG. 3 and described in U.S. Pat. No. 5,188,704 to Babie et al, fully incorporated herein by reference thereto as if repeated verbatim immediately hereinafter. The plasma process apparatus of FIG. 3 comprises a plasma reactor, generally illustrated as 30 and including walls, generally illustrated as 31 for forming and housing a reactor chamber 32 wherein a plasma 33 of neutral (n) particles, positive (+) particles, and negative (−) particles are found. Walls 31 include cylindrical wall 54 and cover 56. Plasma processing gases are introduced via inlets 34 into reactor chamber 32. Plasma etching gases are introduced into chamber 32 through inlets 34–34. A water cooled cathode 36 is connected to an RF power supply 38 at 13.56 MHz. An anode 39 is connected to the walls 31 which are grounded by line 40. Helium gas is supplied through passageway 50 through cathode 36 to the space beneath wafer 10 which is supported peripherally by lip seal 52 so that the helium gas cools the wafer 10. The wafer 10 is supported by a wafer support 46 that includes a plurality of clamps (not shown) which hold down the upper surface of wafer 10 at its periphery, as is well known to those skilled in the art. A pair of helmholtz configured electromagnetic coils 42 and 43 provide north and south poles within the chamber 32 and are disposed at opposite ends of the lateral cylindrical wall 54 and the walls 31. The electromagnetic coils 42 and 43 provide a transverse magnetic field with the north and south poles at the left and right providing a horizontal magnetic field axis parallel to the surface of the wafer 10. The transverse magnetic field is applied to slow the vertical velocity of the electrons which are accelerated radially by the magnetic field as they move towards the wafer 10. Accordingly, the quantity of electrons in the plasma 33 is increased by means of the transverse magnetic field and the plasma 33 is enhanced as is well known to these skilled in the art.

The electromagnetic coils 42 and 43 which provide the magnetic field are independently controlled to produce a field intensity orientation which is uniform. The field can be stepped angularly around the wafer 10 by rotating the energization of the electromagnetic coils 42 and 43, sequentially. The transverse magnetic field provided by the electromagnetic coils 42 and 43 is directed parallel to the surface of the wafer 10 being treated by the plasma 33, and the cathode 36 of the plasma reactor 30 increases ionization efficiently of the electrons in the plasma 33. This provides the ability to decrease the potential drop across the sheath of the cathode 36 and to increase the ion current flux present on the surface of the wafer 10, thereby permitting higher rates of etching without requiring higher ion energies to achieve the result otherwise.

Figure 4:
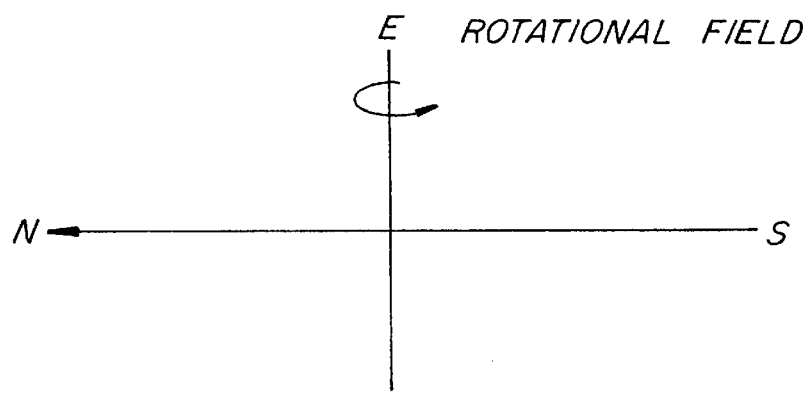
FIG. 4 is a diagram of a flux produced by a magnetic field and illustrated as rotating around a center axis.

The preferred magnetic source employed to achieve magnetically enhanced reactive ion etching (MERIE) used in practicing the present invention is a variable rotational field provided by the electromagnetic coils 42 and 43 arranged in a Helmholtz configuration. The electromagnetic coils 42 and 43 are driven by 3-phase AC currents. The magnetic field with Flux B is parallel to the wafer 10, and perpendicular to the electrical field as shown in FIG. 4. Referring to FIG. 4, the vector of the magnetic field H which produces flux B is rotating around the center axis of the electrical field by varying the phases of current flowing through the electromagnetic coils 42 and 43 at a typical rotational frequency of 0.01 to 1 Hz, particularly at 0.5 Hz. The strength of the magnetic flux B typically varies from 0 Gauss to about 150 Gauss and is determined by the quantities of the currents supplied to the electromagnetic coils 42 and 43. While FIG. 3 illustrates one plasma processing apparatus that is suitable for removing the mask layer 18 (except mask layers 18a, 18b, 18c and 18d), it is to be understood that other plasma etchers may be employed, such as electron cyclotron resonance (ECR), helicon resonance or inductively coupled plasma (ICP), triode etchers, etc.

The plasma 33 may employ any suitable etchant gas to break through (i.e. to clean and etch away) the mask layer 18 except those mask layers 18a, 18b, 18c and 18d that are respectively below the resist members 20a, 20b, 20c and 20d, as best shown FIGS. 5 and 6. For example, if the mask layer 18 contains silicon oxide, suitable etchant gas(es) may be selected from the group consisting of fluorine-containing gases (e.g. $CHF_3$, $SF_6$, $C_2F_6$, $NF_3$, etc.), bromine-containing gases (e.g. HBr, etc.), chlorine-containing gases (e.g. $CHCl_3$, etc.), rare or noble gases (e.g. argon, etc.), and mixtures thereof. Preferably, the etchant does not include an oxidant, such as oxygen, since the purpose of this step is to remove the mask layer 18 (except those mask layers 18a, 18b, 18c and 18d which are respectively protected by resist members 20a, 20b, 20c and 20d) and not to remove the patterned resist 20. More preferably, the etchant gas comprises from about 20% by volume to about 40% by volume CHF$_3$ and from about 60% by volume to about 80% by volume argon. The preferred reactor conditions for a suitable plasma processing apparatus (such as the plasma processing apparatus of FIG. 3) in removing the mask layer 18 (except mask layers 18a, 18b, 18c and 18d) are as follows:

| | |
|---|---|
| Pressure | 10–150 mTorr |
| RF Power | 500–1500 watts |
| Rotational Magnetic Field | 25–70 Gauss |
| Temperature of Wafer | 25–100° C. |
| Mask Layer 18 Etch Rate | 2000–10,000 Angstroms/min |

The selectivity of mask layer 18 to patterned resist 20 is better than 3:1, depending on the materials employed for the mask layer 18 and the patterned resist 20.

More generally, the process parameters for removing the mask layer 18 in a suitable plasma process apparatus (such as the plasma processing apparatus of FIG. 3) fall into ranges as listed in the following Table III and based on flow rates of the gases CHF$_3$ and Ar also listed in the following Table III:

TABLE III

| Process | Broad | Preferred |
|---|---|---|
| Gas Flow, sccm | | |
| CHF$_3$ | 10 to 50 (20 to 40% by vol.) | 20 to 40 |
| Ar | 50 to 90 (60 to 80% by vol.) | 60 to 80 |
| Pressure, mT | 10 to 250 | 10 to 150 |
| 13.56 MHz RF Power (Watts) | 500 to 2500 | 500 to 1500 |
| Temperature (° C.) of Wafer | 10 to 120 | 25 to 100 |
| Magnetic Field Gauss | 10 to 120 | 25 to 70 |

For the embodiment of the invention depicted in FIG. 2 wherein the protective layer 22 is disposed on the platinum electrode layer 16 between the mask layer 18 and the platinum electrode layer 16, the protective layer 22 has to be removed or etched after removal of the mask layer 18 in order to expose the platinum electrode layer 16. The protective layer 22 may be etched and removed by any suitable manner and/or with any suitable plasma processing apparatus (such as with the plasma processing apparatus of FIG. 3) including the plasma 33 employing a suitable etchant gas to break through and etch away the protective layer 22 except those protective layers 22a, 22b, 22c and 22d (see FIGS. 6 and 8) immediately below mask layers 18a, 18b, 18c and 18d, respectively. For example, if TiN is used as the protective layer 22, suitable etchant gas(es) may be selected from the group consisting of Cl$_2$, HBr, BCl$_3$, noble gases (e.g., Ar), and mixtures thereof. Preferably and in one embodiment of the present invention, the etchant gas for breaking through and etching away the protective layer 22, except protective layers 22a, 22b, 22c and 22d, comprises from about 20% by volume to about 60% by volume Cl$_2$, from about 20% by volume to about 60% by volume HBr and/or BCl$_3$, and from about 10% by volume to about 30% by volume of a noble gas which is preferably Ar. Suitable reactor conditions for a suitable plasma processing apparatus (such as the plasma processing apparatus of FIG. 3) to remove the protective layer 22 (except protective layers 22a, 22b, 22c and 22d) may be the same as those previously stated reactor conditions for the removal of the mask layer 18 (except mask layers 18a, 18b, 18c and 18d). It is to be understood that other plasma etchers may be employed to remove the protective layer 20, such as ECR, ICP, Helicon Resonance, etc. As will be further explained below, the protective layers 22a, 22b, 22c and 22d are for protecting the corners (identified as "16g" below) of an etched platinum electrode layer (generally identified as "16e" below) during the etching process of the present invention. It is believed that the protective layers 22a, 22b, 22c and 22d not only protect the corners of an etched platinum electrode layer during the etching process, but also assist in maintaining an existing platinum profile and/or improves a platinum profile.

In another embodiment of the present invention, the protective layer 22 (except protective layers 22a, 22b, 22c and 22d) may be etched and removed by the high temperatures and etchant gases employed in the platinum-etching process of the present invention. More specifically and as will be further explained below, because the platinum electrode layer 16 is preferably etched under the following process conditions in a high density plasma chamber containing a high density inductively coupled plasma:

| Process | Parameters |
|---|---|
| Etchant Gas flow | 50 to 500 sccm |
| Halogen Gas (e.g., Cl$_2$) | 20% to 95% by vol. |
| Noble Gas (e.g., Ar) | 5% to 80% by vol. |
| Pressure, mTorr | 0.1 to 300 milliTorr |
| RF Power (watts) of Coil Inductor | 100 to 5000 watts |
| RF Power (watts) of Wafer Pedestal | 50 to 3000 watts |
| Temperature (° C.) of Platinum Electrode Wafer | about 150 to about 500° C. |
| Platinum Etch Rate (Å/min) | 200 to 6000 Å/min |
| RF Frequency of Coil Inductor | 100K to 300 MHz |
| RF Frequency of Wafer Pedestal | 100K to 300 MHz | the protective layer 22 may be etched and removed under the same foregoing conditions. Thus, the same apparatus and process conditions may be employed to etch and remove selective parts of the protective layer 22, as well as to etch the platinum electrode layer 16. In another preferred embodiment of the present invention and as will be also further explained below, the protective layer 22 and the platinum electrode layer 16 may be removed and etched respectively in a high density plasma chamber containing a high density inductively coupled plasma under the following process conditions:

| Process | Parameters |
|---|---|
| Etchant Gas flow | 50 to 500 sccm |
| Halogen Gas (e.g., Cl$_2$) | 10% to 90% by vol. |
| Noble Gas (e.g., Ar) | 5% to 80% by vol. |
| HBr and/or BCl$_3$ | 4% to 25% by vol. |
| Pressure, mTorr | 0.1 to 300 milliTorr |
| RF Power (watts) of Coil Inductor | 100 to 5000 watts |
| RF Power (watts) of Wafer Pedestal | 50 to 3000 watts |
| Temperature (° C.) of | about 150 to 500° C. |

-continued

| Process | Parameters |
|---|---|
| Platinum Electrode Wafer | |
| Platinum Etch Rate (Å/min) | 200 to 6000 Å/min |
| RF Frequency of Coil Inductor | 100K to 300 MHz |
| RF Frequency of Wafer Pedestal | 100K to 300 MHz |

After selective parts of the mask layer 18 have been etched away from the surface of the platinum electrode layer 16 to expose the latter and such that the only remnants of the mask layer 18 are the mask layers 18a, 18b, 18c and 18d situated immediately below the resist members 20a, 20b, 20c, and 20d, respectively, the resist members 20a, 20b, 20c and 20d are to be removed. The resist members 20a, 20b, 20c and 20d may be removed at any suitable time, preferably before the etching of the platinum electrode layer 16 and before the heating of the semiconductor substrate 12 to a temperature greater than about 150° C. The same would hold true with respect to the embodiment of the invention illustrated in FIGS. 2, 6 and 8 in that after selective parts of the protective layer 22 have been etched away from the surface of the platinum electrode layer 16 to expose the latter and such that the only remnants of the protective layer 22 are the protective layers 22a, 22b, 22c and 22d situated respectively immediately below the mask layers 18a, 18b, 18c and 18d, the resist members 20a, 20b, 20c and 20d are to be removed. However, with respect to this embodiment of the present invention, the resist members 20a, 20b, 20c and 20d may be removed before the etching away of selective parts of the protective layer 22. Alternatively, the resist members 20a, 20b, 20c and 20d may be removed after (or simultaneously during) the removal of selective parts of the protective layer 22 and before the heating of the semiconductor substrate 12 to a temperature greater than about 150° C. for purposes of etching the platinum electrode layer 16. Typically, at least a portion of the resist members 20a, 20b, 20c and 20d would be removed while selective parts of the protective layer 22 are being etched away to expose the platinum electrode layer 16 that is not superimposed by the protective layers 22a, 22b, 22c and 22d.

The resist members 20a, 20b, 20c and 20d may be removed in any suitable manner such as by using oxygen plasma ashing which is well known to those skilled in the art. The resist members 20a, 20b, 20c and 20d may be respectively stripped from the mask layers 18a, 18b, 18c and 18d with any suitable plasma processing apparatus, such as the plasma processing apparatus shown in FIG. 3 and employing a plasma containing an etchant gas comprising oxygen. The resist members 20a, 20b, 20c and 20d have been respectively removed from the mask layers 18a, 18b, 18c and 18d in an advanced strip passivation (ASP) chamber of a plasma processing apparatus sold under the trade mark metal etch MxP Centura to Applied Materials, Inc. 3050 Bowers Avenue, Santa Clara, Calif. 95054-3299. In stripping the resist members 20a, 20b, 20c and 20d from the mask layers 18a, 18b, 18c and 18d, respectively, the ASP chamber may employ microwave downstream $O_2/N_2$ plasma with the following recipe: 120 seconds, 250° C., 1400 W, 3000 cc $O_2$, 300 cc $N_2$ and 2 Torr.

Figure 7:
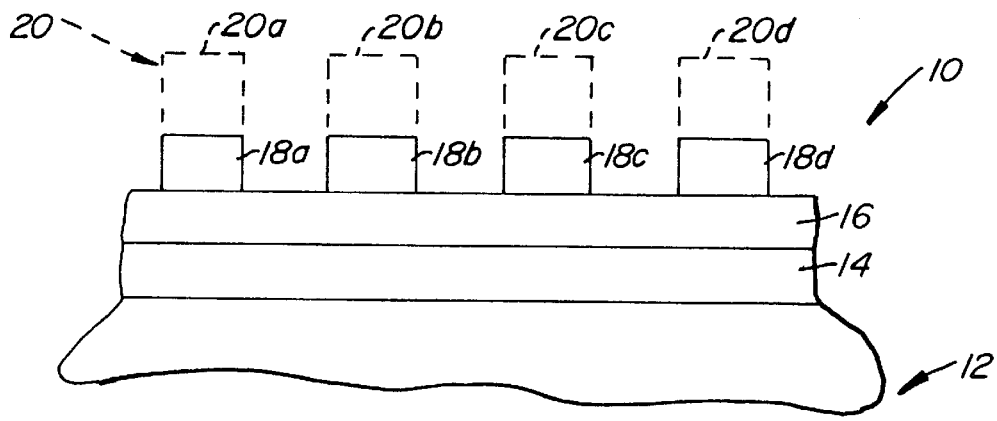
FIG. 7 is a side elevational view of the semiconductor wafer of FIG. 5 after the patterned resist layer has been removed from a portion of the mask layer with the removed patterned resist layer being represented as broken lines.
Figure 8:
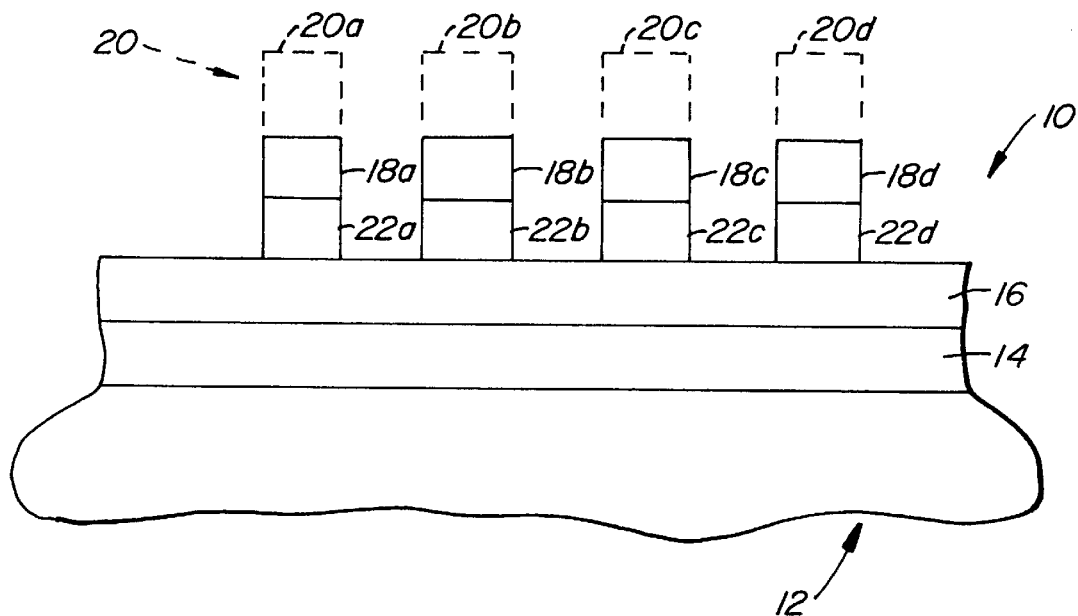
FIG. 8 is a side elevational view of the semiconductor wafer of FIG. 6 after etching and removing a portion of the protective layer off of the surface of the platinum layer, and after removing the patterned resist layer from a portion of the mask layer with the removed patterned resist layer being represented as broken lines.

After the platinum electrode layer 16 has been exposed as represented in FIGS. 7 and 8, it is etched to develop a submicron pattern with a platinum profile. As will be further stated below, before the platinum electrode layer 16 is etched, the semiconductor substrate 12 supporting the plati-num electrode layer 16 is heated to a temperature greater than about 150° C., preferably greater than about 150° C. up to about 500° C., more preferably from about 200° C. to about 400° C., most preferably from about 250° C. to about 350° C. The semiconductor substrate 12 is heated by the pedestal which supports the wafer 10 during the platinum etching process.

The platinum electrode layer 16 may be etched in any suitable plasma processing apparatus, such as in the reactive ion etch (RIE) plasma processing apparatus sold under the trademark AME8100 Etch™, or under the trademark Precision Etch 5000™, or under the trademark Precision Etch 8300™, all trademarks owned by Applied Materials Inc., 3050 Bowers Avenue, Santa Clara, Calif. 95054-3299. Another suitable plasma processing apparatus for etching the platinum electrode layer 16 is that plasma processing apparatus sold under the trademark Metal Etch DPS Centura™ also owned by Applied Materials, Inc. It is also to be understood that other plasma etchers may be employed, such as ECR, ICP, Helicon Resonance, etc.

Figure 26:
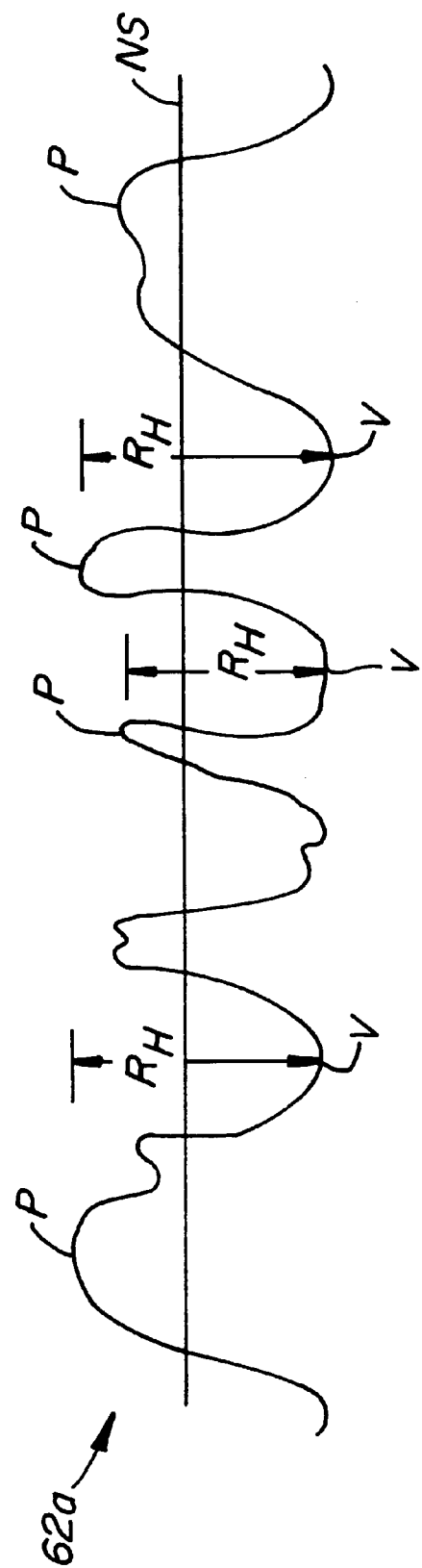
FIG. 26 is a partial side elevational view of a surface finish of a deposit-receiving surface of a dielectric member (i.e. a dielectric window or the dome-shaped dielectric ceiling)

Most of the foregoing suitable plasma processing apparatuses employ a dielectric member. In a preferred embodiment of the present invention and in order to decrease the electrical conductivity of any process-by-product deposits as will be further explained below, the dielectric member has an inside surface which functions as a deposit-receiving surface where platinum by-products form during plasma etching. The inside deposit-receiving surface of the dielectric member includes a surface finish having a peak-to valley roughness height with an average height value of more than about 1000 Å; more preferably, an average height value of more than about 1800 Å, such as ranging from about 1800 Å to about 4000 Å; most preferably, an average height value of more than about 4000 Å, such as ranging from about 4000 Å to about 8000 Å. Roughness may be defined as relatively finely spaced surface irregularities. On surfaces produced by machining and abrading operations, the irregularities produced by the cutting action of tool edges and abrasive grains and by the feed of the machine tool are roughness. Roughness deviations are measured perpendicular to a nominal surface NS (see FIG. 26). As best shown in FIG. 26, roughness height $R_H$ is measured from a peak P to a valley V. As further best shown in FIG. 26, the nominal surface NS is the surface that would result if the peaks P were leveled off to fill the valleys V. For the present invention, the roughness height $R_H$ (sometimes designated in the art as $R_A$) values are average height values resulting from calculating the arithmetical average of all $R_H$ values on a deposit-receiving surface of a dielectric member obtained with a suitable instrument for measuring roughness of a surface. A suitable instrument for measuring an average $R_H$ value on the deposit-receiving surface may be obtained commercially from WYKO Corporation, Tucson, Ariz. under model No. PZ-06-SC-SF, which is a non-contact optical surface profiler that employs phase-shifting interferometry (PSI) modes for measuring smooth surfaces and vertical-scanning interferometry (VSI) modes for measuring rough surfaces and steps. Suitable procedures for calculating an average $R_H$ value on the deposit-receiving surface is described in a technical manual entitled *WYKO Surface Profilers Technical Reference Manual,* published by WYKO Corporation, and fully incorporated herein by reference thereto. A preferred procedure for finishing the deposit-receiving surface to obtain desirable average roughness height values includes bead blasting with 36-grid alumina.

As previously indicated and in accordance with the present invention, wafers 10, such as semiconductor substrates 12, are processed within a plasma processing chamber, preferably such as by plasma etching for patterning integrated circuit (IC) metal interconnect devices. It is to be understood that while plasma etching is one of the preferred plasma processes for the embodiment of the invention employing a dielectric member (or window) including an inside surface (i.e. a deposit-receiving surface) having a surface finish having a peak-to-valley roughness height with an average height value of more than about 1000 Å, the spirit and scope of this embodiment of the invention includes other forms of processing substrates, such as chemical vapor deposition and physical vapor deposition. As further previously indicated, during plasma processing of wafers 10, processing power (e.g. RF power, magnetron power, microwave power, etc.) passes through a dielectric member, which includes a dielectric window of a nonconductive material such as a ceramic dome, etc., and becomes coupled to a plasma of the proceeding gas. If the plasma process is plasma etching, metal etching of metals (e.g. platinum, copper, aluminum, titanium, ruthenium, iridium, etc.) is conducted while being supported by substrates. Also during the plasma process, a deposit of materials occurs on an inside surface of the dielectric member, as disclosed in copending patent application Ser. No. 08/920,283, filed Aug. 26, 1997, and fully incorporated herein by reference thereto. The deposit is located between the plasma and the power source.

If the plasma process for this embodiment of the present invention is plasma etching, the deposit results from etching a metal layer on the substrate; and, thus, the deposit could be electrically conductive, and includes, by way of example only, metal, metal oxide(s), metal nitride(s), etc. The metal corresponds to the metal which is being etched within the process chamber and includes, also by way of example only, platinum, copper, aluminum, titanium, ruthenium, iridium, etc. When the deposit is electrically conductive and is between the plasma and the power source, a decay in processing power transmission occurs and continues until the electrically conductive deposit reaches a certain thickness (i.e. skin depth), such as from about 0.001 in. to about 0.5 in., whereafter the processing power transmission becomes very low or even nil. The deposit, therefore, behaves as a Faraday shield to reduce the efficiency of processing power transmission into the plasma of the processing gas within the process chamber. When processing power transmission through the dielectric member and into the process chamber commences to decline, the processing (e.g. the etch rate) of the metal layer supported by the substrate starts to decline. In order to maintain a generally more stable processing power transmission through the dielectric member and into the process chamber, and thus maintain and/or extend the time for stable processing of metal layers (e.g. the etch rate on metal layers) supported by substrates, the inside deposit-receiving surface of the dielectric member includes, as was more specifically discussed above, a surface finish having a peak-to-valley roughness height with an average height value of more than about 1000 Å. By employing such a surface finish on the dielectric member or ceiling, a larger surface area is provided for receiving the by-products from the plasma process, which would decrease the thickness or skin depth of a given volume of by-products. For any given volume of by-product deposits, the smaller the surface area supporting the by-product deposits, the thicker or greater is the skin depth, and vice versa. As the thickness or skin depth of a given volume of by-products from the plasma process increases, the more electrically conductive the by-product deposits become.

A suitable plasma processing apparatus for etching the platinum electrode layer 16 employs a plasma of an etchant gas, which is capable of producing good platinum profiles (e.g. platinum profiles equal to or greater than about 85 degrees, preferably equal to or greater than about 87 degrees, more preferably equal to or greater than about 88.5 degrees). The etchant gas broadly comprises a halogen containing gas, such as a halogen gas (e.g., fluorine, chlorine, bromine, iodine, and astatine) and a noble gas such as helium, neon, argon, krypton, xenon, and radon. Preferably, the etchant gas comprises or consists of or consists essentially of a halogen (preferably chlorine) and a noble gas selected from the group consisting of helium, neon, and argon. The noble gas is preferably argon. The etchant gas more specifically comprises preferably from about 20% by volume to about 95% by volume of the halogen gas (i.e., chlorine) and from about 5% by volume to about 80% by volume of the noble gas (i.e., argon); more preferably from about 40% by volume to about 80% by volume of the halogen gas (i.e., chlorine) and from about 20% by volume to about 60% by volume of the noble gas (i.e., argon); most preferably from about 55% by volume to about 65% by volume of the halogen gas (i.e., chlorine) and from about 35% by volume to about 45% by volume of the noble gas (i.e., argon).

In another preferred embodiment of the invention, the etchant gas comprises, preferably consists of or consists essentially of, the halogen (i.e., chlorine), the noble gas (i.e., argon), and a gas selected from the group consisting of HBr, $BCl_3$ and mixtures thereof. The etchant gas more specifically comprises, or consists of or consists essentially of, from about 10% by volume to about 90% by volume of the halogen gas (i.e., chlorine) and from about 5% by volume to about 80% by volume of the noble gas (i.e., argon) and from about 4% by volume to about 25% by volume of HBr and/or $BCl_3$; preferably from about 40% by volume to about 70% by volume of the halogen gas (i.e., chlorine) and from about 25% by volume to about 55% by volume of the noble gas (i.e., argon) and from about 5% by volume to about 20% by volume of HBr and/or $BCl_3$; and more preferably from about 50% by volume to about 60% by volume of the halogen gas (i.e., chlorine) and from about 35% by volume to about 45% by volume of the noble gas (i.e., argon) and from about 5% by volume to about 15% by volume of HBr and/or $BCl_3$. The etchant gas flow rate ranges from about 50 sccm to about 500 sccm. HBr and/or $BCl_3$ are for removal of platinum residue during etching of the platinum electrode layer 16. Plasmas containing argon are known to have a high energetic ion concentration and are often used for physical sputtering. The sputtering effect due to the ions is a function of the accelerating potential which exist between the plasma and the sample.

In also another preferred embodiment of the invention, the etchant gas broadly comprises nitrogen, a halogen (e.g., fluorine, chlorine, bromine, iodine, and astatine) and a noble gas such as helium, neon, argon, krypton, xenon, and radon. Preferably, the etchant gas comprises or consists of or consists essentially of nitrogen, a halogen (preferably chlorine) and a noble gas selected from group consisting of helium, neon, and argon. The noble gas is preferably argon. The etchant gas more specifically comprises, or consists of or consists essentially of, preferably from about 0.1% by volume to about 60% by volume nitrogen, from about 40% by volume to about 90% by volume of the halogen gas (i.e., chlorine), and from about 0.1% by volume to about 40% by volume of the noble gas (i.e., argon); more preferably from about 5% by volume to about 40% by volume nitrogen, from about 50% by volume to about 80% by volume of the halogen gas (i.e., chlorine), and from about 5% by volume to about 30% by volume of the noble gas (i.e., argon); most preferably from about 10% by volume to about 30% by volume nitrogen, from about 60% by volume to about 70% by volume of the halogen gas (i.e., chlorine), and from about 10% by volume to about 20% by volume of the noble gas (i.e., argon). For this embodiment of the invention, the plasma of the etchant gas may be a high density plasma or a low-density plasma having a density of less than about $10^{11}/cm^3$, preferably less than about $10^9/cm^3$.

In yet another preferred embodiment of the invention, the etchant gas comprises, preferably consists of or consists essentially of, nitrogen, the halogen (i.e., chlorine), the noble gas (i.e., argon), and a gas selected from the group consisting of HBr, $BCl_3$, $SiCl_4$, and mixtures thereof. The etchant gas more specifically comprises, or consists of or consists essentially of, from about 0.1% by volume to about 60% by volume nitrogen, from about 40% by volume to about 90% by volume of the halogen gas (i.e., chlorine), and from about 0.1% by volume to about 40% by volume of the noble gas (i.e., argon), and from about 1% by volume to about 30% by volume of HBr and/or $BCl_3$ and/or $SiCl_4$; preferably from about 5% by volume to about 40% by volume nitrogen, from about 50% by volume to about 80% by volume of the halogen gas (i.e., chlorine), and from about 5% by volume to about 30% by volume of the noble gas (i.e., argon), and from about 5% by volume to about 20% by volume of HBr and/or $BCl_3$ and/or $SiCl_4$; and more preferably from about 10% by volume to about 30% by volume nitrogen, from about 60% by volume to about 70% by volume of the halogen gas (i.e., chlorine), and from about 10% by volume to about 20% by volume of the noble gas (i.e., argon), and from about 1% by volume to about 10% by volume of HBr and/or $BCl_3$ and/or $SiCl_4$. For this embodiment of the invention, the plasma of the etchant gas may be a high density plasma or a low density plasma having a density of less than about $10^{11}/cm^3$, preferably less than about $10^9/cm^3$.

Alternatively, the etchant gas comprises or consists of or consists essentially of nitrogen and a halogen (preferably chlorine). The etchant gas more specifically comprises, or consists of or consists essentially of, preferably from about 10% by volume to about 90% by volume nitrogen and from about 10% by volume to about 90% by volume of the halogen gas (i.e., chlorine); more preferably from about 20% by volume to about 60% by volume nitrogen and from about 40% by volume to about 80% by volume of the halogen gas (i.e., chlorine); most preferably from about 30% by volume to about 40% by volume nitrogen, and from about 60% by volume to about 70% by volume of the halogen gas (i.e., chlorine). For this embodiment of the invention, the plasma of the etchant gas may be a high density plasma or a low-density plasma having a density of less than about $10^{11}/cm^3$, preferably less than about $10^9/cm^3$.

The reactor conditions for a suitable plasma processing apparatus, such as the plasma processing apparatus of FIG. 3, in etching the platinum electrode layer 16 are as follows:

| | |
|---|---|
| Pressure | 0.1–300 mTorr |
| RF Power | 100–5000 watts |
| RF Frequency | 100K–300 MHz |
| Rotational Magnetic Field | 20–100 Gauss |
| Temperature of Wafer | about 150–about 500° C. |
| Platinum Layer 16 Etch Rate | 200–6000 Angstroms/min |

The selectivity of platinum electrode layer 16 to mask 18 is better 1:1, more preferably better than 2:1, depending on the materials employed for the mask layer 18.

More generally, the process parameters for etching the platinum electrode 16 in a suitable plasma processing apparatus, such as the plasma processing apparatus of FIG. 3, fall into ranges as listed in the following Table IV and based on the flow rate of etchant gas as also listed in Table IV below:

TABLE IV

| Process | Broad | Preferred | Optimum |
|---|---|---|---|
| Gas Flow, sccm | | | |
| Etchant Gas | 35 to 900 | 75 to 350 | 100 to 200 |
| Pressure, mT | 20 to 2000 | 30 to 300 | 50 to 150 |
| 13.56 MHz | | | |
| RF Power (Watts) | 50 to 3000 | 500 to 2000 | 700 to 1200 |
| Temperature (° C.) of Wafer | 150 to 500 | 200 to 400 | 250 to 350 |
| Magnetic Field Gauss | 0 to 140 | 20 to 100 | 60 to 80 |

Figure 9:
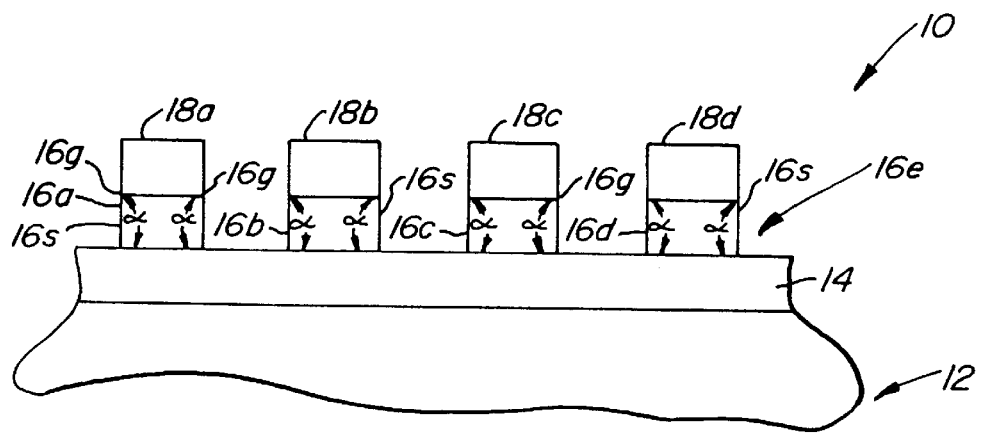
FIG. 9 is a side elevational view of the semiconductor wafer of FIG. 7 after the platinum electrode layer has been etched to produce an etched platinum electrode layer.
Figure 10:
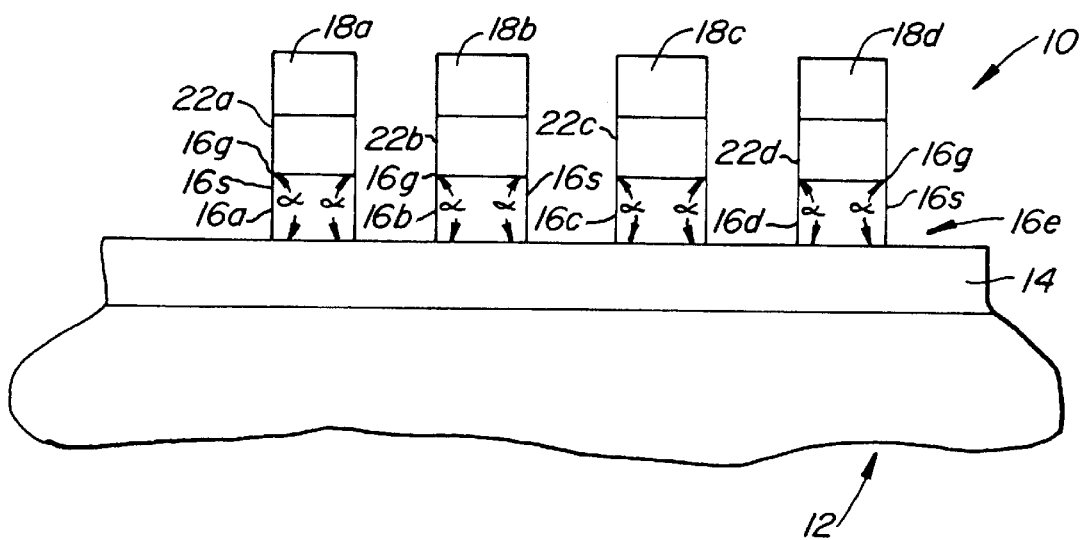
FIG. 10 is a side elevational view of the semiconductor wafer of FIG. 8 after the platinum electrode layer has been etched to produce an etched platinum electrode layer.

As previously indicated for one preferred embodiment of the present invention, a more preferred etchant gas for etching the platinum electrode layer 16 is a mixture of chlorine and argon, or a mixture of chlorine, argon and HBr and/or $BCl_3$. If the etchant gas is a mixture of chlorine and argon (i.e., from about 20% by volume to about 95% by volume chlorine and from about 5% by volume to about 80% by volume argon), or a mixture of chlorine, argon and HBr and/or $BCl_3$ (i.e., from about 10% by volume to about 90% by volume chlorine and from about 5% by volume to about 80% by volume argon and from about 4% by volume to about 25% by volume HBr and/or $BCl_3$), and if the semiconductor substrate 12 is heated to a temperature greater than about 150° C., preferably to a temperature ranging from about 150° C. to about 500° C., the plasma processing apparatus for etching the platinum electrode layer 16 etches the platinum electrode layer 16 in a high density plasma of the etchant gas at a high platinum etch rate (i.e. an etch rate higher than 1000 Å/min) and produces an etched platinum electrode layer, generally illustrated as 16e (as best shown in FIGS. 9 and 10). The etched platinum electrode layer 16e includes etched platinum electrode layers 16a, 16b, 16c and 16d having corners 16g and sidewalls 16s and an excellent platinum profile; that is, a platinum profile where the angle of the sidewalls 16s (as also best shown in FIGS. 9 and 10) with respect to a horizontal plane is equal to or greater than about 80 degrees, such as equal to or greater than about 85 degrees, preferably equal to or greater than about 87°, and more preferably equal to or greater than about 88.5°. The platinum electrodes are separated by a distance or space having a dimension equal to or less than about 0.35 μm, preferably equal to or less than about 0.3 μm. Each of the platinum electrodes includes a dimension having a value equal to or less than about 1.0 μm, preferably equal to or less than about 0.6 μm, preferably equal to or less than about 0.35 μm, preferably equal to or less than about 0.3 μm. More preferably, each of the platinum electrodes has a width equal to or less than about 1.0 μm, preferably equal to or less than about 0.6 μm, and a height equal to or less than about 0.6 μm.

It has also been discovered that the etched platinum electrode layer 16e (i.e., etched platinum electrode layers 16a, 16b, 16c and 16d) has essentially no wall-like structures extending up from the edges of the platinum region. These wall-like structures are frequently referred to as "veils" or "fences" or "rabbit ears." Therefore, the method of the present invention produces etched platinum electrode layers 16a, 16b, 16c and 16d which are essentially veil-less.

Because the produced etched platinum electrode layers 16*a*, 16*b*, 16*c* and 16*d* are essentially veil-less and have no "fences" or "rabbit ears," they are ideally suited for receiving a dielectric BST or PZT or SBT layer and functioning as electrodes in a semiconductor device (i.e., a capacitance structure).

The high density plasma of the present invention may be defined as a plasma of the etchant gas of the present invention having an ion density greater than about $10^9/cm^3$, preferably greater than about $10^{11}/cm^3$. The source of the high density plasma may be any suitable high density source, such as electron cyclotron resonance (ECR), helicon resonance or inductively coupled plasma (ICP)-type sources. All three are in use on production equipment today. The main difference is that ECR and helicon sources employ an external magnetic field to shape and contain the plasma, while ICP sources do not.

The high density plasma for the present invention is more preferably produced or provided by inductively coupling a plasma in a decoupled plasma source etch chamber, such as that sold under the trademark DPS™ owned by Applied Materials, Inc. which decouples or separates the ion flux to the wafer 10 and the ion acceleration energy. The design of the etch chamber provides fully independent control of ion density of an enlarged process window. This is accomplished by producing plasma via an inductive source. While a cathode within the etch chamber is still biased with rf electric fields to determine the ion acceleration energy, a second rf source (i.e. an inductive source) determines the ion flux. This second rf source is not capacitive (i.e. it does not use electric fields like the cathode) since a large sheath voltage would be produced, interfering with the cathode bias and effectively coupling the ion energy and ion flux.

The inductive plasma source couples rf power through a dielectric window rather than an electrode. The power is coupled via rf magnetic fields (not electric fields) from rf current in a coil. These rf magnetic fields penetrate into the plasma and induce rf electric fields (therefore the term "inductive source") which ionize and sustain the plasma. The induced electric fields do not produce large sheath voltages like a capacitive electrode and therefore the inductive source predominantly influences ion flux. The cathode bias power plays little part in determining ion flux since most of the rf power (typically an order of magnitude less than the source power) is used in accelerating ions. The combination of an inductive plasma source and a capacitive wafer bias allows independent control of the ion flux and ion energy reaching the wafer 10 in the etch chamber, such as the DPS™ brand etch chamber.

Figure 17:
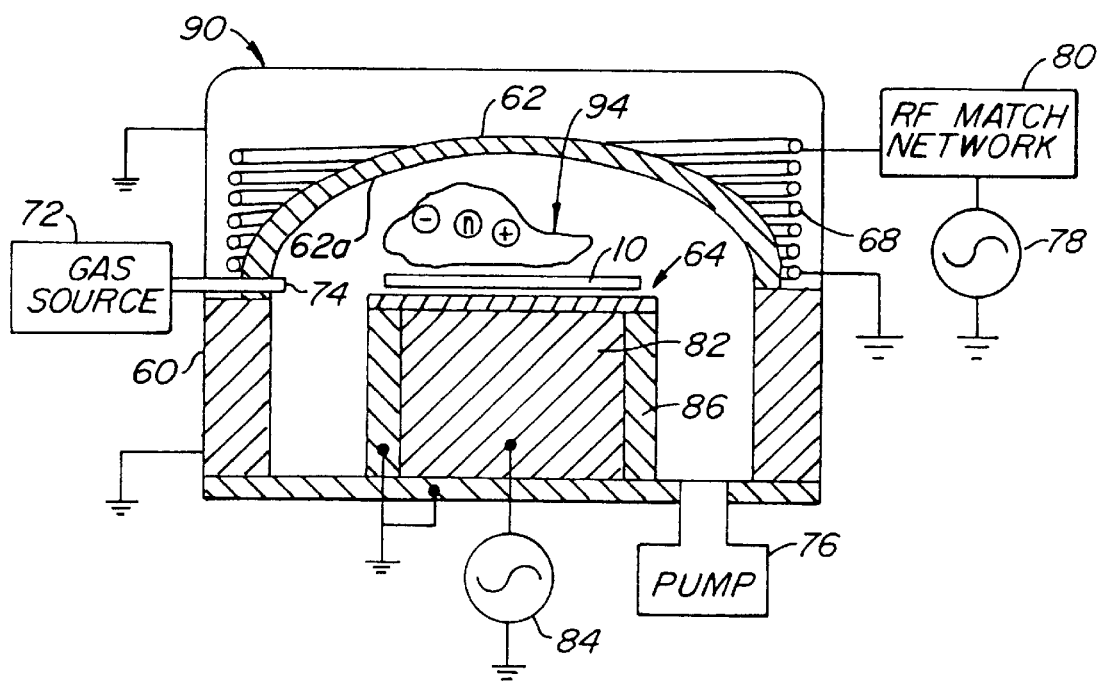
FIG. 17 is a simplified cut-away view of an inductively coupled RF plasma reactor which may be employed in etching the platinum electrode layer to produce a semiconductor device.
Figure 18:
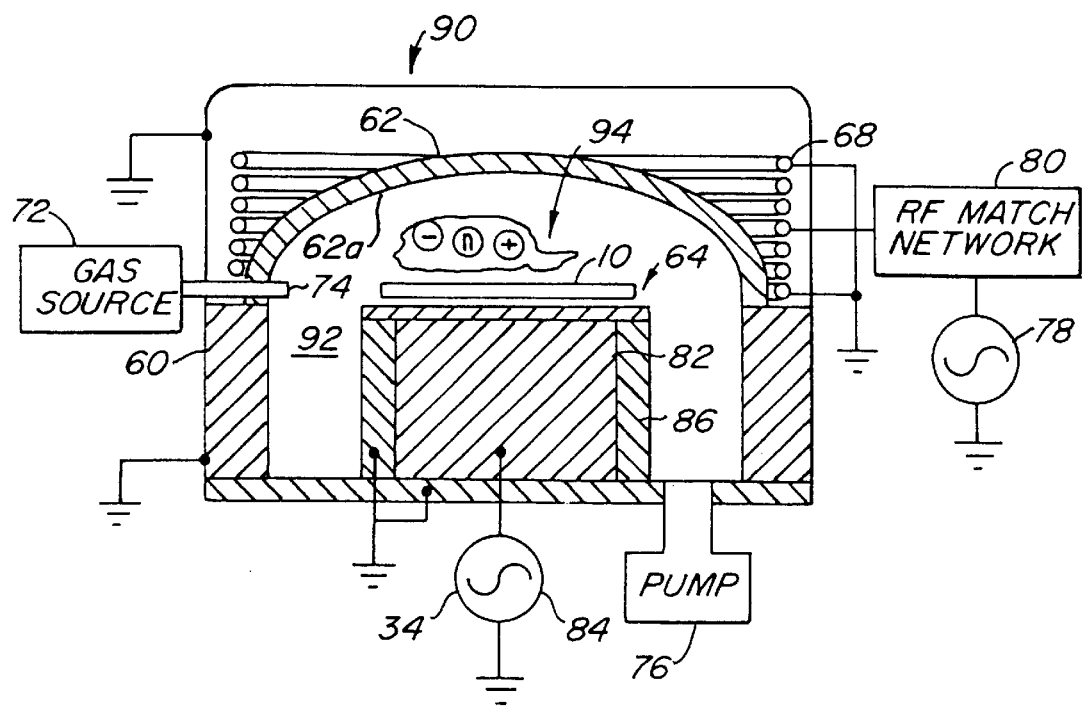
FIG. 18 is a simplified cut-away view of another inductively coupled RF plasma reactor which may be employed in etching the platinum electrode layer to produce a semiconductor device.

DPS™ brand etch chambers for producing the high density plasma of the present invention for etching the platinum electrode layer 16 to produce the etched platinum electrode layers 16*a*, 16*b*, 16*c* and 16*d* may be any of the DPS™ brand etch chambers of the inductively coupled plasma reactor disclosed in U.S. Pat. No. 5,753,044, issued May 19, 1998, entitled "RF PLASMA REACTOR WITH HYBRID CONDUCTOR AND MULTI-RADIUS DOME CEILING" and assigned to the present assignee and fully incorporated herein by reference thereto as if repeated verbatim immediately hereinafter. Referring now to FIGS. 17 and 18 for two (2) embodiments of an inductively coupled plasma reactor from U.S. Pat. No. 5,753,044 there is seen an inductively coupled RF plasma reactor generally illustrated as 90, having a reactor chamber, generally illustrated as 92, wherein a high density plasma 94 of neutral (n) particles, positive (+) particles, and negative (−) particles are found. The reactor chamber 92 has a grounded conductive cylindrical sidewall 60 and a dielectric ceiling 62 having an inside concave surface 62*a* which would receive deposits of by-products from plasma processing of wafers 10. The inductively coupled RF plasma reactor 90 further comprises a wafer pedestal 64 for supporting the (semiconductor) wafer 10 in the center of the chamber 92, a cylindrical inductor coil 68 surrounding an upper portion of the chamber 92 beginning near the plane of the top of the wafer 10 or wafer pedestal 64 and extending upwardly therefrom toward the top of the chamber 92, an etching gas source 72 and gas inlet 74 for furnishing an etching gas into the interior of the chamber 92, and a pump 76 for controlling the pressure in the chamber 92. The coil inductor 68 is energized by a plasma source power supply or RF generator 78 through a conventional active RF match network 80, the top winding of the coil inductor 68 being "hot" and the bottom winding being grounded. The wafer pedestal 64 includes an interior conductive portion 82 connected to the bias RF power supply or generator 84 and an exterior grounded conductor 86 (insulated from the interior conductive portion 82). Thus, the plasma source power applied to the coil inductor 68 by the RF generator 78 and the DC bias RF power applied to the wafer pedestal 64 by generator 84 are separately controlled RF supplies. Separating the bias and source power supplies facilitates independent control of ion density and ion energy, in accordance with well-known techniques. To produce high density plasma 94 as an inductively coupled plasma, the coil inductor 68 is adjacent to the chamber 92 and is connected to the RF source power supply or the RF generator 78. The coil inductor 68 provides the RF power which ignites and sustains the high ion density of the high density plasma 94. The geometry of the coil inductor 68 can in large part determine spatial distribution of the plasma ion density of the high density plasma 94 within the reactor chamber 92.

Uniformity of the plasma density spatial distribution of the high density plasma 94 across the wafer 10 is improved (relative to conical or hemispherical ceilings) by shaping the ceiling 62 in a multi-radius dome and individually determining or adjusting each one of the multiple radii of the ceiling 62. The multiple-radius dome shape in the particular embodiment of FIG. 17 somewhat flattens the curvature of the ceiling 62 around the center portion of the ceiling 62, the peripheral portion of the ceiling 62 having a steeper curvature.

As illustrated in FIG. 18 the coil inductor 68 may be coupled to the RF power source 78, 80 in a mirror coil configuration that is known to those skilled in the art. In the mirror coil configuration of FIG. 18, the RF source 78, 80 is connected to the center winding of the coil inductor 68 while the top and bottom ends of the coil inductor 68 are both grounded. The mirror coil configuration has the advantage of reducing the maximum potential on the coil inductor 68.

It has been discovered that by employing a high density plasma, such as the high density plasma 94 illustrated in FIGS. 17 and 18, for etching the platinum electrode layer 16, and by heating the semiconductor substrate 12 to a temperature greater than about 150° C. before conducting the etching operation under process parameters which are stated below, a semiconductor device is produced with platinum electrodes having a platinum profile with an angular value which is equal to or greater than about 85 degrees, more preferably equal to or greater than about 87 degrees, most preferably equal to or greater than about 88.5 degrees. The platinum electrodes are essentially veil-less; that is, they have no "fences" or "rabbit ears." The platinum electrodes are preferably separated by a distance or space having a dimension equal to or less than about 0.35 µm, preferably equal to or less than about 0.3 μm. Each of the platinum electrodes includes a dimension having a value equal to or less than about 1.0 μm, preferably equal to or less than about 0.6 μm, preferably equal to or less than about 0.35 μm, preferably equal to or less than about 0.3 μm. More preferably, each of the platinum electrodes has a width equal to or less than about 0.35 μm, preferably equal to or less than about 0.3 μm, a length equal to or less than about 1.0 μm, preferably equal to or less than about 0.6 μm, and a height equal to or less than about 0.6 μm.

The preferred reactor conditions for a suitable inductively coupled RF plasma reactor, such as the inductively coupled RF plasma reactor 90 in FIGS. 17 and 18, in etching the platinum electrode layer 16 are as follows:

| | |
|---|---|
| Pressure | 0.1 to 300 mTorr |
| RF Power to Coil Inductor | 100 to 5000 watts |
| RF Power to Wafer Pedestal | 50 to 3000 watts |
| RF Frequency in Coil Inductor | 100K to 300 MHz |
| RF Frequency in Wafer Pedestal | 100K to 300 MHz |
| Temperature of Wafer | 150 to 500° C. |
| Platinum Etch Rate | 200 to 6000 Angstrom/min |

More generally, the process parameters for etching the platinum electrode layer 16 in a suitable inductively coupled plasma reactor, such as the inductively coupled plasma reactor 90 in FIGS. 17 and 18, fall into ranges as listed on the basis of flow rates of the gases, including the halogen gas(es) (i.e., $Cl_2$) and the noble gas(es) (i.e., argon), as listed in Table V below.

TABLE V

| Process | Broad | Preferred | Optimum |
|---|---|---|---|
| Gas Flow, sccm | | | |
| $Cl_2$ | 30 to 400 | 50 to 250 | 60 to 150 |
| Ar | 20 to 300 | 30 to 200 | 40 to 100 |
| Pressure, mT | 0.1 to 300 | 10 to 100 | 10 to 40 |
| RF Power of Coil Inductor (Watts) | 100 to 5000 | 650 to 2000 | 900 to 1500 |
| RF Power of Wafer Pedestal (Watts) | 50 to 3000 | 100 to 1000 | 150 to 400 |
| Temperature of Wafer (° C.) | about 150 to about 500 | 200 to 400 | 250 to 350 |
| Platinum Etch Rate (Å/min) | 200 to 6000 | 500 to 3000 | 1000 to 2000 |
| RF Frequency of Coil Inductor | 100K to 300 MHz | 400K to 20 MHz | 2 to 13.5 MHz |
| RF Frequency of Wafer Pedestal | 100K to 300 MHz | 400K to 20 MHz | 400K to 13.5 MHz |

Also more generally, and when the etchant gases are a mixture of the halogen gas(es) (i.e., chlorine), the noble gas(es) (i.e., argon), and HBr and/or $BCl_3$, the process parameters for etching the platinum electrode layer 16 in a suitable inductively coupled plasma reactor, such as the inductively coupled plasma reactor 90 in FIGS. 17 and 18, fall into the ranges as listed on the basis of flow rates of the gases, including the halogen gas(es) (i.e., $Cl_2$) and the noble gas(es) (i.e., Ar) and HBr and/or $BCl_3$, as listed in Table VI below:

TABLE VI

| Process | Broad | Preferred | Optimum |
|---|---|---|---|
| Gas Flow, sccm | | | |
| $Cl_2$ | 30 to 400 | 50 to 250 | 60 to 150 |
| Ar | 20 to 300 | 30 to 200 | 40 to 100 |
| HBr and/or $BCl_3$ | 5 to 70 | 5 to 40 | 5 to 20 |
| Pressure, mT | 0.1 to 300 | 10 to 100 | 10 to 40 |
| RF Power of Coil Inductor (Watts) | 100 to 5000 | 650 to 2000 | 750 to 1000 |
| RF Power of Wafer Pedestal (Watts) | 50 to 3000 | 100 to 1000 | 150 to 400 |
| Temperature of Wafer (° C.) | about 150 to about 500 | 200 to 400 | 250 to 350 |
| Platinum Etch Rate (Å/min) | 200 to 6000 | 500 to 3000 | 1000 to 2000 |
| RF Frequency of Coil Inductor | 100K to 300 MHz | 400K to 20 MHz | 2 to 13.5 MHz |
| RF Frequency of Wafer Pedestal | 100K to 300 MHz | 400K to 20 MHz | 400K to 13.5 MHz |

Therefore, the foregoing process conditions are preferably based on flow rates of etchant gas(es) having a flow rate value ranging from about 50 to about 500 sccm. It will be appreciated by those skilled in the art that the process parameters of Tables V and VI, as well as other process parameters described herein, may vary in accordance with the size of the wafer 10. As was previously mentioned, the etchant gas comprises or consists of or consists essentially of a halogen (preferably chlorine) and a noble gas selected from the group consisting of helium, neon, and argon. The noble gas is preferably argon. As was also previously mentioned, the etchant gas more specifically comprises or consists of or consists essentially of from about 20% by volume to about 95% by volume of the halogen gas (i.e., chlorine) and from about 5% by volume to about 80% by volume of the noble gas (i.e., argon); preferably from about 40% by volume to about 80% by volume of the halogen gas (i.e., chlorine) and from about 20% by volume to about 60% by volume of the noble gas (i.e., argon); more preferably from about 55% by volume to about 65% by volume of the halogen gas (i.e., chlorine) and from about 35% by volume to about 45% by volume of the noble gas (i.e., argon). In another preferred embodiment of the invention and as was previously mentioned, the etchant gas comprises, preferably consists of or consists essentially of, the halogen (i.e., chlorine), the noble gas (i.e., argon), and a gas selected from the group consists of HBr, $BCl_3$ and mixtures thereof. The etchant gas more specifically comprises, or consists of or consists essentially of from about 10% by volume to about 90% by volume of the halogen gas (i.e., chlorine) and from about 5% by volume to about 80% by volume of the noble gas (i.e., argon) and from about 4% by volume to about 25% by volume of Br and/or $BCl_3$; preferably from about 40% by volume to about 70% by volume of the halogen gas (i.e., chlorine) and from about 25% by volume to about 55% by volume of the noble gas (i.e., argon) and from about 5% by volume to about 20% by volume of HBr and/or $BCl_3$; and more preferably from about 50% by volume to about 60% by volume of the halogen gas (i.e., chlorine) and from about 35% by volume to about 45% by volume of the noble gas (i.e., argon) and from about 5% by volume to about 15% by volume of HBr and/or $BCl_3$. Thus, the foregoing process conditions stated in Tables V and VI may be based on such etchant gas constituency and on such percent (%) by volume value(s).

More generally further, the process parameters for etching in a low density (or high density) plasma the platinum electrode layer 16 in a suitable inductively coupled plasma reactor fall into ranges as listed on the basis of flow rates of the gases, including nitrogen ($N_2$), the halogen gas(es) (i.e., $Cl_2$), and the noble gas(es) (i.e., argon), as listed in Table VII below.

TABLE VII

| Process | Broad | Preferred | Optimum |
|---|---|---|---|
| Gas Flow, sccm | | | |
| $N_2$ | 5 to 200 | 10 to 150 | 10 to 50 |
| $Cl_2$ | 30 to 400 | 50 to 300 | 100 to 200 |
| Ar | 0 to 200 | 10 to 100 | 10 to 50 |
| Pressure, mT | 0.1 to 300 | 10 to 100 | 10 to 50 |
| RF Power of Coil Inductor (Watts) | 100 to 5000 | 500 to 3000 | 750 to 1500 |
| RF Power of Wafer Pedestal (Watts) | 50 to 3000 | 100 to 1000 | 150 to 400 |
| Temperature of Wafer (° C.) | about 150 to about 500 | 200 to 400 | 250 to 350 |
| Platinum Etch Rate (Å/min) | 200 to 6000 | 500 to 3000 | 1000 to 2000 |
| RF Frequency of Coil Inductor | 100K to 300 MHz | 400K to 20 MHz | 2 to 13.5 MHz |
| RF Frequency of Wafer Pedestal | 100K to 300 MHz | 400K to 20 MHz | 400K to 13.5 MHz |

If a reactive ion etch (RIE) plasma processing apparatus is employed for etching the platinum electrode layer 16 in a low density plasma of the etchant gas(es), the process parameters for etching fall into ranges as listed on the basis of flow rates of the gases, including nitrogen ($N_2$), the halogen gas(es) (i.e., $Cl_2$), and the noble gas(es) (i.e., argon), as listed in Table VIII below.

TABLE VIII

| Process | Broad | Preferred | Optimum |
|---|---|---|---|
| Gas Flow, sccm | | | |
| $N_2$ | 5 to 200 | 30 to 200 | 60 to 120 |
| $Cl_2$ | 30 to 400 | 50 to 300 | 100 to 200 |
| Ar | 0 to 200 | 10 to 100 | 10 to 50 |
| Pressure, mT | 0.1 to 2000 | 50 to 400 | 100 to 200 |
| RF Power of Wafer Pedestal (Watts) | 100 to 5000 | 300 to 2500 | 500 to 1200 |
| Temperature of Wafer (° C.) | about 150 to about 500 | 200 to 400 | 250 to 350 |
| Platinum Etch Rate (Å/min) | 200 to 6000 | 500 to 3000 | 1000 to 2000 |
| RF Frequency of Wafer Pedestal | 100K to 300 MHz | 400K to 20 MHz | 400K to 13.5 MHz |

Alternatively, if a reactive ion etch (RIE) plasma processing apparatus is employed for etching the platinum electrode layer 16 in a low density plasma of the etchant gas(es), the process parameters for etching fall into ranges as listed on the basis of flow rates of the gases, including nitrogen ($N_2$) and the halogen gas(es) (i.e., $Cl_2$), as listed in Table IX below.

TABLE IX

| Process | Broad | Preferred | Optimum |
|---|---|---|---|
| Gas Flow, sccm | | | |
| $N_2$ | 5 to 300 | 40 to 200 | 70 to 90 |
| $Cl_2$ | 30 to 600 | 100 to 400 | 150 to 200 |

TABLE IX-continued

| Process | Broad | Preferred | Optimum |
|---|---|---|---|
| Pressure, mT | 0.1 to 2000 | 50 to 400 | 100 to 200 |
| RF Power of Wafer Pedestal (Watts) | 100 to 5000 | 300 to 2500 | 500 to 1200 |
| Temperature of Wafer (° C.) | about 150 to about 500 | 200 to 400 | 250 to 350 |
| Platinum Etch Rate (Å/min) | 200 to 6000 | 500 to 3000 | 1000 to 2000 |
| RF Frequency of Wafer Pedestal | 100K to 300 MHz | 400K to 20 MHz | 400K to 13.5 MHz |

Also more generally further, and when the etchant gases are a mixture of nitrogen ($N_2$), the halogen gas(es) (i.e., chlorine), the noble gas(es) (i.e., argon), and HBr and/or $BCl_3$ and/or $SiCl_4$, the process parameters for etching in a low density (or high density) plasma the platinum electrode layer 16 in a suitable inductively coupled plasma reactor fall into the ranges as listed on the basis of flow rates of the gases, including nitrogen ($N_2$), the halogen gas(es) (i.e., $Cl_2$), the noble gas(es) (i.e., Ar), and HBr and/or $BCl_3$ and/or $SiCl_4$, as listed in Table X below:

TABLE X

| Process | Broad | Preferred | Optimum |
|---|---|---|---|
| Gas Flow, sccm | | | |
| $N_2$ | 5 to 200 | 10 to 150 | 10 to 50 |
| $Cl_2$ | 30 to 400 | 50 to 300 | 100 to 200 |
| Ar | 0 to 200 | 10 to 100 | 10 to 50 |
| HBr and/or $BCl_3$ and/or $SiCl_4$ | 1 to 70 | 5 to 40 | 5 to 20 |
| Pressure, mT | 0.1 to 300 | 10 to 100 | 10 to 50 |
| RF Power of Coil Inductor (Watts) | 100 to 5000 | 500 to 3000 | 750 to 1500 |
| RF Power of Wafer Pedestal (Watts) | 50 to 3000 | 100 to 1000 | 150 to 400 |
| Temperature of Wafer (° C.) | about 150 to about 500 | 200 to 400 | 250 to 350 |
| Platinum Etch Rate (Å/min) | 200 to 6000 | 500 to 3000 | 1000 to 2000 |
| RF Frequency of Coil Inductor | 100K to 300 MHz | 400K to 20 MHz | 2 to 13.5 MHz |
| RF Frequency of Wafer Pedestal | 100K to 300 MHz | 400K to 20 MHz | 400K to 13.5 MHz |

If a reactive ion etch (RIE) plasma processing apparatus is employed for etching the platinum electrode layer 16 in a low density plasma of the etchant gas(es), the process parameters for etching fall into ranges as listed on the basis of flow rates of the gases, including nitrogen ($N_2$), the halogen gas(es) (i.e., $Cl_2$), and the noble gas(es) (i.e., Ar), and HBr and/or $BCl_3$ and/or $SiCl_4$, as listed in Table XI below:

TABLE XI

| Process | Broad | Preferred | Optimum |
|---|---|---|---|
| Gas Flow, sccm | | | |
| $N_2$ | 5 to 300 | 30 to 200 | 60 to 120 |
| $Cl_2$ | 30 to 400 | 50 to 300 | 100 to 200 |
| Ar | 0 to 200 | 10 to 100 | 10 to 50 |
| HBr and/or $BCl_3$ and/or $SiCl_4$ | 1 to 70 | 5 to 40 | 5 to 20 |
| Pressure, mT | 0.1 to 2000 | 50 to 400 | 100 to 200 |
| RF Power of Wafer Pedestal (Watts) | 100 to 5000 | 300 to 2500 | 500 to 1200 |
| Temperature of | about 150 to | 200 to 400 | 250 to 350 |

TABLE XI-continued

| Process | Broad | Preferred | Optimum |
|---|---|---|---|
| Wafer (C°) | about 500 | | |
| Platinum Etch Rate (Å/min) | 200 to 6000 | 500 to 3000 | 1000 to 2000 |
| RF Frequency of Wafer Pedestal | 100K to 300 MHz | 400K to 20 MHz | 400K to 13.5 MHz |

Therefore, for this preferred embodiment of the present invention, the foregoing process conditions are preferably based on flow rates of etchant gas(es) having a flow rate value ranging from about 5 to about 500 sccm. As was previously mentioned, the etchant gas comprises or consists of or consists essentially of nitrogen, a halogen (preferably chlorine) and a noble gas selected from the group consisting of helium, neon, and argon. The noble gas is preferably argon. As was also previously mentioned, the etchant gas more specifically comprises, or consists of or consists essentially of, preferably from about 0.1% by volume to about 60% by volume nitrogen, from about 40% by volume to about 90% by volume of the halogen gas (i.e., chlorine), and from about 0.1% by volume to about 40% by volume of the noble gas (i.e., argon); more preferably from about 5% by volume to about 40% by volume nitrogen, from about 50% by volume to about 80% by volume of the halogen gas (i.e., chlorine), and from about 5% by volume to about 30% by volume of the noble gas (i.e., argon); most preferably from about 10% by volume to about 30% by volume nitrogen, from about 60% by volume to about 70% by volume of the halogen gas (i.e., chlorine), and from about 10% by volume to about 20% by volume of the noble gas (i.e., argon). Alternatively, the etchant gas comprises or consists of or consists essentially of a nitrogen and halogen (preferably chlorine). The etchant gas more specifically comprises, or consists of or consists essentially of, preferably from about 10% by volume to about 90% by volume nitrogen and from about 10% by volume to about 90% by volume of the halogen gas (i.e., chlorine); more preferably from about 20% by volume to about 60% by volume nitrogen and from about 40% by volume to about 80% by volume of the halogen gas (i.e., chlorine); most preferably from about 30% by volume to about 40% by volume nitrogen and from about 60% by volume to about 70% by volume of the halogen gas (i.e., chlorine). In another preferred embodiment of the invention and was also previously mentioned, the etchant gas comprises, preferably consists of or consists essentially of, nitrogen, the halogen (i.e., chlorine), the noble gas (i.e., argon), and a gas selected from the group consisting of HBr, BCl$_3$, SiCl$_4$, and mixtures thereof. As was further also previously mentioned, the etchant gas more specifically comprises, or consists of or consists essentially of, from about 0.1% by volume to about 60% by volume nitrogen, from about 40% by volume to about 90% by volume of the halogen gas (i.e., chlorine), and from about 0.1% by volume to about 40% by volume of the noble gas (i.e., argon), and from about 1% by volume to about 30% by volume of HBr and/or BCl$_3$ and/or SiCl$_4$; preferably from about 5% by volume to about 40% by volume nitrogen, from about 50% by volume to about 80% by volume of the halogen gas (i.e., chlorine), and from about 5% by volume to about 30% by volume of the noble gas (i.e., argon), and from about 5% by volume to about 20% by volume of HBr and/or BCl$_3$ and/or SiCl$_4$; and more preferably from about 10% by volume to about 30% by volume nitrogen, from about 60% by volume to about 70% by volume of the halogen gas (i.e., chlorine), and from about 10% by volume to about 20% by volume of the noble gas (i.e., argon), and from about 1% by volume to about 10% by volume of HBr and/or BCl$_3$ and/or SiCl$_4$. Thus, the foregoing process conditions stated in Tables VII–XI may be based on such etchant gas constituency and on such percent (%) by volume value(s).

It has also been discovered that platinum etch by-products may become less conductive electrically, and the stability of RF power transmission through the dielectric window becomes more stable, by operating the platinum etch process in a high Cl$_2$/Ar ratio and a high pressure regime. The Cl$_2$/Ar ratio may be any suitable elevated or high gas volume ratio, preferably a Cl$_2$/Ar volume ratio of greater than 2(>2):1, more preferably greater than 4(>4):1. The high pressure may be any suitable elevated or high pressure, preferably greater than 10 mTorr (>10 mTorr), more preferably greater than 24 mTorr (>24). More generally, when the etchant gases are a mixture of the halogen gas(es) (i.e., chlorine) and the noble gas(es) (i.e., argon), the process parameters for etching the platinum electrode layer 16 in a suitable inductively coupled plasma reactor for reducing the electrical conductivity of platinum by-products fall into the ranges as listed on the basis of flow rates of the gases, including the halogen gas(es) (i.e., Cl$_2$) and the noble gas(es) (i.e., Ar), as listed in Table XII below:

TABLE XII

| Process | Broad | Preferred | Optimum |
|---|---|---|---|
| Gas Flow, sccm | | | |
| Halogen (e.g., Cl$_2$) | 30 to 400 | 50 to 250 | 100 to 150 |
| Noble gas (e.g., Ar) | 20 to 300 | 20 to 100 | 20 to 30 |
| Cl$_2$/Ar vol. ratio | 1 to 20 | 2 to 10 | 4 to 6 |
| Pressure, mT | 0.1 to 300 | 10 to 100 | 10 to 50 |
| RF Power of Coil Inductor (Watts) | 100 to 5000 | 500 to 3000 | 750 to 1500 |
| RF Power of Wafer Pedestal (Watts) | 50 to 3000 | 100 to 1000 | 150 to 400 |
| Temperature of Wafer (° C.) | about 150 to about 500 | 200 to 400 | 250 to 350 |
| Platinum Etch Rate (Å/min) | 200 to 6000 | 500 to 3000 | 1000 to 2000 |
| RF Frequency of Coil Inductor | 100K to 300 MHz | 400K to 20 MHz | 2 to 13.5 MHz |
| RF Frequency of Wafer Pedestal | 100K to 300 MHz | 400K to 20 MHz | 400K to 13.5 MHz |

The foregoing process conditions stated in Table XII above may be based on the following etchant gas constituency for reducing the electrical conductivity of platinum by-products: preferably from about 50% to about 96% by volume of the halogen gas(es) (i.e., chlorine) and from about 4% to about 50% by volume of the noble gas(es) (i.e., argon); more preferably from about 60% to about 90% by volume of the halogen gas(es) (i.e., chlorine) and from about 10% to about 40% by volume of the noble gas(es) (i.e., argon); most preferably from about 70% to about 85% by volume of the halogen gas(es) (i.e., chlorine) and from about 15% to about 30% by volume of the noble gas(es).

Figure 11:
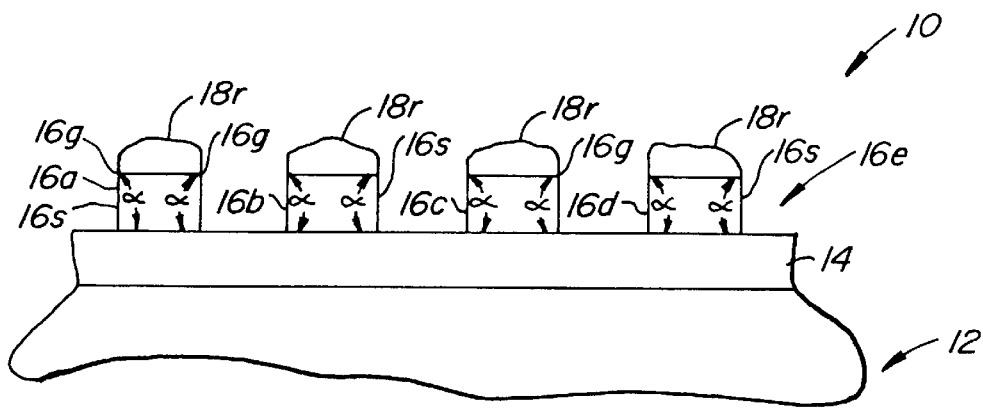
FIG. 11 is a side elevational view of the semiconductor wafer of FIG. 7 after the platinum electrode layer has been etched to produce an etched platinum electrode layer with a residual mask layer on top thereof.
Figure 12:
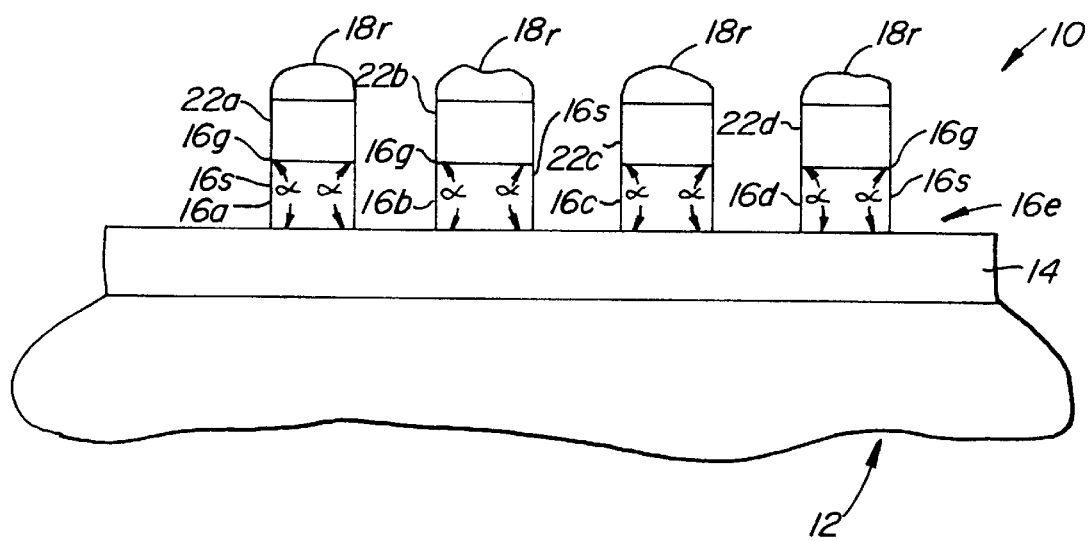
FIG. 12 is a side elevational view of the semiconductor wafer of FIG. 8 after the platinum electrode layer has been etched to produce an etched platinum electrode layer with a residual mask layer on top of the residual protective layer.

For the embodiment of the invention illustrated in FIGS. 2, 6, 8 and 10, the protective layers 22a, 22b, 22c and 22d protect the corners 16g of the etched platinum electrode layers 16a, 16b, 16c and 16d during the etching process. Typically and as best shown in FIGS. 11 and 12, some of the mask layers 18a, 18b, 18c and 18d would be etched during the platinum etching process, leaving residual mask layers 18r on top of etched platinum electrode layers 16a, 16b, 16c and 16d, or on top of the protective layers 22a, 22b, 22c and 22d. The protective layers 22a, 22b, 22c and 22, respectively, insure that the corners 16g of the etched platinum electrode layers 16a, 16b, 16c and 16d are protected during platinum etching, especially in the event that the platinum etching process removes essentially all of the mask layers 18a, 18b, 18c and 18d. Maintaining the corners 16g of the etched platinum electrode layers 16a, 16b, 16c and 16d protects the quality of the platinum profile formed during etching of the platinum electrode layer 16 to produce the etched platinum electrode layers 16a, 16b, 16c and 16d.

After the platinum electrode layer 16 has been etched to produce the platinum electrode layers 16a, 16b, 16c and 16d, the residual mask layers 18r (if not completely removed during the platinum etching process) typically remain on top of the veil-less etched platinum electrode layers 16a, 16b, 16c and 16d, or on top of the protective layers 22a, 22b, 22c and 22d which are respectively supported by the essentially veil-less etched platinum electrode layers 16a, 16b, 16c and 16d, all as best shown in FIGS. 11 and 12. The residual mask layers 18r are to be removed by any suitable means and/or in any suitable manner, such is by $CHF_3$/Ar plasma. Likewise for the embodiment of the invention depicted in FIG. 12, the protective layers 22a, 22b, 22c and 22d are to be removed after removal of the residual mask layers 18r from the protective layers 22a, 22b, 22c and 22d. The protective layers 22a, 22b, 22c and 22d may be removed by any suitable means and/or in any suitable manner. For example, when the protective layers 22a, 22b, 22c and 22d comprise TiN removal is by Ar/$Cl_2$ plasma in a DPS™ brand chamber of the Metal Etch DPS Centura™ brand plasma processing apparatus under the following apparatus and process conditions as listed in Table XIII below.

TABLE XIII

| Process | Broad | Preferred | Optimum |
|---|---|---|---|
| Gas Flow, sccm | | | |
| $Cl_2$ | 20 to 150 | 30 to 120 | 40 to 100 |
| Ar | 20 to 100 | 30 to 80 | 40 to 60 |
| Pressure, mT | 0.5 to 40 | 4 to 30 | 7 to 14 |
| RF Power of Coil Inductor (Watts) | 500 to 3000 | 500 to 2000 | 800 to 1200 |
| RF Power of Wafer Pedestal (Watts) | 50 to 500 | 50 to 300 | 50 to 150 |
| Temperature of Wafer | 20 to 500 | 20 to 150 | 80 to 130 |
| TiN Etch Rate (Å/min) | 500 to 5000 | 1000 to 3500 | 1500 to 2500 |
| RF Frequency of Coil Inductor | 100K to 300 MHz | 400K to 20 MHz | 2 to 13.5 MHz |
| RF Frequency of Wafer Inductor | 100K to 300 MHz | 400K to 20 MHz | 400K to 13.5 MHz |

Figure 13:
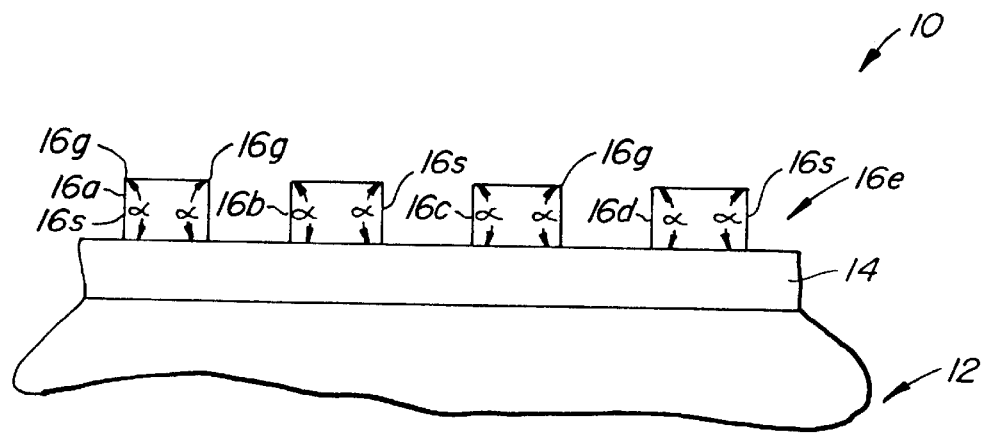
FIG. 13 is a side elevational view of the semiconductor wafer of FIG. 11 with the residual mask layer removed from the surface of the etched platinum electrode layer.
Figure 14:
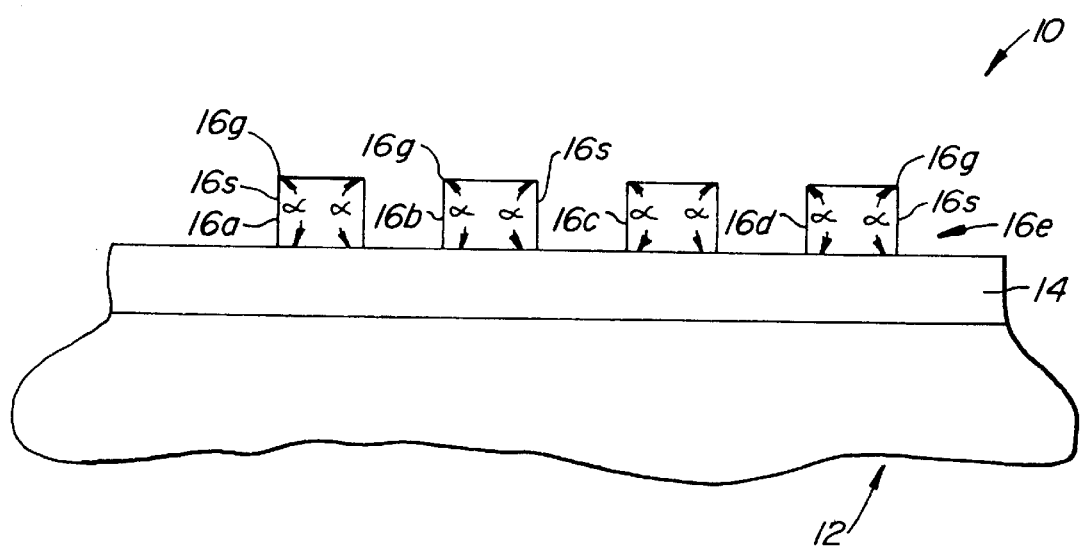
FIG. 14 is a side elevational view of the semiconductor wafer of FIG. 12 with the residual mask layer and the residual protective layer removed from the surface of the etched platinum electrode layer.
Figure 15:
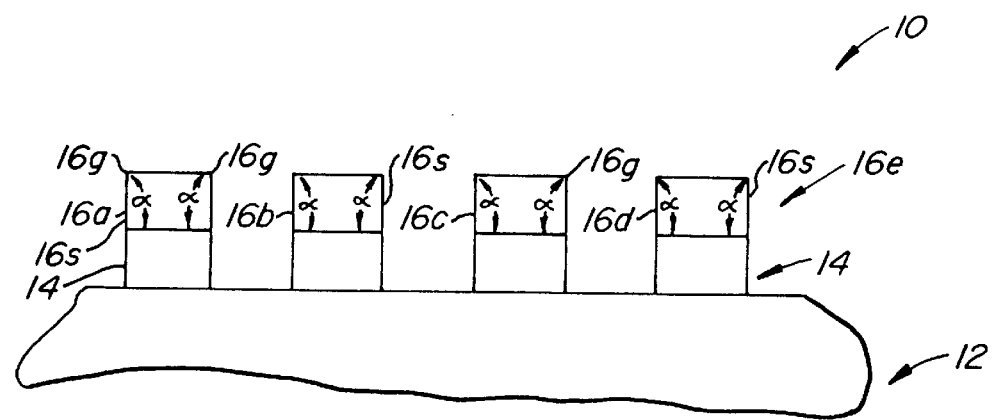
FIG. 15 is a side elevational view of semiconductor wafer of FIG. 11 after the residual mask layer has been removed from the surface of the etched platinum electrode layer and with the barrier layer having been etched.
Figure 16:
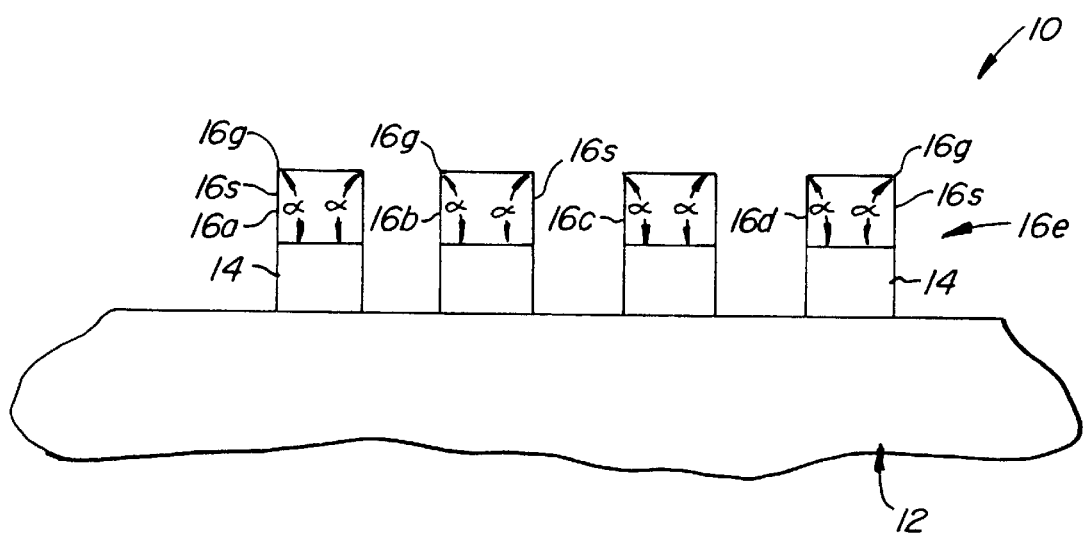
FIG. 16 is a side elevational view of semiconductor wafer of FIG. 12 after the residual mask layer and the residual protective layer have been removed from the surface of the etched platinum electrode layer and with the barrier layer having been etched.

After removal of residual mask layers 18r, or the residual mask layers 18r and the protective layers 22a, 22b, 22c and 22d for the embodiment of the invention illustrated in FIG. 12, the veil-less etched platinum electrode layered structure of FIG. 13 or FIG. 14 remains. It should be noted, as best shown in FIGS. 15 and 16, respectively, that the barrier layer 14 could be etched simultaneously during or after removal of the residual mask layers 18r (see FIG. 15), or etched simultaneously during or after removal of the residual mask layers 18r and the protective layers 22a, 22b, 22c and 22d (see FIG. 16).

It is to be understood that the patterned resist 20 (i.e., resist members 20a, 20b, 20c and 20d) for the embodiment of the invention depicted in FIG. 1, or the patterned resist 20 (i.e., resist numbers 20a, 20b, 20c and 20d) and/or the mask layers 18a, 18b, 18c and 18d for the embodiment of the invention depicted in FIG. 2, may be removed at any suitable time, preferably before the etching of the platinum electrode layer 16. Similarly, the protective layers 22a, 22b, 22c and 22d and/or mask layers 18a, 18b, 18c and 18d for the embodiment of the invention depicted in FIG. 2, may also be removed at any suitable time, such as during the platinum etching process or after the platinum etching process.

The invention will be illustrated by the following set forth example which is being given to set forth the presently known best mode and by way of illustration only and not by way of any limitation. All parameters such as concentrations, mixing proportions, temperatures, pressure, rates, compounds, etc., submitted in this example are not to be construed to unduly limit the scope of the invention.

EXAMPLE I

A test semiconductor wafer was formulated with the following film stack:

0.8 μm patterned PR (photoresist)/5000 Å Oxide/100 Å Ti/1000 Å Pt/300 Å TiN

The feature size of the patterned PR test semiconductor wafer was 0.3 μm block and 0.25 μm spacing. The oxide mask (i.e. the mask layer) was opened in the oxide etch chamber of a plasma processing apparatus sold under the trademark Oxide Etch MxP Centura™, owned by Applied Materials Inc., 3050 Bowers Avenue, Santa Clara, Calif. 95054-3299. The etchant gas for opening the oxide mask comprised about 68% by volume Ar and about 32% by volume $CHF_3$. The reactor and process conditions were as follows:

| Reactor Conditions | |
|---|---|
| Pressure | 60 mTorr |
| RF Power | 850 watts |
| Rotational Magnetic Field | 40 Gauss |
| Temperature of Test Wafer | 100° C. |
| Oxide Mask Etch Rate | 3000 Å/min |
| Process Conditions Based on the Flow Rate of Ar and $CHF_3$ | |
| $CHF_3$ | 50 sccm |
| Ar | 100 sccm |
| Pressure, mTorr | 60 mTorr |
| RF Power Density | 850 watts |
| Temperature (° C.) of Test Wafer | 100° C. |
| Oxide Mask Etch Rate (Å/min) | 3000 Å/min |
| Magnetic Field (Gauss) | 40 Gauss |

The photoresist was stripped from the oxide mask in an ASP chamber of the Metal Etch MxP Centura™ brand plasma processing apparatus under the following recipe using microwave downstream $O_2/N_2$ plasma: 120 seconds, 250° C., 1400 W, 3000 sccm $O_2$, 300 sccm $N_2$, and 2 Torr.

The Ti protective layer was etched with Ar, $Cl_2$ and $BCl_3$ as the etchant gases and in a DPS™ brand chamber of the Metal Etch DPS Centura™ brand plasma processing apparatus under the following reactor and process conditions:

| Reactor Conditions | |
|---|---|
| Pressure | 12 mTorr |
| RF Power to Coil Inductor | 900 watts |
| RF Power to Wafer Pedestal | 100 watts |
| Temperature of Test Wafer | 110° C. |
| Ti Etch Rate | 2000 Å/min |

-continued

| Process Conditions Based on the Flow Rate of Ar and $Cl_2$ and $BCl_3$ | |
|---|---|
| Ar | 40 sccm |
| $Cl_2$ | 30 sccm |
| $BCl_3$ | 30 sccm |
| Pressure | 12 mTorr |
| RF Power to Coil Inductor | 900 watts |
| RF Power to Wafer Pedestal | 100 watts |
| Temperature of Test Wafer | 110° C. |
| Ti Etch Rate | 2000 Å/min |

The platinum layer of the test semiconductor wafer was then etched with Ar and $Cl_2$ as the etchant gas and in a DPS™ brand chamber of the Metal Etch DPS Centura™ brand plasma processing apparatus under the following reactor and process conditions:

| Reactor Conditions | |
|---|---|
| Pressure | 12 mTorr |
| RF Power to Coil Inductor | 900 watts |
| RF Power to Wafer Pedestal | 150 watts |
| Temperature of Test Wafer | 260° C. |
| Platinum Etch Rate | 1500 Å/min |
| Process Conditions Based on the Flow Rate of Ar and $Cl_2$ | |
| Ar | 40 sccm |
| $Cl_2$ | 60 sccm |
| Pressure, mTorr | 12 mTorr |
| RF Power to Coil Inductor | 900 watts |
| RF Power to Wafer Pedestal | 150 watts |
| Temperature (° C.) of Test Wafer | 260° C. |
| Pt Etch Rate (Å/min) | 1500 Å/min |
| Selectivity of Pt/Oxide Mask | 1:1 |

Figure 19:
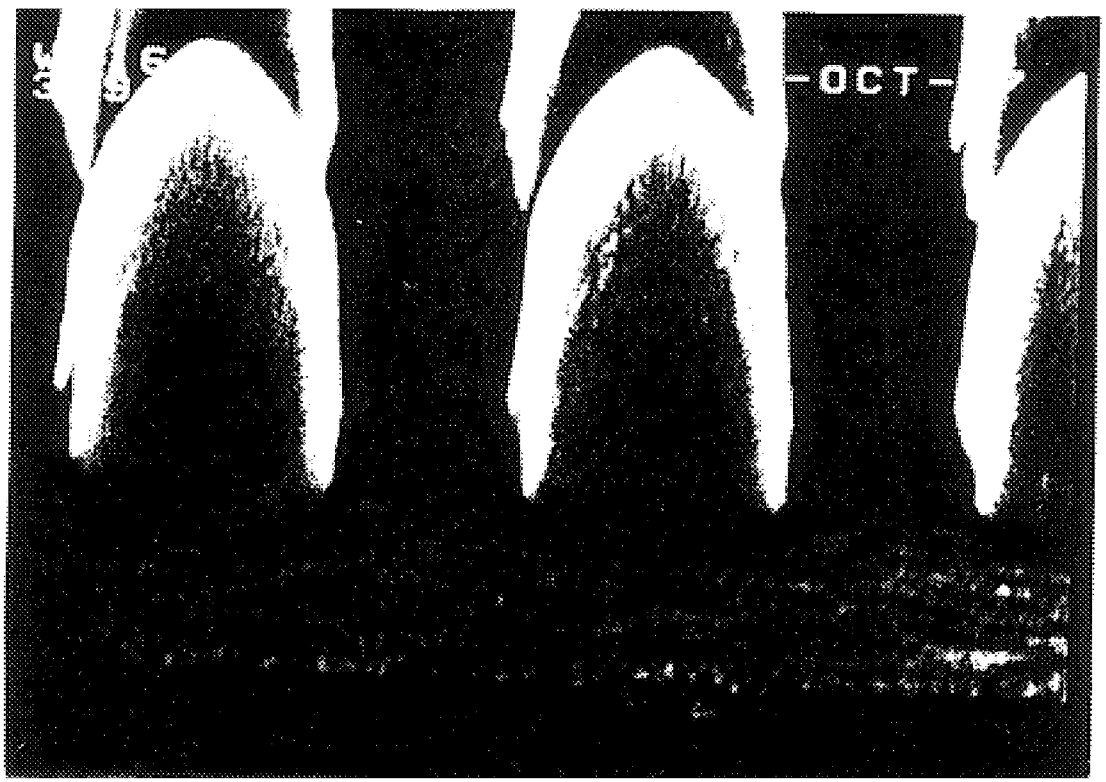
FIG. 19 is a picture showing an elevational view of a test semiconductor wafer for Example I after the platinum electrode layer was etched in accordance with the process conditions listed the Example I.

The resulting etched platinum layer of the test semiconductor wafer is shown in FIG. 19 wherein a platinum profile of about 87 degrees is shown.

Figure 20:
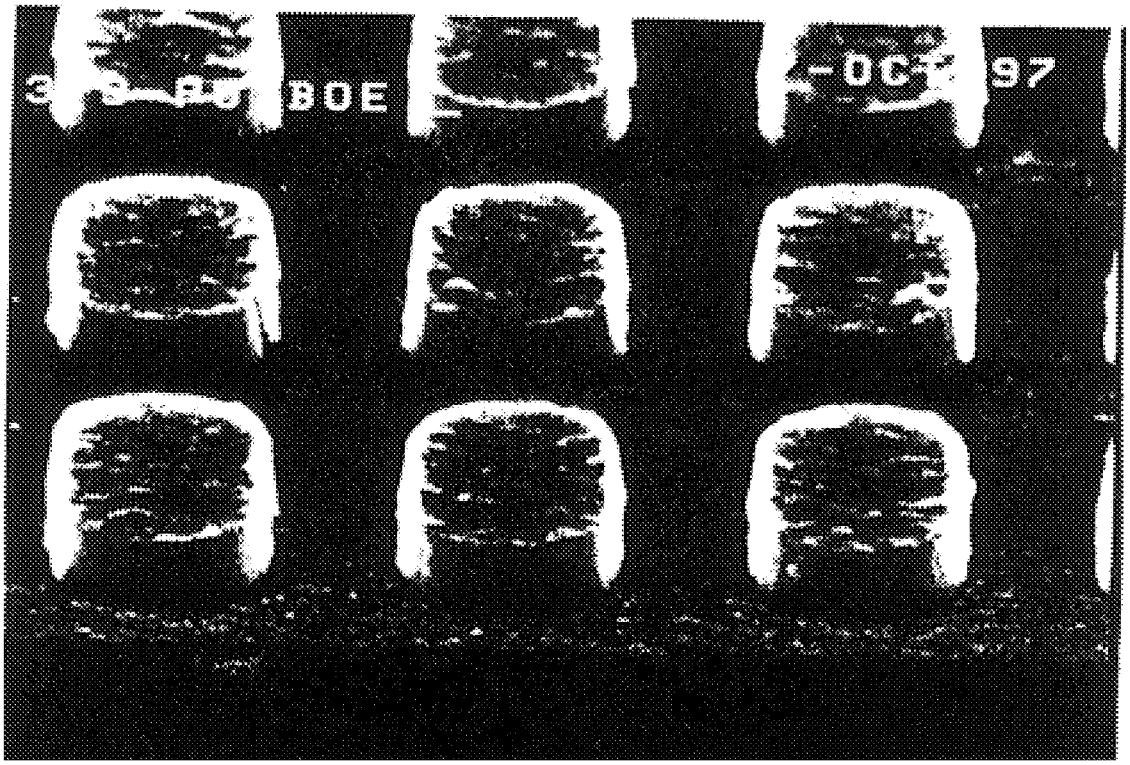
FIG. 20 is a picture showing an elevational view of the test semiconductor wafer of FIG. 19 after the oxide mask was removed.
Figure 21:
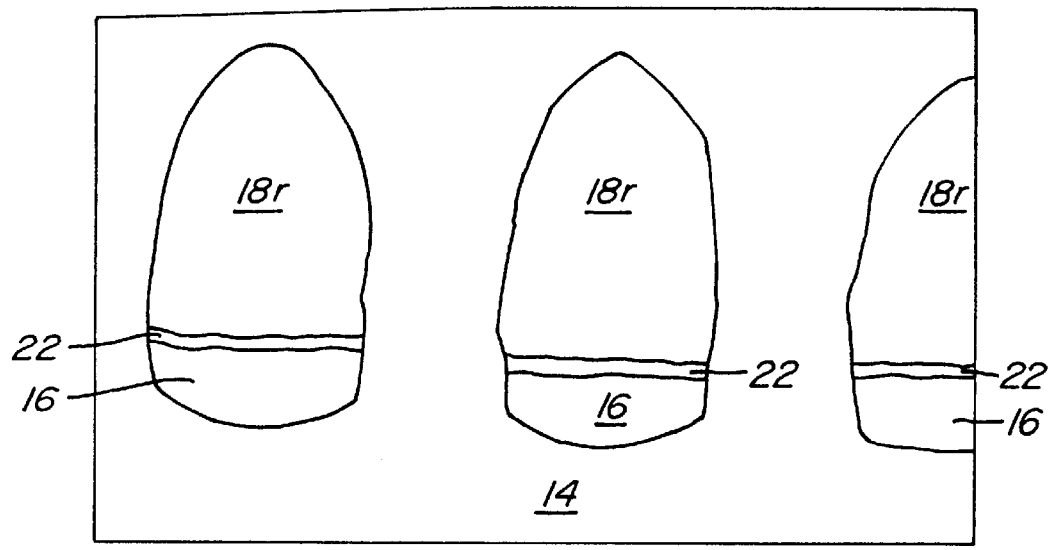
FIG. 21 is a drawing representing the elevational view in the picture of FIG. 19 with the respective parts identified by reference numerals.
Figure 22:
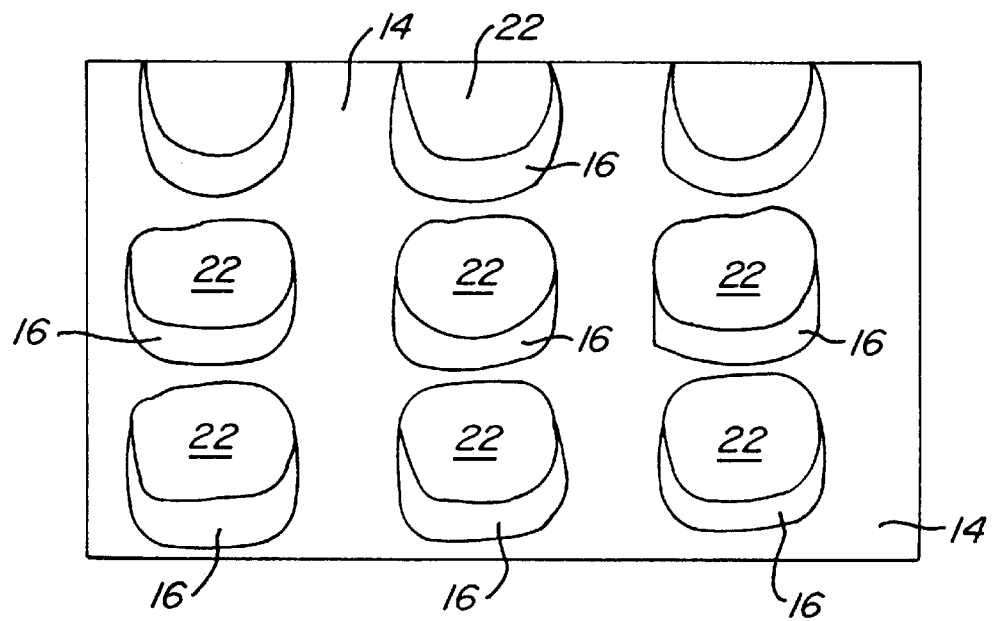
FIG. 22 is a drawing representing the elevational view in the picture of FIG. 20 with the respective parts identified by reference numerals.

The oxide mask was then removed in a 6:1 HF solution to produce the veil-less test semiconductor wafer shown in FIG. 20. The remaining Ti protective layer could be removed by any suitable means and/or in any suitable manner, such as by etching with Ar, $BCl_3$ and $Cl_2$ as the etchant gases and in a DPS™ brand chamber of the Metal Etch DPS Centura™ brand plasma processing apparatus under the following reactor and process conditions:

| Reactor Conditions | |
|---|---|
| Pressure | 12 mTorr |
| RF Power to Coil Inductor | 900 watts |
| RF Power to Wafer Pedestal | 100 watts |
| Temperature of Test Wafer | 110° C. |
| Ti Etch Rate | 2000 Å/min |
| Process Conditions Based on the Flow Rate of Ar and $Cl_2$ | |
| Ar | 40 sccm |
| $Cl_2$ | 30 sccm |
| $BCl_3$ | 30 sccm |
| Pressure | 12 mTorr |
| RF Power to Coil Inductor | 900 watts |
| RF Power to Wafer Pedestal | 100 watts |
| Temperature of Test Wafer | 110° C. |
| Ti Etch Rate | 2000 Å/min |

EXAMPLE II

A test semiconductor wafer was formulated with the following film stack:

0.8 µm patterned PR (photoresist)/5000 Å Oxide/600 Å TiN/2000 Å Pt/300 Å TiN

The feature size of the patterned PR test semiconductor wafer was 0.25 µm block and 0.2 µm spacing. The oxide mask (i.e. the mask layer) was opened in the oxide etch chamber of a plasma processing apparatus sold under the trademark Oxide Etch MxP Centura™, owned by Applied Materials Inc., 3050 Bowers Avenue, Santa Clara, Calif. 95054-3299. The etchant gas for opening the oxide mask comprised about 68% by volume Ar and about 32% by volume $CHF_3$. The reactor and process conditions were as follows:

| Reactor Conditions | |
|---|---|
| Pressure | 60 mTorr |
| RF Power | 850 watts |
| Rotational Magnetic Field | 40 Gauss |
| Temperature of Test Wafer | 100° C. |
| Oxide Mask Etch Rate | 3000 Å/min |
| Process Conditions Based on the Flow Rate of Ar and $CHF_3$ | |
| $CHF_3$ | 50 sccm |
| Ar | 100 sccm |
| Pressure, mTorr | 60 mTorr |
| RF Power Density | 850 watts |
| Temperature (° C.) of Test Wafer | 100° C. |
| Oxide Mask Etch Rate (Å/min) | 3000 Å/min |
| Magnetic Field (Gauss) | 40 Gauss |

The photoresist was stripped from the oxide mask in an ASP chamber of the Metal Etch MxP Centura™ brand plasma processing apparatus under the following recipe using microwave downstream $O_2/N_2$ plasma: 120 seconds, 250° C., 1400 W, 3000 sccm $O_2$, 300 sccm $N_2$, and 2 Torr.

The TiN protective layer was etched with Ar, $Cl_2$ and $BCl_3$ as the etchant gases and in a DPS™ brand chamber of the Metal Etch DPS Centura™ brand plasma processing apparatus under the following reactor and process conditions:

| Reactor Conditions | |
|---|---|
| Pressure | 12 mTorr |
| RF Power to Coil Inductor | 900 watts |
| RF Power to Wafer Pedestal | 100 watts |
| Temperature of Test Wafer | 110° C. |
| TiN Etch Rate | 2000 Å/min |
| Process Conditions Based on the Flow Rate of Ar and $Cl_2$ and $BCl_3$ | |
| Ar | 40 sccm |
| $Cl_2$ | 30 sccm |
| $BCl_3$ | 30 sccm |
| Pressure | 12 mTorr |
| RF Power to Coil Inductor | 900 watts |
| RF Power to Wafer Pedestal | 100 watts |
| Temperature of Test Wafer | 110° C. |
| TiN Etch Rate | 2000 Å/min |

The platinum layer of the test semiconductor wafer was then etched with Ar and $C_2$ and $BCl_3$ as the etchant gas and in a DPS™ brand chamber of the Metal Etch DPS Centura™ brand plasma processing apparatus under the following reactor and process conditions:

| Reactor Conditions | |
| --- | --- |
| Pressure | 12 mTorr |
| RF Power to Coil Inductor | 900 watts |
| RF Power to Wafer Pedestal | 150 watts |
| Temperature of Test Wafer | 260° C. |
| Platinum Etch Rate | 1500 Å/min |
| Process Conditions Based on the Flow Rate of Ar and Cl$_2$ and BCl$_3$ | |
| Ar | 40 sccm |
| Cl$_2$ | 60 sccm |
| BCl$_3$ | 10 sccm |
| Pressure, mTorr | 12 mTorr |
| RF Power to Coil Inductor | 900 watts |
| RF Power to Wafer Pedestal | 150 watts |
| Temperature (° C.) of Test Wafer | 260° C. |
| Pt Etch Rate (Å/min) | 1500 Å/min |
| Selectivity of Pt/Oxide Mask | 1:1 |

Figure 23:
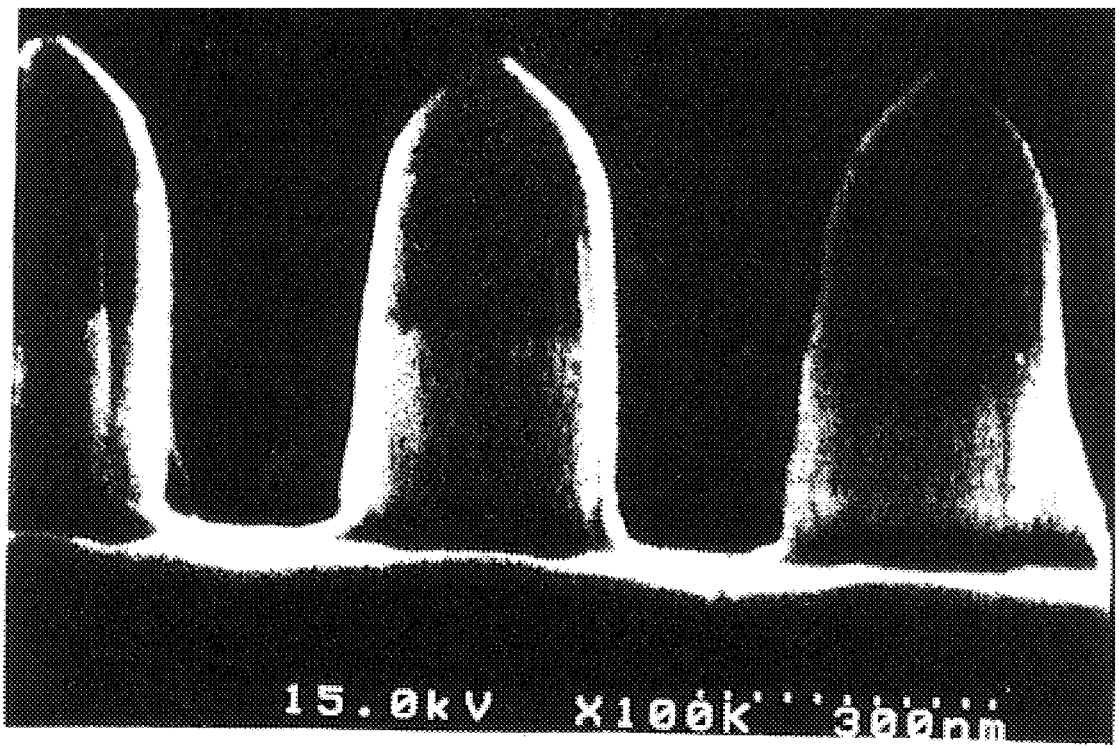
FIG. 23 is a picture showing an elevational view of a test semiconductor wafer for Example II after the platinum electrode layer was etched in accordance with the process conditions listed in Example II.
Figure 24:
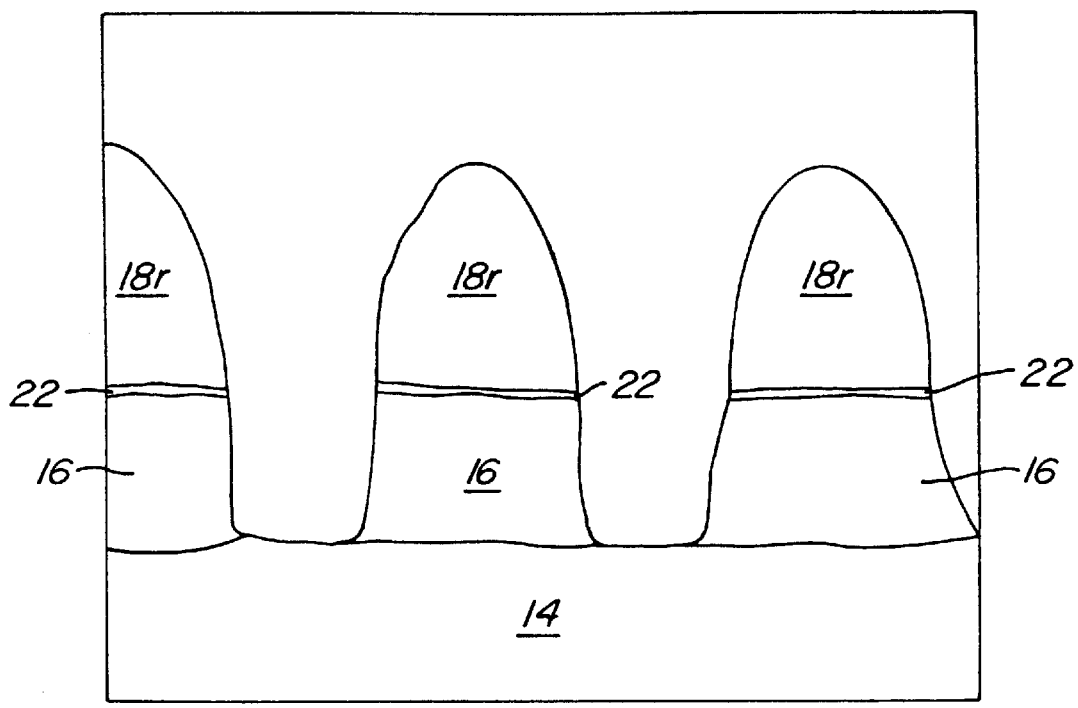
FIG. 24 is a drawing representing the elevational view of the picture of FIG. 23 with the respect parts identified by reference numerals.
Figure 25:
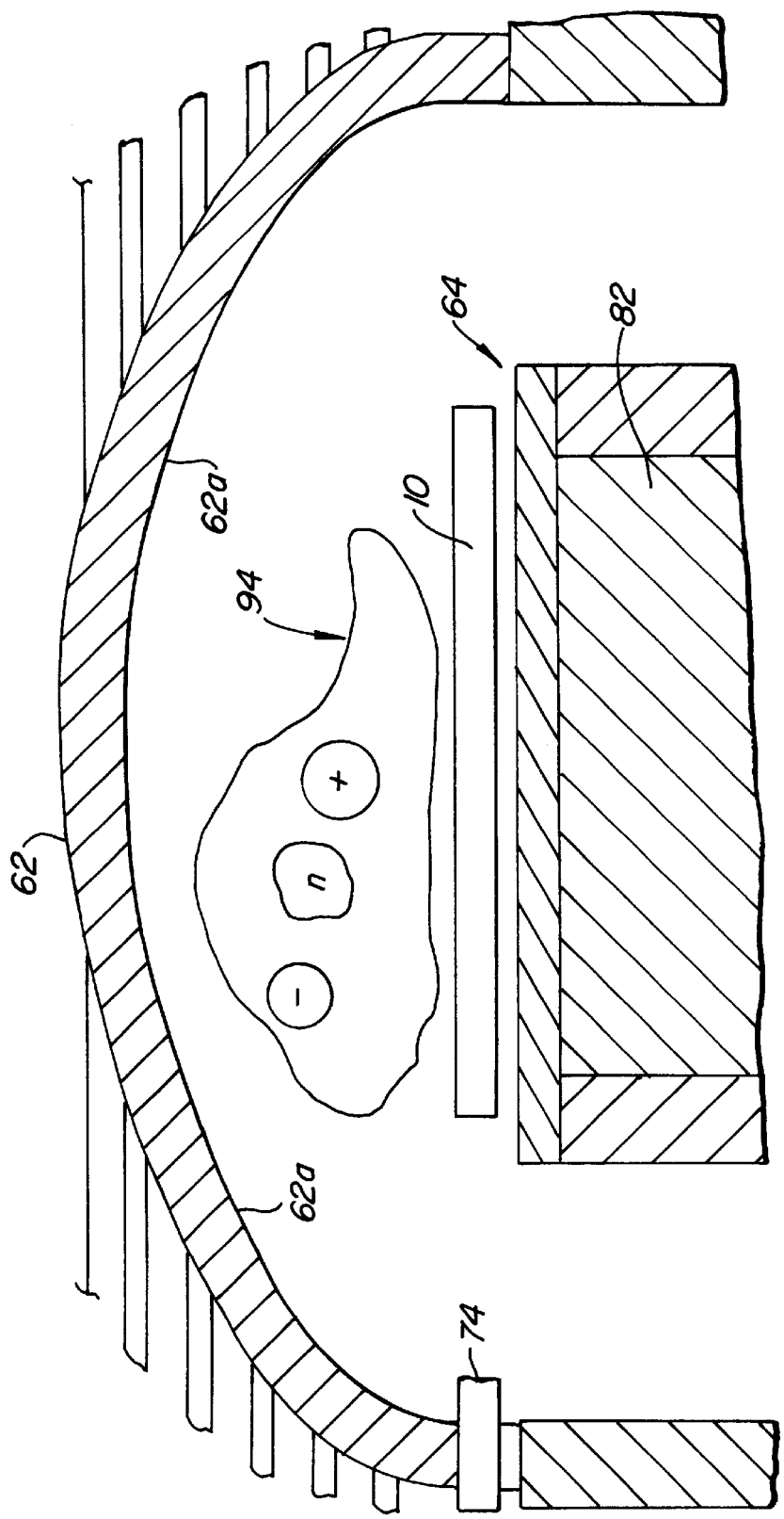
FIG. 25 is a partial exploded sectional view of the inductively coupled RF plasma reactor of FIG. 17 illustrating the dome-shaped dielectric ceiling.

The resulting etched platinum layer of the test semiconductor wafer is shown in FIG. 23 wherein a platinum profile of about 87 degrees is shown.

The oxide mask could have been removed in a 6:1 HF solution to produce a veil-less test semiconductor wafer similar to the one shown in FIG. 20. The remaining TiN protective layer could have been removed by any suitable means and/or in any suitable manner, such as by etching with Ar, BCl$_3$ and Cl$_2$ as the etchant gases and in a DPS™ brand chamber of the Metal Etch DPS Centura™ brand plasma processing apparatus under the following reactor and process conditions:

| Reactor Conditions | |
| --- | --- |
| Pressure | 12 mTorr |
| RF Power to Coil Inductor | 900 watts |
| RF Power to Wafer Pedestal | 100 watts |
| Temperature of Test Wafer | 110° C. |
| TiN Etch Rate | 2000 Å/min |
| Process Conditions Based on the Flow Rate of Ar and Cl$_2$ and BCl$_3$ | |
| Ar | 40 sccm |
| Cl$_2$ | 30 sccm |
| BCl$_3$ | 30 sccm |
| Pressure | 12 mTorr |
| RF Power to Coil Inductor | 900 watts |
| RF Power to Wafer Pedestal | 100 watts |
| Temperature of Test Wafer | 110° C. |
| TiN Etch Rate | 2000 Å/min |

EXAMPLE III

A test semiconductor wafer was formulated with the following film stack:

0.8 μm PR (photoresist)/7000 Å Oxide/200 Å Ti/3000 Å Pt/300 Å TiN/SiN

The feature size of the formulated test semiconductor wafer was 0.27 μm block and 0.13 μm spacing. The oxide hard mask (i.e. the insulation layer) was opened in the oxide etch chamber of a plasma processing apparatus sold under the trademark Oxide Etch MxP Centura™, owned by Applied Materials Inc., 3050 Bowers Avenue, Santa Clara, Calif. 95054-3299. The etchant gas for opening up the oxide hard mask comprised about 68% by volume Ar and about 32% by volume CHF$_3$. The reactor and process conditions were as follows:

| Reactor Conditions | |
| --- | --- |
| Pressure | 60 mTorr |
| RF Power | 850 watts |
| Rotational Magnetic Field | 40 Gauss |
| Temperature of Test Wafer | 100° C. |
| Oxide Hard Mask Etch Rate | 3000 Å/min |
| Process Conditions Based on the Flow Rate of Ar and CHF$_3$ | |
| CHF$_3$ | 50 sccm |
| Ar | 100 sccm |
| Pressure, mTorr | 60 mTorr |
| RF Power Density | 850 watts |
| Temperature (° C.) of Test Wafer | 100° C. |
| Oxide Mask Etch Rate (Å/min) | 3000 Å/min |
| Magnetic Field (Gauss) | 40 Gauss |

The photoresist was stripped from the oxide hard mask in an ASP chamber of the Metal Etch MxP Centura™ brand plasma processing apparatus under the following recipe using microwave downstream O$_2$/N$_2$ plasma: 120 seconds, 250° C., 1400 W, 3000 sccm O$_2$, 300 sccm N$_2$, and 2 Torr.

The Ti protective layer was etched with Ar, Cl$_2$ and BCl$_3$ as the etchant gases and in a DPS™ brand chamber of the Metal Etch DPS Centura™ brand plasma processing apparatus under the following reactor and process conditions:

| Reactor Conditions | |
| --- | --- |
| Pressure | 12 mTorr |
| RF Power to Coil Inductor | 900 watts |
| RF Power to Wafer Pedestal | 100 watts |
| Temperature of Test Wafer | 325° C. |
| Ti Etch Rate | 2000 Å/min |
| Process Conditions Based on the Flow Rate of Ar and Cl$_2$ and BCl$_3$ | |
| Ar | 40 sccm |
| Cl$_2$ | 30 sccm |
| BCl$_3$ | 30 sccm |
| Pressure | 12 mTorr |
| RF Power to Coil Inductor | 900 watts |
| RF Power to Wafer Pedestal | 100 watts |
| Temperature of Test Wafer | 325° C. |
| Ti Etch Rate | 2000 Å/min |

The platinum layer of the test semiconductor wafer was then etched with N$_2$, Ar and Cl$_2$ as the etchant gas and in a DPS™ brand chamber of the Metal Etch DPS Centura™ brand plasma processing apparatus under the following reactor and process conditions:

| Reactor Conditions | |
| --- | --- |
| Pressure | 36 mTorr |
| RF Power to Coil Inductor | 900 watts |
| RF Power to Wafer Pedestal | 300 watts |
| Temperature of Test Wafer | 325° C. |
| Platinum Etch Rate | 800 Å/min |
| Process Conditions Based on the Flow Rate of N$_2$, Ar and Cl$_2$ | |
| N$_2$ | 30 sccm |
| Ar | 24 sccm |
| Cl$_2$ | 120 sccm |
| Pressure, mTorr | 36 mTorr |
| RF Power to Coil Inductor | 900 watts |
| RF Power to Wafer Pedestal | 300 watts |
| Temperature (° C.) of Test Wafer | 325° C. |

| -continued | |
|---|---|
| Pt Etch Rate (Å/min) | 800 Å/min |
| Selectivity of Pt/Oxide Hard Mask | 1.5:1 |

Figure 27:
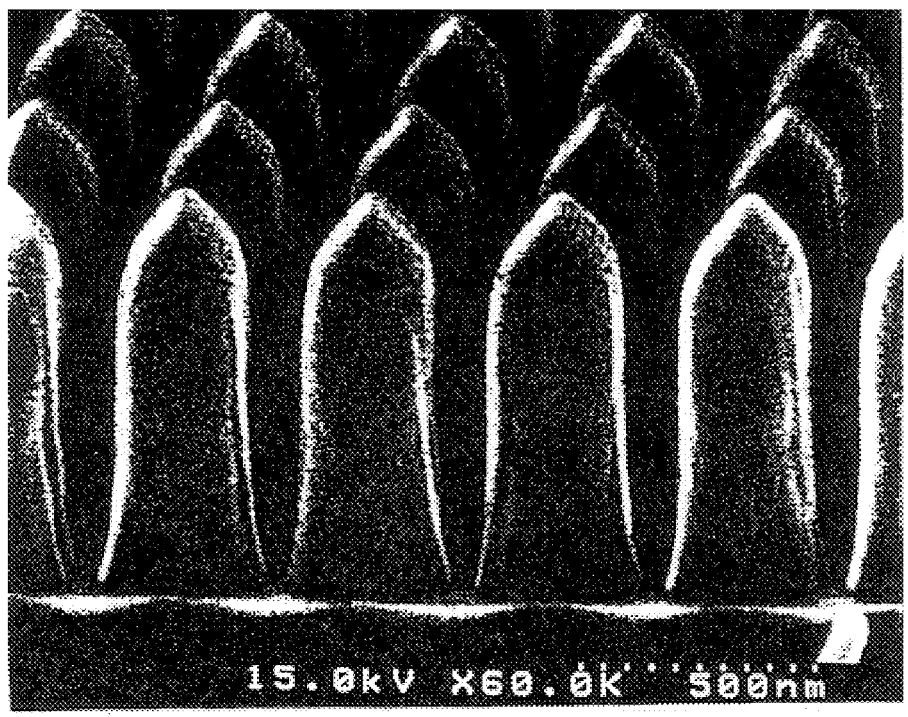
FIG. 27 is a picture showing an elevational view of a test semiconductor wafer for Example III after the platinum electrode layer was etched in accordance with the process conditions listed in Example III.
Figure 29:
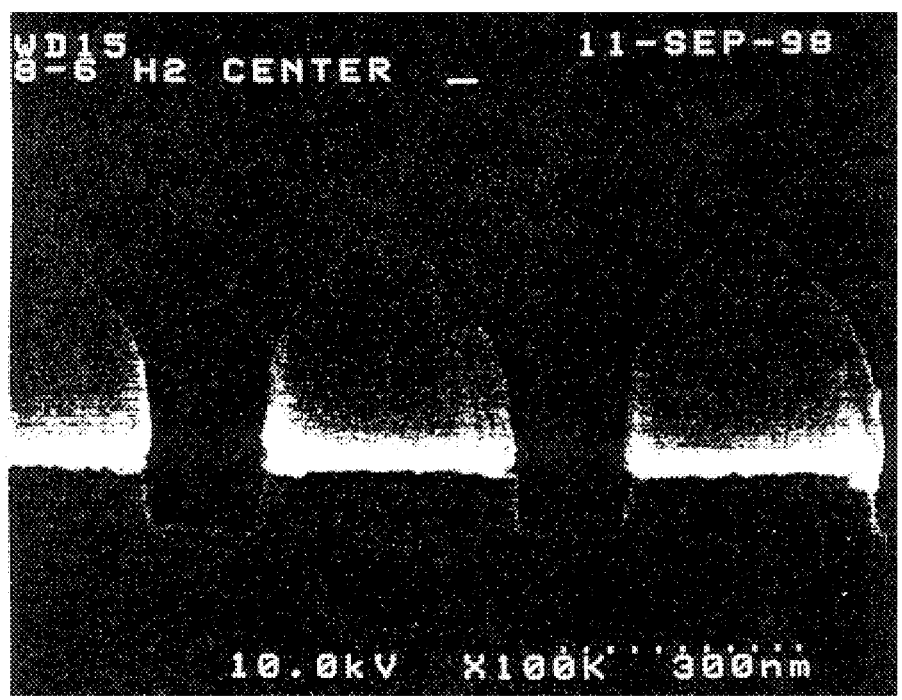
FIG. 29 is a picture showing an elevational view of a test semiconductor wafer for Example IV after the platinum electrode layer was etched in accordance with the process conditions listed in Example IV.
Figure 28:
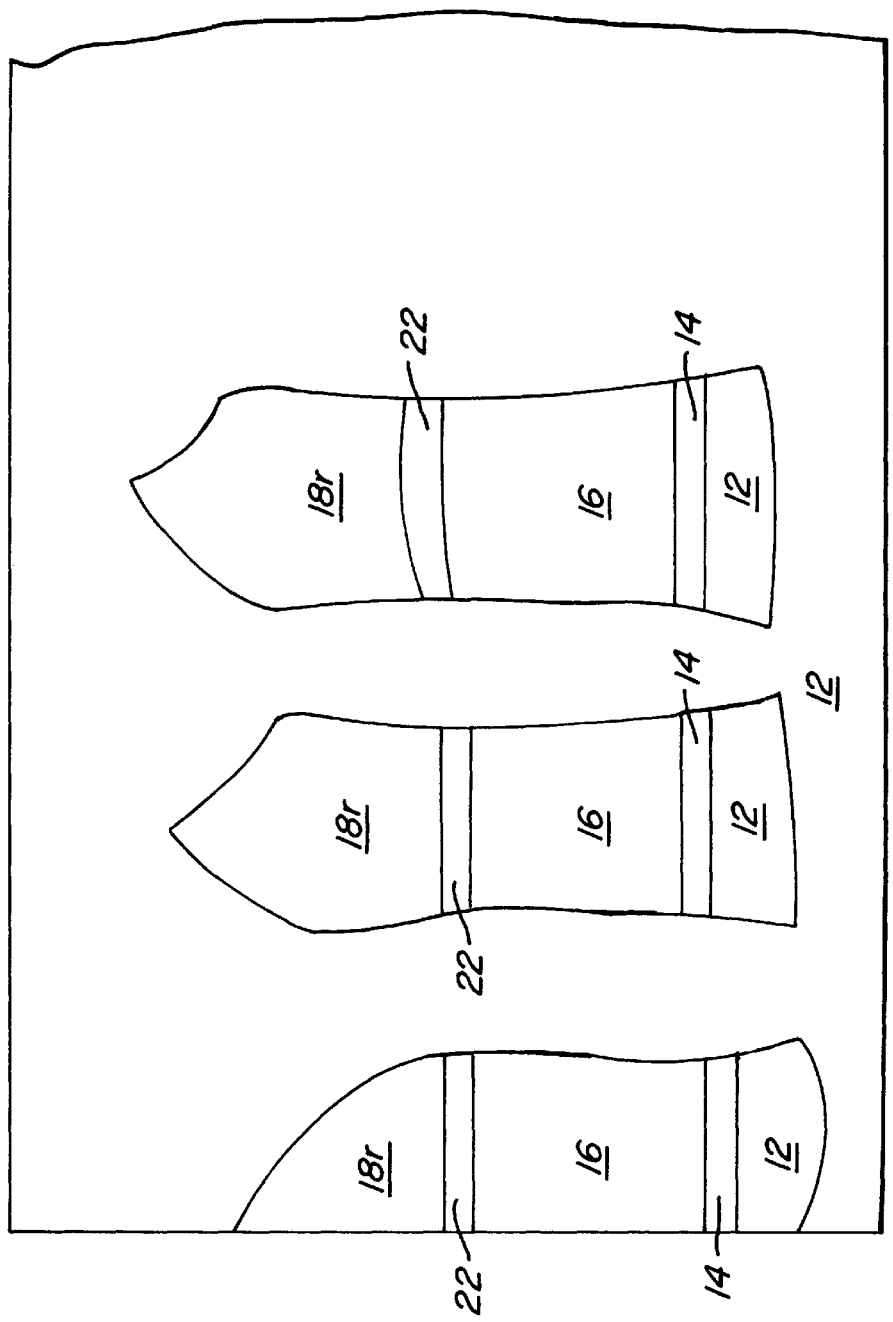
FIG. 28 is a drawing representing the elevational view of the picture of FIG. 27 with the respective parts identified by reference numerals.
Figure 30:
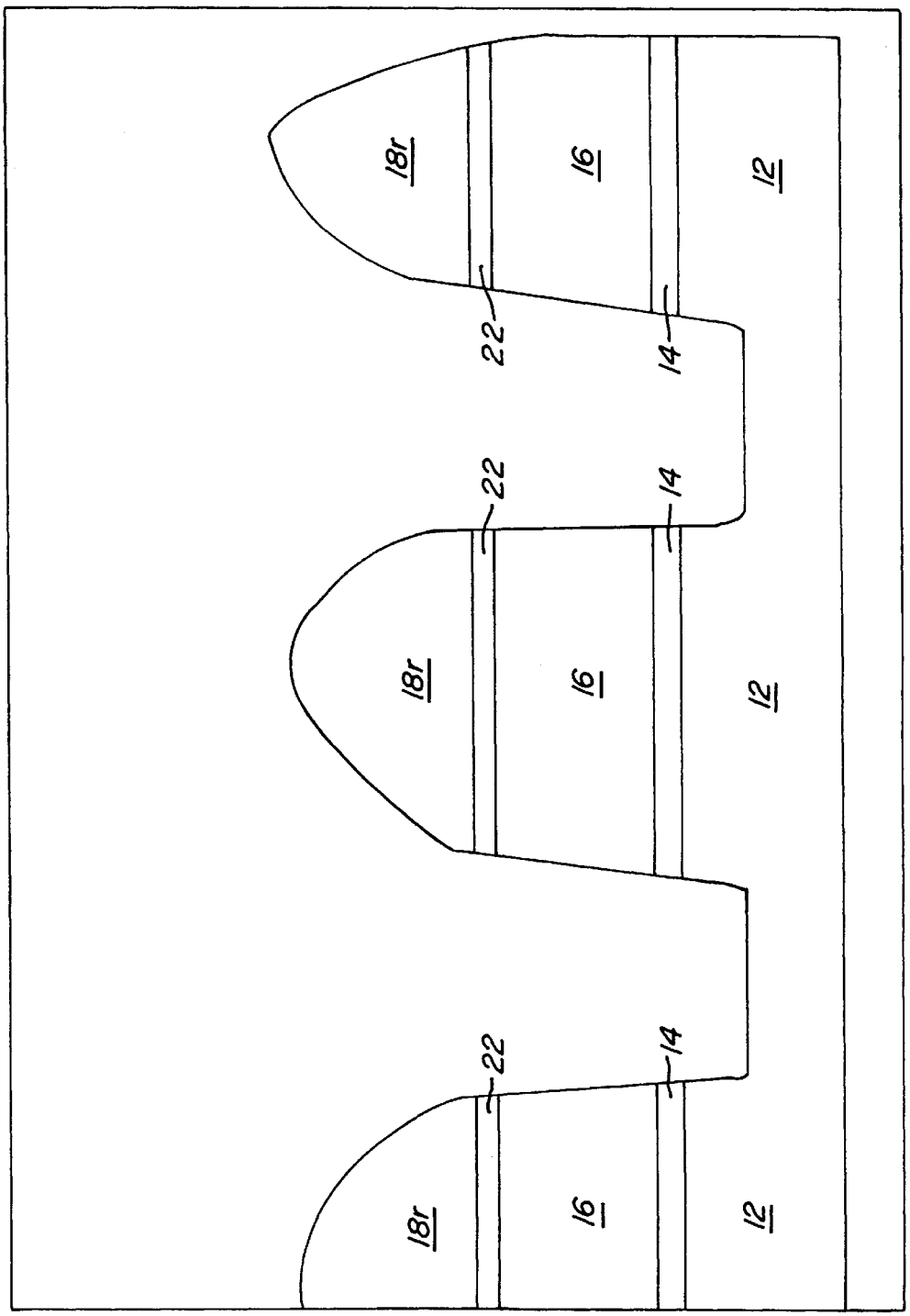
FIG. 30 is a drawing partially representing the elevational view of the picture of FIG. 29 with the respective parts identified by reference numerals.

The resulting etched platinum layer of the test semiconductor wafer is shown in the photograph picture of FIG. 27 wherein a platinum profile of about 88 degrees is shown. FIG. 28 is a drawing representing the photograph of FIG. 27 with the respective parts identified by a reference numeral.

The oxide hard mask could have been removed in a 6:1 HF solution to produce the veil-less test semiconductor wafer similar to the one shown in FIG. 20. The remaining Ti protective layer could be removed by any suitable means and/or in any suitable manner, such as by etching with Ar, $BCl_3$ and $Cl_2$ as the etchant gases and in a DPS™ brand chamber of the Metal Etch DPS Centura™ brand plasma processing apparatus under the following reactor and process conditions:

| Reactor Conditions | |
|---|---|
| Pressure | 12 mTorr |
| RF Power to Coil Inductor | 900 watts |
| RF Power to Wafer Pedestal | 100 watts |
| Temperature of Test Wafer | 110° C. |
| Ti Etch Rate | 2000 Å/min |
| Process Conditions Based on the Flow Rate of Ar and $Cl_2$ and $BCl_3$ | |
| Ar | 40 sccm |
| $Cl_2$ | 30 sccm |
| $BCl_3$ | 30 sccm |
| Pressure | 12 mTorr |
| RF Power to Coil Inductor | 900 watts |
| RF Power to Wafer Pedestal | 100 watts |
| Temperature of Test Wafer | 110° C. |
| Ti Etch Rate | 2000 Å/min |

EXAMPLE IV

A test semiconductor wafer was formulated with the following film stack:

0.8 μm PR (photoresist)/5000 Å Oxide/100 Å TiN/1500 Å Pt/300 Å TiN/SiN

The feature size of the formulated test semiconductor wafer was 0.3 μm block and 0.2 μm spacing. The oxide hard mask (i.e. the insulation layer) was opened in the oxide etch chamber of a plasma processing apparatus sold under the trademark Oxide Etch MxP Centura™, owned by Applied Materials Inc., 3050 Bowers Avenue, Santa Clara, Calif. 95054-3299. The etchant gas for opening up the oxide hard mask comprised about 68% by volume Ar and about 32% by volume $CHF_3$. The reactor and process conditions were as follows:

| Reactor Conditions | |
|---|---|
| Pressure | 60 mTorr |
| RF Power | 850 watts |
| Rotational Magnetic Field | 40 Gauss |
| Temperature of Test Wafer | 100° C. |
| Oxide Hard Mask Etch Rate | 3000 Å/min |

| -continued | |
|---|---|
| Process Conditions Based on the Flow Rate of Ar and $CHF_3$ | |
| $CHF_3$ | 50 sccm |
| Ar | 100 sccm |
| Pressure, mTorr | 60 mTorr |
| RF Power Density | 850 watts |
| Temperature (° C.) of Test Wafer | 100° C. |
| Oxide Mask Etch Rate (Å/min) | 3000 Å/min |
| Magnetic Field (Gauss) | 40 Gauss |

The photoresist was stripped from the oxide hard mask in an ASP chamber of the Metal Etch MxP Centura™ brand plasma processing apparatus under the following recipe using microwave downstream $O_2/N_2$ plasma: 120 seconds, 250° C., 1400 W, 3000 sccm $O_2$, 300 sccm $N_2$, and 2 Torr.

The TiN protective layer was etched with Ar, $Cl_2$ and $BCl_3$ as the etchant gases and in a DPS™ brand chamber of the Metal Etch DPS Centura™ brand plasma processing apparatus under the following reactor and process conditions:

| Reactor Conditions | |
|---|---|
| Pressure | 12 mTorr |
| RF Power to Coil Inductor | 900 watts |
| RF Power to Wafer Pedestal | 100 watts |
| Temperature of Test Wafer | 325° C. |
| TiN Etch Rate | 2000 Å/min |
| Process Conditions Based on the Flow Rate of Ar and $Cl_2$ and $BCl_3$ | |
| Ar | 40 sccm |
| $Cl_2$ | 30 sccm |
| $BCl_3$ | 30 sccm |
| Pressure | 12 mTorr |
| RF Power to Coil Inductor | 900 watts |
| RF Power to Wafer Pedestal | 325 watts |
| Temperature of Test Wafer | 325° C. |
| TiN Etch Rate | 2000 Å/min |

The platinum layer of the test semiconductor wafer was then etched with $N_2$ and $Cl_2$ as the etchant gas and in a parallel plate RIE low density plasma processing apparatus under the following reactor and process conditions:

| Reactor Conditions | |
|---|---|
| Pressure | 100 mTorr |
| RF Power to Wafer Pedestal | 1000 watts |
| Temperature of Test Wafer | 325° C. |
| Platinum Etch Rate | 1000 Å/min |
| Process Conditions Based on the Flow Rate of $N_2$, and $Cl_2$ | |
| $N_2$ | 80 sccm |
| $Cl_2$ | 200 sccm |
| Pressure, mTorr | 100 mTorr |
| RF Power to Wafer Pedestal | 1000 watts |
| Temperature (° C.) of Test Wafer | 325° C. |
| Pt Etch Rate (Å/min) | 1000 Å/min |
| Selectivity of Pt/Oxide Hard Mask | 0.5:1 |

Figure 31:
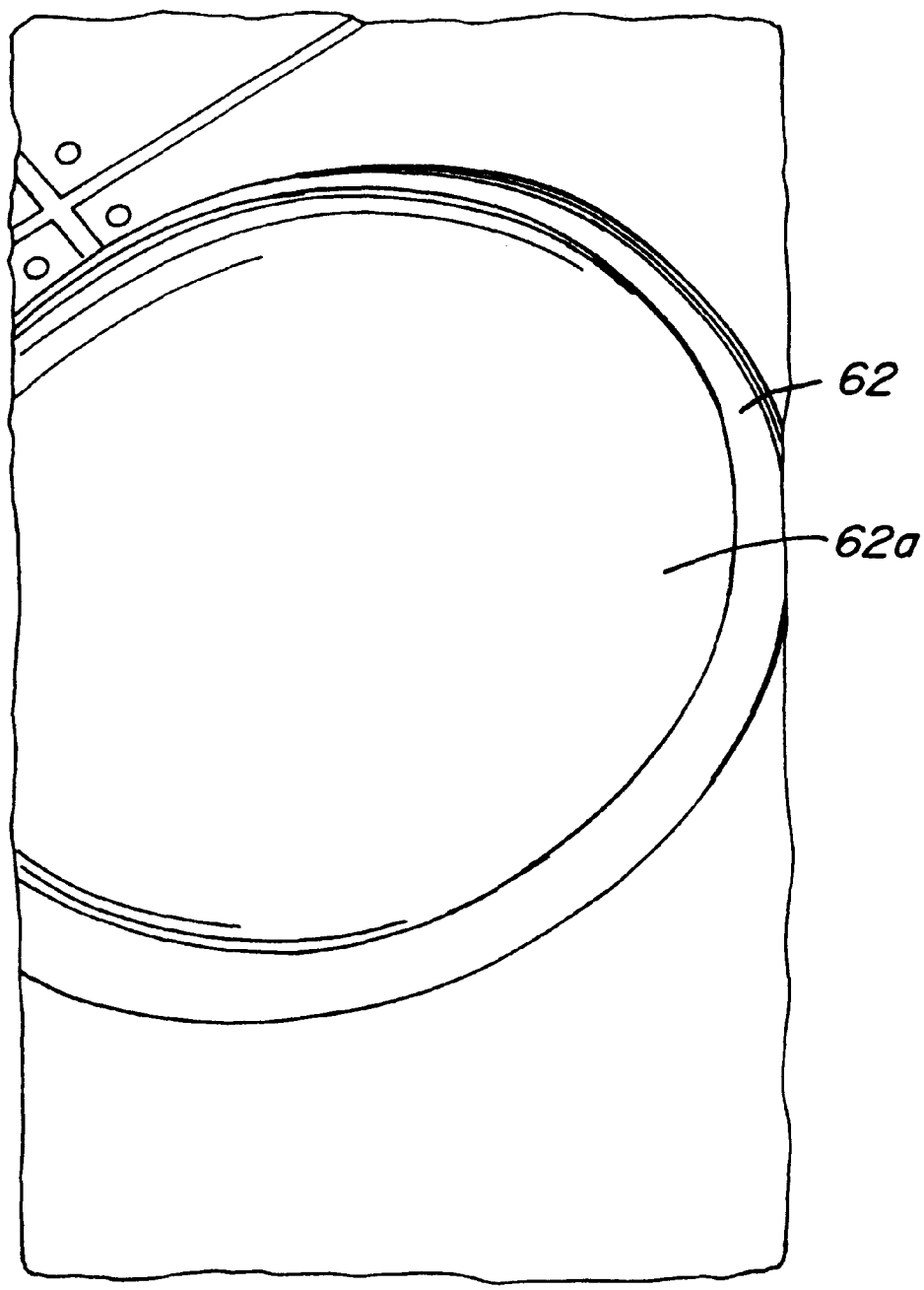
FIG. 31 is a partial perspective view of a dome-shaped dielectric ceiling having an inside concave surface.
Figure 32:
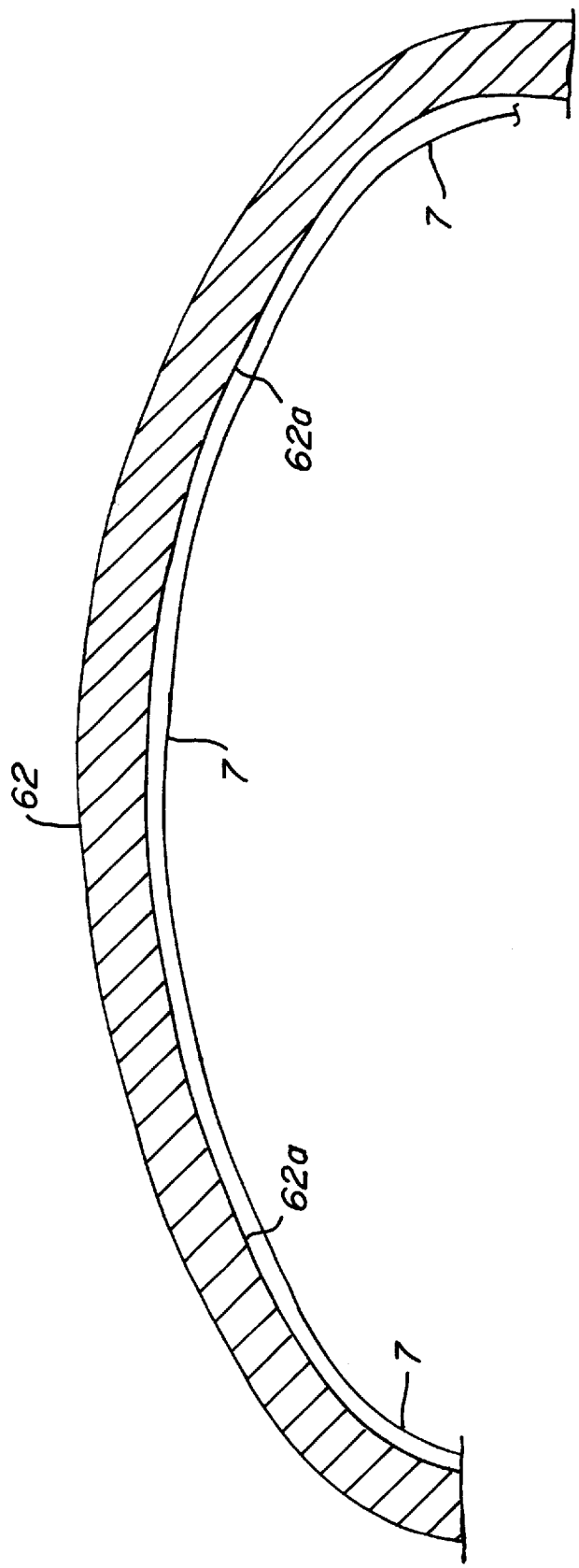
FIG. 32 is a partial sectional view of the dome-shaped dielectric ceiling of FIG. 31 after its associated inside concave surface has received a deposit of by-product materials in accordance with Example V.
Figure 33:
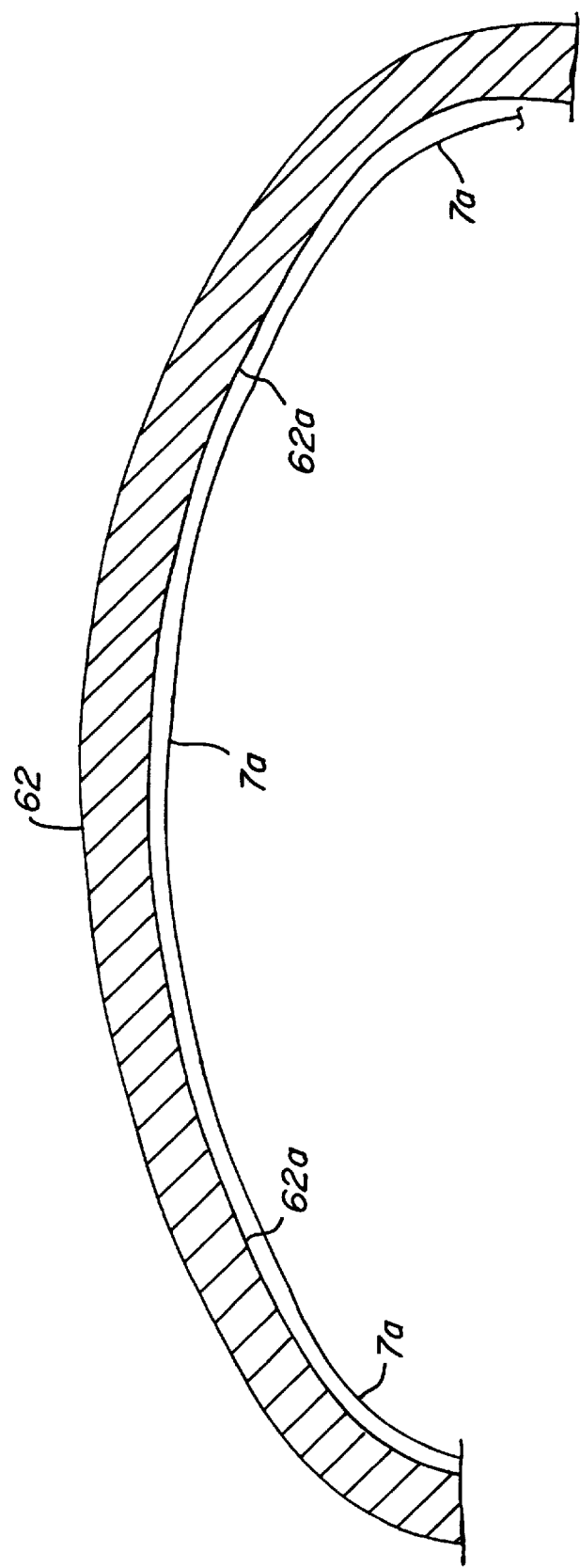
FIG. 33 is a partial sectional view of the dome-shaped dielectric ceiling of FIG. 31 after its associated inside concave surface has received a deposit of by-product materials in accordance with Example VI.

The resulting etched platinum layer of the test semiconductor wafer is shown in FIG. 31 wherein a platinum profile of about 85 degrees is shown. FIG. 32 is a drawing representing the photograph picture of FIG. 31 with the respective parts identified by a reference numeral.

The oxide hard mask could have been removed in a 6:1 HF solution to produce the veil-less test semiconductor wafer similar to the one shown in FIG. 20. The remaining TiN protective layer could be removed by any suitable means and/or in any suitable manner, such as by etching with Ar, $BCl_3$ and $Cl_2$ as the etchant gases and in a DPS™ brand chamber of the Metal Etch DPS Centura™ brand plasma processing apparatus under the following reactor and process conditions:

| Reactor Conditions | |
| --- | --- |
| Pressure | 12 mTorr |
| RF Power to Coil Inductor | 900 watts |
| RF Power to Wafer Pedestal | 100 watts |
| Temperature of Test Wafer | 110° C. |
| TiN Etch Rate | 2000 Å/min |
| Process Conditions Based on the Flow Rate of Ar and $Cl_2$ and $BCl_3$ | |
| Ar | 40 sccm |
| $Cl_2$ | 30 sccm |
| $BCl_3$ | 30 sccm |
| Pressure | 12 mTorr |
| RF Power to Coil Inductor | 900 watts |
| RF Power to Wafer Pedestal | 100 watts |
| Temperature of Test Wafer | 110° C. |
| TiN Etch Rate | 2000 Å/min |

EXAMPLE V

A test semiconductor wafer was formulated with the following film stack:

0.8 μm PR (photoresist)/5000 Å Oxide/100 Å Ti/2000 Å Pt/300 Å TiN

The feature size of the formulated test semiconductor wafer was 0.3 μm block and 0.25 μm spacing. The oxide hard mask (i.e. the insulation layer) was opened in the oxide etch chamber of a plasma processing apparatus sold under the trademark Oxide Etch MxP Centura™, owned by Applied Materials Inc., 3050 Bowers Avenue, Santa Clara, Calif. 95054-3299. The etchant gas for opening up the oxide hard mask comprised about 68% by volume Ar and about 32% by volume $CHF_3$. The reactor and process conditions were as follows:

| Reactor Conditions | |
| --- | --- |
| Pressure | 60 mTorr |
| RF Power | 850 watts |
| Rotational Magnetic Field | 40 Gauss |
| Temperature of Test Wafer | 100° C. |
| Oxide Hard Mask Etch Rate | 3000 Å/min |
| Process Conditions Based on the Flow Rate of Ar and $CHF_3$ | |
| $CHF_3$ | 50 sccm |
| Ar | 100 sccm |
| Pressure, mTorr | 60 mTorr |
| RF Power Density | 850 watts |
| Temperature (° C.) of Test Wafer | 100° C. |
| Oxide Mask Etch Rate (Å/min) | 3000 Å/min |
| Magnetic Field (Gauss) | 40 Gauss |

The photoresist was stripped from the oxide hard mask in an ASP chamber of the Metal Etch MxP Centura™ brand plasma processing apparatus under the following recipe using microwave downstream $O_2/N_2$ plasma: 120 seconds, 250° C., 1400 W, 3000 sccm $O_2$, 300 sccm $N_2$, and 2 Torr.

The Ti protective layer was etched with Ar, $Cl_2$ and $BCl_3$ as the etchant gases and in a DPS™ brand chamber of a Metal Etch DPS Centura™ brand plasma processing apparatus sold by Applied Materials, Inc. The Ti protective layer was etched under the following reactor and process conditions:

| Reactor Conditions | |
| --- | --- |
| Pressure | 12 mTorr |
| RF Power to Coil Inductor | 900 watts |
| RF Power to Wafer Pedestal | 100 watts |
| Temperature of Test Wafer | 110° C. |
| Ti Etch Rate | 2000 Å/min |
| Process Conditions Based on the Flow Rate of Ar and $Cl_2$ and $BCl_3$ | |
| Ar | 40 sccm |
| $Cl_2$ | 30 sccm |
| $BCl_3$ | 30 sccm |
| Pressure | 12 mTorr |
| RF Power to Coil Inductor | 900 watts |
| RF Power to Wafer Pedestal | 100 watts |
| Temperature of Test Wafer | 110° C. |
| Ti Etch Rate | 2000 Å/min |

The platinum layer of the test semiconductor wafer was then etched in a DPS™ brand chamber of a Metal Etch DPS™ brand plasma processing apparatus. The DPS™ brand chamber included an etch chamber and a generally hemispherical shaped standard dome (i.e. dielectric ceiling 62 having inside concave surface 62a) as shown in FIG. 31 manufactured of a dielectric aluminum oxide that was capable of allowing RF power to pass therethrough for being coupled to a plasma of an etchant gas. The hemispherical shaped standard dome (hereinafter "Standard Dome") covered the etch chamber as a lid as represented in FIGS. 17 and 18 and sealed the chamber for pumping down to mTorr vacuum pressure. The inside concave surface 62a of the dielectric ceiling 62 (i.e. the "Standard Dome") had a peak-to-valley roughness height with an average height value of about 500 Å. The inductive coils circled the outside of the hemispherical sloped dome and connected to a RF power supply. RF power energy delivered to the inductive coils were transmitted through the Standard Dome and into the DPS™ brand chamber and generated a high density plasma from a processing gas for processing the semiconductor test wafer. The platinum layer of the test semiconductor wafer was etched in the DPS™ brand chamber with $BCl_3$, Ar and $Cl_2$ as the etchant gas under the following reactor and process conditions:

| Reactor Conditions | |
| --- | --- |
| Pressure | 12 mTorr |
| RF Power to Coil Inductor | 1200 watts |
| RF Power to Wafer Pedestal | 150 watts |
| Temperature of Test Wafer | 350° C. |
| Platinum Etch Rate | 1000 Å/min |
| Process Conditions Based on the Flow Rate of Ar, $Cl_2$ and $BCl_3$ | |
| Ar | 30 sccm |
| $Cl_2$ | 70 sccm |
| $BCl_3$ | 10 sccm |
| Pressure, mTorr | 12 mTorr |
| RF Power to Coil Inductor | 900 watts |
| RF Power to Wafer Pedestal | 150 watts |
| Temperature (° C.) of Test Wafer | 350° C. |
| Pt Etch Rate (Å/min) | 1000 Å/min |
| Selectivity of Pt/Oxide Hard Mask | 1:1 |

During the metal etching of the platinum layer of the semiconductor test wafer, a deposit 7 of materials occurred on the inside concave surface 62a of the Standard Dome or ceiling 62, as best shown in FIG. 32. The deposit 7 included, by way of example only, oxides and silicates and chlorides of platinum, and was located between the plasma and the power source. The deposit 7 was conductive and had an electrical resistance of 10 to 20 M ohms measured with a DC ohm meter after etching 25 wafers.

EXAMPLE VI

Example V was repeated with the platinum layer of the test semiconductor wafer etched with $BCl_3$, Ar, and $Cl_2$ as the etchant gas and in the same DPS™ brand chamber of the Metal Etch DPS Centura™ brand plasma processing apparatus under the following reactor and process conditions:

| Reactor Conditions | |
| --- | --- |
| Pressure | 24 mTorr |
| RF Power to Coil Inductor | 900 watts |
| RF Power to Wafer Pedestal | 175 watts |
| Temperature of Test Wafer | 350° C. |
| Platinum Etch Rate | 1000 Å/min |
| Process Conditions Based on the Flow Rate of Ar, $Cl_2$ and $BCl_3$ | |
| Ar | 20 sccm |
| $Cl_2$ | 100 sccm |
| $BCl_3$ | 10 sccm |
| Pressure, mTorr | 24 mTorr |
| RF Power to Coil Inductor | 900 watts |
| RF Power to Wafer Pedestal | 175 watts |
| Temperature (° C.) of Test Wafer | 350° C. |
| Pt Etch Rate (Å/min) | 1000 Å/min |
| Selectivity of Pt/Oxide Hard Mask | 1:1 |

During the platinum etching of the platinum layer under the foregoing reactor and process conditions, a deposit 7a of platinum-containing materials occurred on the inside concave surface 62a of the Standard Dome or ceiling 62, as best shown in FIG. 32. The deposit 7a included, by way of example only, oxides, and nitrides and silicates and chlorides of platinum, etc. The deposit 7a was not conductive as measured with a DC ohm meter after etching 50 wafers. Thus, the use of high $Cl_2$ flow and high pressure resulted in a deposit 7a that was less conductive than the deposit 7 in Example V where the etching was done at low $C_2$ content (i.e., low $Cl_2$/Ar volume ratio) and low pressure. More $C_2$ content (i.e., high $Cl_2$/Ar volume ratio) at high pressure promotes more chemical etching rather than physical sputtering at low pressure.

EXAMPLE VII

Example V was repeated with a Modified Dome and with the platinum layer of the test semiconductor wafer etched with $BCl_3$, Ar and $Cl_2$ as an etchant gas and in a DPS™ brand chamber of the Metal Etch DPS™ Centura™ brand plasma processing apparatus under the following reactor and process conditions:

| Reactor Conditions | |
| --- | --- |
| Pressure | 12 mTorr |
| RF Power to Coil Inductor | 1200 watts |
| RF Power to Wafer Pedestal | 150 watts |
| Temperature of Test Wafer | 350° C. |
| Platinum Etch Rate | 1000 Å/min |

-continued

| Process Conditions Based on the Flow Rate of Ar and $Cl_2$ | |
| --- | --- |
| Ar | 30 sccm |
| $Cl_2$ | 70 sccm |
| $BCl_3$ | 10 sccm |
| Pressure, mTorr | 12 mTorr |
| RF Power to Coil Inductor | 1200 watts |
| RF Power to Wafer Pedestal | 150 watts |
| Temperature (° C.) of Test Wafer | 350° C. |
| Pt Etch Rate (Å/min) | 1000 Å/min |
| Selectivity of Pt/Oxide Hard Mask | 1:1 |

Figure 34:
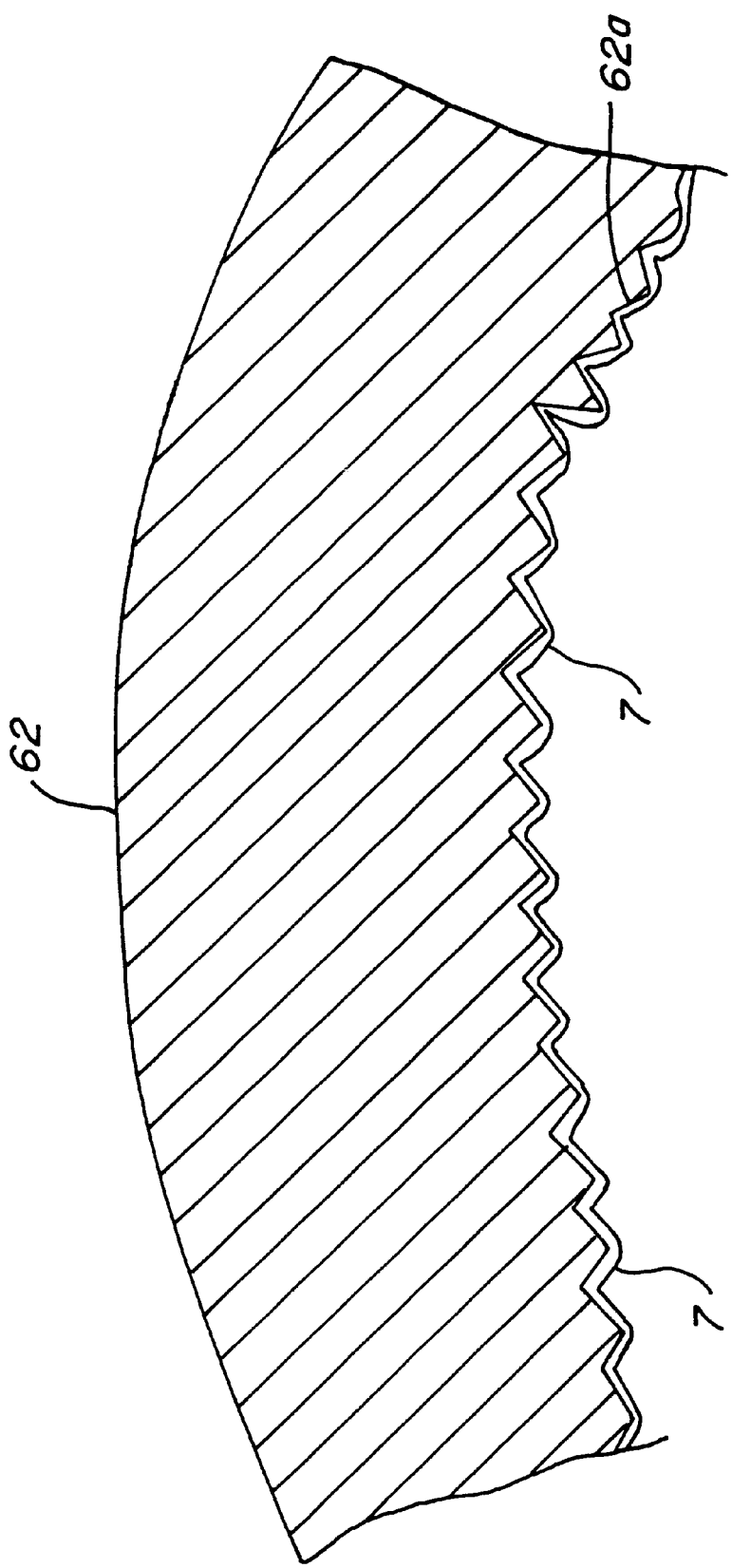
FIG. 34 is a partial exploded sectional view of a dome-shaped dielectric ceiling having a roughened inside concave surface that has received a deposit of by-product materials in accordance with Example VII.

The Modified Dome for this Example VII used the Standard Dome (i.e. dielectric ceiling 62) but whose inside concave surface 62a had a surface finish comprising a peak-to-valley roughness height with an average height value of about 5000 Å. During the platinum etching of the platinum layer under the above-identified conditions, the same deposit 7 from Example V occurred on the inside concave surface 62a as illustrated in the exploded view of FIG. 34. However, deposit 7 for this Example VII was not conductive as measured with a DC ohm meter after etching 100 wafers. Thus, the electric conductivity (and thickness) of the deposit 7 for this Example VII was less than deposit 7 from Example V because the inside concave surface 62a for the Modified Dome had a surface finish including a peak-to-valley roughness height with an average height value of about 5000 Å, as opposed to the inside concave surface 62a for the Standard Dome in Example V which had a surface finish including a peak-to-valley roughness height with an average height value of about 500 Å. Using a roughen surface design on the dielectric ceiling increased the overall inside surface area that provided a larger surface area for the same volume of deposit 7, thus causing a decrease in the deposition thickness which would then extend the stability of external RF power transmission through the dielectric ceiling or window for etching platinum.

Conclusion

Thus, by the practice of the present invention there is provided a method for etching of the platinum electrode layer 16. The etched platinum electrode layer 16 includes a plurality of etched platinum electrode layers 16a, 16b, 16c and 16d having a platinum profile where the angle α of the sidewalls 16s with respect to a horizontal plane is equal to or greater than about 80 degrees. The platinum electrode layers 16a, 16b, 16c and 16d are separated by a distance or space having a dimension equal to or less than about 0.35 μm, preferably equal to or less than about 0.3 μm. Each of the platinum electrode layers 16a, 16b, 16c and 16d includes a dimension having a value equal to or less than about 1.0 μm, preferably equal to or less than about 0.6 μm, preferably equal to or less than about 0.35 μm, preferably equal to or less than about 0.3 μm. More preferably, each of the platinum electrode layers 16a, 16b, 16c and 16d has a width equal to or less than about 0.35 μm, preferably equal to or less than about 0.3 μm, a length equal to or less than about 0.6 μm, and a height equal to or less than about 0.6 μm. Because the produced etched platinum electrode layers 16a, 16b, 16c and 16d are essentially a "veil-less" with no "fences" or "rabbit ears," they are ideally suited for receiving a dielectric (e.g., a BST layer) in producing a semiconductor device. The etchant gas in Example I consisted of about 40% by volume Ar and about 60% by volume $Cl_2$, and produced an etched platinum layer with a platinum profile of about 87 degrees. In Example II, the etchant gas consisted of 54.5% by volume (about 55% by volume) $Cl_2$, 36.4% by volume (about 36% by volume) Ar, and 9.1% by volume (about 9% by volume) $BCl_3$, and the resulting etched platinum layer had a platinum profile of about 87 degrees.

Thus, while the present invention has been described herein with reference to particular embodiments thereof, a latitude of modification, various changes and substitutions are intended in the foregoing disclosure, and it will be appreciated that in some instances some features of the invention will be employed without a corresponding use of other features without departing from the scope and spirit of the invention as set forth. While the subject invention has been described with platinum being the electrode layer, it is to be understood that the spirit and scope of the present invention would include the use of other noble metals (such as iridium, rhodium, palladium and ruthenium) instead of platinum under the identical disclosed conditions employing the identical parameters. Therefore, many modifications may be made to adapt a particular situation or material to the teachings of the invention without departing from the essential scope and spirit of the present invention. It is intended that the invention not be limited to the particular embodiment(s) disclosed as the best mode contemplated for carrying out this invention, but that the invention will include all embodiments and equivalents falling within the scope of the appended claims.

What is claimed is:

1. A method of etching a platinum electrode layer disposed on a substrate comprising the steps of:
   a) providing a substrate supporting a platinum electrode layer;
   b) heating said substrate of step (a) to a temperature greater than about 150° C.; and
   c) etching said platinum electrode layer in a plasma of an etchant gas comprising nitrogen and chlorine to produce said substrate supporting at least one etched platinum electrode layer.

2. The method of claim 1 wherein said etchant gas additionally comprises a gas selected from the group consisting of argon, HBr, $BCl_3$, $SiCl_4$, and combinations thereof.

3. The method of claim 1 wherein said plasma of said etchant gas is selected from the group consisting of a low density plasma and a high density plasma.

4. The method of claim 3 wherein said high density plasma includes an inductively coupled plasma.

5. The method of claim 4 additionally comprising disposing said substrate including said platinum electrode layer of step (a) in a high density plasma chamber including a coil inductor and a wafer pedestal; and performing said etching step (c) in said high density plasma chamber under the following process conditions:

| Process | Parameters |
| --- | --- |
| Etchant Gas flow | 50 to 500 sccm |
| Halogen gas | 40% to 90% by vol. |
| Nitrogen gas | 0.1% to 60% by vol. |
| Pressure, mTorr | 0.1 to 300 milliTorr |
| RF Power (watts) of Coil Inductor | 100 to 5000 watts |
| RF Power (watts) of Wafer Pedestal | 50 to 3000 watts |
| Platinum Etch Rate (Å/min) | 200 to 6000 Å/min |
| RF Frequency of Coil Inductor | 100K to 300 MHZ |
| RF Frequency of Wafer Pedestal | 100K to 300 MHZ | a total etchant gas flow ranging from about 50 sccm to about 500 sccm, a reactor chamber pressure ranging from about 0.1 mTorr to about 300 mTorr, an RF power to a coil inductor ranging from about 100 W to about 5000 W at a frequency ranging from about 100 kHz to about 300 MHZ, and an RF power to a substrate support means ranging from about 50 W to about 3000 W at a frequency of about 100 kHz to about 300 MHZ wherein a halogen gas comprises about 40% to about 90% by volume of said source gas, and nitrogen comprises about 0.1% to about 60% by volume of said source gas, and wherein said method provides a platinum etch rate within the range of about 200 Å/min. to about 6000 Å/min.

6. The method of claim 3 wherein said low density plasma includes a capacitively coupled plasma.

7. The method of claim 6 additionally comprising disposing said substrate including said platinum electrode layer of step (a) in a low density plasma chamber including a wafer pedestal; and performing said etching step (c) in said low density plasma chamber under the following process conditions:

| Process | Parameters |
| --- | --- |
| Etchant Gas flow | 50 to 500 sccm |
| Halogen gas | 40% to 90% by vol. |
| Nitrogen gas | 0.1% to 60% by vol. |
| Pressure, mTorr | 0.1 to 2000 milliTorr |
| RF Power (watts) of Wafer Pedestal | 100 to 5000 watts |
| Platinum Etch Rate (Å/min) | 200 to 6000 Å/min |
| RF Frequency of Wafer Pedestal | 100K to 300 MHZ | a total etchant gas flow ranging from about 50 sccm to about 500 sccm, a reactor chamber pressure ranging from about 0.1 mTorr to about 2000 mTorr, and an RF power to a substrate support means ranging from about 100 W to about 5000 W at a frequency of about 100 kHz to about 300 MHz, wherein a halogen gas comprises about 40% to about 90% by volume of said source gas, and nitrogen comprises about 0.1% to about 60% by volume of said source gas, and wherein said method provides a platinum etch rate within the range of about 200 Å/min. to about 6000 Å/min.

8. The method of claim 1 wherein said etched platinum electrode layer includes a platinum profile equal to or greater than about 80°.

9. The method of claim 1 wherein said etchant gas consists essentially of nitrogen and chlorine, and a gas selected from the group consisting of argon, HBr, $BCl_3$, $SiCl_4$ and combinations thereof.

10. A method for producing a capacitance structure including a platinum electrode comprising the steps of:
   a) providing a substrate supporting a platinum electrode layer and at least one mask layer disposed on a selected part of said platinum electrode layer;
   b) heating said substrate of step (a) to a temperature greater than about 150° C.; and c) etching said platinum electrode layer including employing a plasma of an etchant gas comprising nitrogen and a halogen gas to produce a capacitance structure having at least one platinum electrode.

11. The method of claim 10 wherein said etchant gas additionally comprises a gas selected from the group consisting of a noble gas, $BCl_3$, HBr, $SiCl_4$ and combinations thereof.

12. The method of claim 11 wherein said noble gas is selected from the group consisting of helium, neon, argon, and combinations thereof.

13. A method of manufacturing a semiconductor device comprising the steps of:
   a) forming a patterned resist layer, a mask layer and a platinum electrode layer on a substrate having circuit elements formed thereon;
   b) etching a portion of said mask layer including employing a plasma of an etchant gas to break through and to remove said portion of said mask layer from said platinum electrode layer to produce said substrate supporting said patterned resist layer, a residual mask layer, and said platinum electrode layer;
   c) removing said patterned resist layer of step (b) to produce said substrate supporting said residual mask layer and said platinum electrode layer;
   d) heating said substrate of step (c) to a temperature greater than about 150° C.; and
   e) etching said platinum electrode layer on said substrate of step (d) including employing a plasma of an etchant gas comprising nitrogen and chlorine to produce a semiconductor device having at least one platinum electrode.

14. The method of claim 13 additionally comprising removing said residual mask layer after said etching step (e).

15. The method of claim 13 wherein said etchant gas additionally comprises argon.

16. The method of claim 15 wherein said etchant gas consists essentially of nitrogen, chlorine, argon and a gas selected from the group consisting of $BCl_3$, HBr, $SiCl_4$ and combinations thereof.

17. The method of claim 16 wherein said etchant gas consists essentially of from about 0.1% to about 60% by volume nitrogen, from about 40% to about 90% by volume chlorine, from about 0.1% by volume to about 40% by volume argon, and from about 1% to about 30% by volume of the gas selected from the group consisting of $BCl_3$, HBr, $SiCl_4$ and combinations thereof.

18. The method of claim 13 wherein said forming step (a) additionally comprises disposing a protective layer on said platinum electrode layer between said mask layer and said platinum electrode layer.

19. The method of claim 13 wherein said etchant gas comprises from about 0.1% to about 60% by volume nitrogen, and from about 40% to about 90% by volume chlorine.

20. A method of etching a platinum electrode layer disposed on a substrate comprising the steps of:
   a) providing a substrate supporting a platinum electrode layer, a protective layer on said platinum electrode layer, a mask layer on said protective layer, and a patterned resist layer on said mask layer;
   b) etching a portion of said mask layer including employing a plasma of an etchant gas to break through and to remove said portion of said mask layer from said platinum electrode layer to expose part of said protective layer and to produce said substrate supporting said platinum electrode layer, said protective layer on said platinum electrode layer, a residual mask layer on said protective layer, and said patterned resist layer on said residual mask layer;
   c) removing said patterned resist layer from said residual mask layer of step (b) to produce said substrate supporting said platinum electrode layer, said protective layer on said platinum electrode layer, and said residual mask layer on said protective layer;
   d) heating said substrate of step (c) to a temperature greater than about 150° C.;
   e) etching said exposed part of said protective layer to expose part of said platinum electrode layer and to produce said substrate supporting said platinum electrode layer, a residual protective layer on said platinum electrode layer, and said residual mask layer on said residual protective layer; and
   f) etching said exposed part of said platinum electrode layer of step (e) including employing a plasma of an etchant gas comprising nitrogen and a halogen gas to produce said substrate supporting an etched platinum electrode layer having said residual protective layer on said etched platinum electrode layer, and said residual mask layer on said residual protective layer.

21. The method of claim 20 wherein said etchant gas of step (f) additionally comprises a noble gas.

22. The method of claim 20 wherein said etchant gas of step (f) additionally comprises a gas selected from the group consisting of $BCl_3$, HBr and $SiCl_4$ and combinations thereof.

23. A method of etching a platinum electrode layer disposed on a substrate comprising the steps of:
   a) providing a substrate supporting a platinum electrode layer, a protective layer on said platinum electrode layer, a mask layer on said protective layer, and a patterned resist layer on said mask layer;
   b) etching a portion of said mask layer including employing a plasma of an etchant gas to break through and to remove said portion of said mask layer from said platinum electrode layer to expose part of said protective layer and to produce said substrate supporting said platinum electrode layer, said protective layer on said platinum electrode layer, a residual mask layer on said protective layer, and said patterned resist layer on said residual mask layer;
   c) etching said exposed part of said protective layer to expose part of said platinum electrode layer and to produce said substrate supporting said platinum electrode layer, a residual protective layer on said platinum electrode layer, said residual mask layer on said residual protective layer, and said patterned resist layer on said residual mask layer;
   d) removing said patterned resist layer from said residual insulation layer of step (c) to produce said substrate supporting said platinum electrode layer, said residual protective layer on said platinum electrode layer, and said residual mask layer on said residual protective layer;
   e) heating said substrate of step (d) to a temperature greater than about 150° C.; and
   f) etching said exposed part of said platinum electrode layer of step (d) including employing a plasma of an etchant gas comprising nitrogen and chlorine to produce said substrate supporting an etched platinum electrode layer having said residual protective layer on said etched platinum electrode layer, and said residual mask layer on said residual protective layer.

24. The method of claim 23 wherein said etchant gas of step (f) additionally comprises a noble gas.

25. The method of claim 23 wherein said etchant gas of step (f) additionally comprises a gas selected from the group consisting of $BCl_3$, HBr, and $SiCl_4$, and combinations thereof.

26. A method of etching a platinum electrode layer disposed on a substrate comprising the steps of:
   a) providing a substrate supporting a platinum electrode layer;
   b) disposing said substrate in a reactor chamber comprising a dielectric member having a deposit-receiving surface having a peak-to-valley roughness height with an average height value of greater than about 1000 Å;
   c) heating said substrate of step (b) within said reactor chamber to a temperature greater than about 150° C.; and
   d) etching said platinum electrode layer including employing a plasma of an etchant gas comprising nitrogen and chlorine to produce said substrate supporting at least one etched platinum layer.

27. The method of claim 26 wherein said etchant gas additionally comprises a gas selected from the group consisting of argon, $BCl_3$, HBr, $SiCl_4$ and combinations thereof.

* * * * *